(12) United States Patent
Shimano et al.

(10) Patent No.: US 6,452,859 B1
(45) Date of Patent: Sep. 17, 2002

(54) DYNAMIC SEMICONDUCTOR MEMORY DEVICE SUPERIOR IN REFRESH CHARACTERISTICS

(75) Inventors: Hiroki Shimano; Katsumi Dosaka; Kazutami Arimoto, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/795,077

(22) Filed: Mar. 1, 2001

(30) Foreign Application Priority Data

| Mar. 24, 2000 | (JP) | 2000-084555 |
| Jun. 22, 2000 | (JP) | 2000-187660 |
| Oct. 2, 2000 | (JP) | 2000-301957 |
| Feb. 1, 2001 | (JP) | 2001-025235 |

(51) Int. Cl.[7] ................................................ G11C 8/00
(52) U.S. Cl. ................ 365/230.06; 365/51; 365/63
(58) Field of Search ............... 365/230.06, 230.03, 365/63, 51

(56) References Cited

U.S. PATENT DOCUMENTS

| 5,708,620 A | * | 1/1998 | Jeong | 365/230.06 |
| 5,875,149 A | * | 2/1999 | Oh et al. | 365/230.06 |
| 5,986,917 A | * | 11/1999 | Lee | 365/96 |
| 6,111,808 A | * | 8/2000 | Khang et al. | 365/230.06 |
| 6,236,618 B1 | * | 5/2001 | Roy | 365/230.06 |

FOREIGN PATENT DOCUMENTS

| JP | 4-78098 | 3/1992 |
| JP | 4-98679 | 3/1992 |

* cited by examiner

Primary Examiner—Son T. Dinh
(74) Attorney, Agent, or Firm—McDermott, Will & Emery

(57) ABSTRACT

A sense operation by a sense amplifier circuit is carried out by selecting a pair of subword lines simultaneously and coupling each bit line in a pair to a memory cell. Since complementary data are stored into these two memory cells, the voltage between the bit lines in a pair in a sense operation can be set large enough to allow increase of the refresh interval. Therefore, power consumption in a data retaining mode can be reduced.

35 Claims, 44 Drawing Sheets

DYNAMIC SEMICONDUCTOR MEMORY DEVICE SUPERIOR IN REFRESH CHARACTERISTICS

BACKGROUND OF THE INVENTION

1. Field of the Invention

The present invention relates to a semiconductor memory device, particularly to a structure for reducing power consumption of a semiconductor memory device. More particularly, the present invention relates to a structure for reducing power consumption of an embedded DRAM (Dynamic Random Access Memory) employed in a system LSI.

2. Description of the Background Art

In a system LSI having a DRAM integrated together with the logic of a processor or an ASIC (Application Specific IC) on a common chip, the DRAM is connected with the logic through a multibit internal data bus of 128 bits to 512 bits, for example. This internal data bus is formed of an on-chip line having parasitic capacitance and parasitic resistance smaller than those of on-board lines, and can implement higher speed data transfer than that of a general-purpose high speed DRAM. In contrast to the structure where a general-purpose DRAM is provided outside the logic and connection therebetween is provided via on-board lines, the number of external data input/output pin terminals of the logic can be reduced in the system LSI. Also, the load capacitance of the data bus lines between the logic and the DRAM can be reduced at least one order. Therefore, the system LSI can significantly reduce current consumption. By virtue of these advantages, the system LSI contributes greatly to the high performance of information equipment handling a large amount of data as in three dimensional graphic processing, image and audio processing, or the like.

FIG. 67 schematically shows an entire structure of a conventional embedded DRAM employed in a system LSI. Referring to FIG. 67, the conventional embedded DRAM includes a plurality of memory arrays MA0–MAn, sense amplifier bands SB1–SBn arranged between memory arrays MA0–MAn, and sense amplifier bands SB0 and SBn+1 arranged outside memory arrays MA0 and MAn. Each of memory arrays MA0–MAn is divided into a plurality of memory subarrays MSA by subword driver bands SWDB.

In memory subarray MSA, memory cells are arranged in rows and columns. A subword line SWL is disposed corresponding to each row. In each of memory arrays MA0–MAn, a main word line MWL is disposed commonly to the plurality of memory subarrays MSA divided by subword driver bands SWDB. Main word line MWL is arranged corresponding to a predetermined number of subword lines in each memory subarray MSA in a corresponding memory array.

In subword driver band SWDB, a subword driver is arranged corresponding to subword line SWL. This subword driver drives a corresponding subword line to a selected state according to a signal on a corresponding main word line MWL and a subdecode signal not shown.

In each of sense amplifier bands SB0–SBn+1, a sense amplifier circuit is arranged corresponding to a column of a corresponding memory array. Each of sense amplifier bands SB1–SBn is shared between adjacent memory arrays. Corresponding to each of memory arrays MA0–Man, there are arranged a row decoder for selecting a main word line according to a row address signal and a column decoder arranged in alignment with the row decoder to transmit on a column select line CSL a column select signal for selecting a column from a corresponding memory array according to a column address signal. Column select line CSL is arranged at the sense amplifier band and connects a predetermined number of sense amplifier circuits to a group of global data line pairs GIOP when selected. A predetermined number of global data line pairs GIOP are disposed extending over memory arrays MA0–MAn and each coupled with a selected sense amplifier circuit via a local data line pair LIO. By arranging a row decoder and a column decoder in alignment in row/column decoder band RCDB, the distance of transferring a column select signal through column select line CSL can be reduced to realize a high speed column selection. 128 bits to 512 bits global data line pair GIOP are provided, and coupled to a data path band DPB including a preamplifier and a write driver. In this data path band DPB, a preamplifier and write driver are arranged corresponding to each global data line pair GIOP. Global data line pair GIOP may be a data line pair that transmits both read and write data, or may be formed into a read data bus line pair transmitting read data and a separate write data line pair transmitting write data.

The embedded DRAM further includes a row address input circuit/refresh counter RAFK and a column address input circuit CAK receiving an external address of, for example, 13 bits, A0–A12, applied from the logic, a command decoder/control circuit CDC receiving an external control signal applied from the logic to generate an internal control signal specifying a designated operation, and a data input/output controller DIOK for transferring data between data path band DPB and the logic.

Command decoder/control circuit CDC receives a clock signal CLK, a clock enable signal CKE, a row address strobe signal /RAS, a column address strobe signal /CAS, a write enable signal /WE and a data mask signal DM to determine an operation mode specified according to the logic states of these control signals CKE, /RAS, /CAS, /WE and DM at the rising edge of clock signal CLK. Here, "command" is represented by a combination of the logic states of these control signals CKE, /RAS, /CAS, /WE and DM at the rising edge of clock signal CLK. Data mask signal DM designates a write mask on a byte-by-byte basis for data applied to data input/output controller DIOK.

Command decoder/control circuit CDC decodes a command applied from the logic to generate an operation mode designation signal designating an operation mode instructed by this command to generate various internal control signals required for carrying out the designated operation mode. As a command, there are prepared a row active command to set a row to a selected state, a read command to designate data readout, a write command to designate data writing, a precharge command to place a selected row in a non-selected state, an auto refresh command to carry out a refresh operation, and a self refresh command to carry out self refresh, and the like.

In response to application of a row active command, row address input circuit/refresh counter RAFK accepts external address bits A0–A12 as the row address to generate an internal row address signal under control of command decoder/control circuit CDC. Row address input circuit/refresh counter RAFK includes an address buffer for buffering the applied address bits, and an address latch for latching the signals output from the buffer circuit. Refresh counter is also included in row address input circuit/refresh counter RAFK, to generate a refresh address specifying a refresh row when an auto refresh command or a self refresh command is applied. When the refresh operation is completed, the count value of the refresh counter is incremented or decremented.

Column address input circuit CAK accepts, in response to a read command or a write command, predetermined external address bits, for example, lower external address bits A0–A4 to generate an internal column address signal under control of command decoder/control circuit CDC. Column address input circuit CAK includes an address buffer and an address latch.

The internal row address signal from row address input circuit/refresh counter RAFK is applied to row predecoder RPD. The internal column address signal from column address input circuit CAK is applied to column predecoder CPD. Row predecoder RPD predecodes an applied row address signal to apply a predecoded signal to the row decoder in row/column decoder band RCDB. Column predecoder CPD predecodes an internal column address signal from column address input circuit CAK to apply a predecoded signal to the column decoder in row/column decoder band RCDB.

Upon receiving a read command or a write command, command decoder/control circuit CDC generates an internal control signal to control the operation of the preamplifier or write driver in data input/output controller DIOK and data path band DPB. Clock signal CLK is used as a reference signal for determining an internal operation timing of the embedded DRAM.

Data input/output controller DIOK inputs/outputs data in synchronization with clock signal CLK. The row address input circuit of row address input circuit/refresh counter RAFK and column address input circuit CAK accept and latch the applied address bits in synchronization with clock signal CLK.

The embedded DRAM further includes an internal voltage generation circuit for generating internal voltages VPP, VCCS, VCCP, VBL and VCP, and a block PHK including a self refresh timer to render a refresh request signal FAY active at predetermined intervals when the self refresh mode is specified (when self refresh command is applied). Internal voltage VPP is transmitted on a selected subword line SWL, and generally at a level higher than an operating power supply voltage. Voltage VCCS is the operating power supply voltage of the sense amplifier circuits in sense amplifier bands SB0–SBn+1, and is generated by an internal down converter not shown. Voltage VCCP is a periphery power supply voltage, and is applied to peripheral circuits such as the row decoder and column decoder in row/column decoder band RCDB and the preamplifier and write driver in data path band DPB.

Voltage VBL is a bit line precharge voltage that will be described afterwards. Voltage VCP is a cell plate voltage applied to a cell plate of a memory cell, and is at a level intermediate the H level voltage and the L level voltage of memory cell data. Voltages VBL and VCP are generally intermediate voltages that are ½ the array power supply voltage (sense power supply voltage) VCCS.

The self refresh timer of block PHK is rendered active when the self refresh mode is entered, to issue the refresh request signal FAY at predetermined intervals so that all the rows of memory arrays MA0–MAn are refreshed once in the maximum refresh time tREFmax. Refresh request signal FAY is issued at the cycle of tREFmax/Nref, where Nref is the number of times of refresh operation required to refresh all the rows in memory arrays MA0–MAn. For example, in the 4K refresh mode of Nref=4096, refresh request signal FAY is issued every 16 µs when the maximum refresh time tREFmax is 64 ms.

In the self refresh mode, memory cell data in the memory arrays are refreshed at a predetermined cycle in order to retain the data stored in the memory cells. The self refresh mode is set generally when the system LSI is in a sleep mode, i.e. in a standby state over a long period of time. In this sleep mode, only the retention of the stored data in the memory cells are required. For the standpoint of power consumption, it is desirable that the refresh interval is as long as possible.

FIG. 68 shows a structure of a sense amplifier circuit in sense amplifier band and a peripheral portion thereof. Referring to FIG. 68, a sense amplifier SAK is coupled to bit lines BLL and ZBLL via a bit line isolation gate BIGL, and to bit lines BLR and ZBLR of the other memory block via a bit line isolation gate BIGR. Bit line isolation gates BIGL and BIGR are rendered conductive/non-conductive in response to bit line isolation instruction signals BLIL and BLRR, respectively.

Sense amplifier SAK differentially amplifies the potentials of a common bit line CBL coupled to bit lines BLL and BLR via respective bit line isolation gates BIGL and BIGR and a common bit line ZCBL coupled to bit lines ZBLL and ZBLR via respective bit line isolation gates BIGL and BIGR. Sense amplifier SAK includes cross-coupled P channel MOS transistors (insulated gate type field effect transistor) P1 and P2, and cross-coupled N channel MOS transistors N1 and N2.

A P channel MOS transistor P3 for sense activation and an N channel MOS transistor N3 for sense activation are provided as the sense amplifier drive circuit. P channel MOS transistor P3 is rendered conductive, in response to activation of sense amplifier activation signal ZSOP, to transmit a sense power supply voltage VCCS to a sense power node S2P of sense amplifier SAK. N channel MOS transistor N3 is rendered conductive, when sense activation signal SON is active, to couple a sense ground node S2N to the ground node. Common bit lines CBL and ZCBL are coupled to a local data line pair LIO via a column select gate CSG. Local data line pair LIO is coupled to global data lines GIO and ZGIO of a global data line pair.

Bit line precharge/equalize circuit BEQL is provided for bit lines BLL and ZBLL. Bit line precharge/equalize circuit BEQL is rendered active, in response to activation of a bit line equalize designation signal BLEQL, to transmit a bit line precharge voltage VBL to bit lines BLL and ZBLL. A bit line precharge/equalize circuit BEQR is provided for bit lines BLR and ZBLR,. Bit line precharge/equalize circuit BEQR is rendered active, in response to bit line equalize designation signal BLEQR, to transmit bit line precharge voltage VBL to bit lines BLR and ZBLR.

Subword lines SWL are provided in the direction crossing bit lines BLL and ZBLL and bit lines BLR and ZBLR, and at the crossing therebetween, a memory cell MC is arranged. In FIG. 68, a subword line SWL crossing bit lines BLL and ZBLL and a memory cell MC disposed corresponding to the crossing of subword line SWL and bit line ZBLL are shown as representative. Memory cell MC includes a memory capacitor MC to store information, and an access transistor MT formed of an N channel MOS transistor, and rendered conductive in response to the potential on subword line SWL to couple memory capacitor MQ to bit line ZBLL. The potential of a storage node SN of memory capacitor MC is determined according to the stored information. A cell plate voltage VCP is applied to a cell plate facing the storage node SN.

In a standby state, bit line isolation instruction signals BLIL and BLIR are at an H level of a boosted voltage VPP, for example, and bit line isolation gates BIGL and BIGR are conductive. Bit lines BLL, CBL and BLR are coupled together, and complementary bit lines ZBLL, ZCBL and ZBLR are coupled together. Here, bit line equalize designation signals BLEQL and BLEQR are also active. By bit line precharge/equalize circuit BEQL and BEQR, bit lines BLL, CBL and BLR as well as complementary bit lines ZBLL, ZCBL and ZBLR are precharged and equalized to the level of precharge voltage VBL.

When a row active command is applied and row access is to be made, the bit line isolation gate of the memory block including the selected row (subword line) maintains a conductive state whereas the bit line isolation gate of the non-selected memory array sharing the sense amplifier with the selected memory array (memory array including the selected subword line) attains a non-conductive state. Now, the case is considered where subword line SWL shown in FIG. 68 is selected. In this case, bit line equalize signal BLEQL attains an inactive state of an L level, and bit line precharge/equalize circuit BEQL is rendered inactive. Also, bit line isolation instruction signal BLIR is driven to an L level, and bit line isolation gate BIGR is rendered non-conductive, whereby bit lines BLR and ZBLR are disconnected from common bit lines CBL and ZCBL. In this state, bit lines BLL and ZBLL of the selected memory array attain a floating state at the level of precharge voltage VBL. Bit line equalize designation signal BLEQR is at an active state of an H level. Bit lines BLR and ZBLR are held at the level of bit line precharge voltage VBL by bit line precharge/equalize circuit BEQR.

Then, a row select operation is carried out, and the potential of the selected subword line rises. More specifically, in response to the rise of the level of subword line SWL, memory access transistor MT of memory cell MC conducts, whereby storage node SN of memory capacitor MC is coupled to a corresponding bit line (ZBLL). The charge stored in capacitor MC of this memory cell is read out onto bit line ZBLL. Since no selected memory cell is connected to bit line BLL, bit line BLL is held at the intermediate voltage level of bit line precharge voltage VBL. The potential difference $\Delta V$ between bit lines BLL and ZBLL is represented by the following equation:

$$\Delta V = 0.5 \cdot V(SN) \cdot CS/(CS+CB),$$

where CB is the parasitic capacitance of each of bit lines BLL and ZBLL, CS is the capacitance of memory capacitor MC, and V(SN) is the potential of storage node SN.

Then, sense amplifier activation signals ZSP and SON are rendered active, whereby MOS transistors P3 and N3 for sense amplifier activation are rendered conductive. Sense power supply voltage VCCS and ground voltage are responsively transmitted to sense power supply nodes S2P and S2N, respectively, and sense amplifier SAK is rendered active to start a sense operation. Since the threshold voltages of N channel MOS transistors N1 and N2 are generally smaller than the absolute value of the threshold voltages of P channel MOS transistors P1 and P2, first the sense amplifier circuit SAK initiates the sense operation by MOS transistors N1 and N2, to amplify the potential difference transmitted from bit lines BLL and ZBLL to common bit lines CBL and ZCBL. More specifically, MOS transistors N1 and N2 drive the common bit line CBL or ZCBL of the lower potential to the level of the ground voltage. Then, P channel MOS transistors P1 and P2 drive the common bit line CBL or ZCBL of the higher potential to the level of sense power supply voltage VCCS.

When data of an L level is transmitted to common bit lines CBL and ZCBL, the voltage of the common bit line receiving the data of the L level is lower than precharge voltage VBL. In the case data of an H level is read out, the voltage of the common bit line receiving this H level data is higher than precharge voltage VBL. This means that the gate-source voltage of MOS transistors N1 and N2 is lower when data of an L level is read out than in the case where data of an H level is read out. Therefore, the sense operation of N channel MOS transistors N1 and N2 becomes slower in reading out of an L level data than in the case where an H level data is read out.

The voltage sensed by sense amplifier SAK has a level proportional to voltage V (SN) of storage node SN of memory cell MC. In order to increase the sensing margin to operate sense amplifier SAK properly, the amount of charge read out from the memory cell must be as large as possible. the voltage of storage node SN is at an L level is at the level of ground voltage VSS when L level data is stored and the voltage V (SN) of storage node SN is at the level of sense power supply voltage VCCS when data of an H level is stored in this storage node SN. In order to set, as high as possible, the voltage level of the storage node SN when data of an H level is stored in storage node SN, boosted voltage VPP is transmitted to subword line SWL. This boosted voltage VPP is sufficiently higher than the sum of sense power supply voltage VCCS and the threshold voltage of access transistor MT. By transmitting boosted voltage VPP to subword line SWL, sense power supply voltage VCCS can be transmitted to storage node SN without voltage lose due to the threshold voltage of memory access transistor MT.

Upon completion of the sense operation by sense amplifier SAK, bit lines BLL and ZBLL are driven to the level of sense power supply voltage VCCS and ground voltage, respectively. When a subsequent read command or write command (column access command) is applied, a column select operation is carried out, followed by activation of the column select signal on column select line CSL. Column select gate CSG is responsively rendered conductive, and common bit lines CBL and ZCBL are coupled to global data lines GIO and ZGIO via local data line pair LIO. Then, data writing or reading is carried out.

FIG. 69 schematically shows the cross sectional structure of a memory cell. Referring to FIG. 69, N channel impurity regions 901a and 901b are formed spaced apart from each other at the surface of a P type substrate region 900. Above the channel region between these impurity regions 901a and 901b, there is formed a first conductive layer 902 that becomes a word line WL with a not shown gate insulation film laid thereunder. Impurity region 901 is connected to a second conductive layer 903 that becomes bit line BL. Impurity region 901b is connected to a third conductive layer 904 that becomes storage node SN. Third conductive layer 904 includes a leg portion connected to impurity region 901b and a cylindrical portion of a hollow structure on the leg portion. A fourth level conductive layer 906 that becomes the cell plate electrode is arranged over this cylindrical portion with a capacitor insulation film 905 laid thereunder. Fourth level conductive layer 906 that becomes the cell plate is disposed extending over a corresponding memory subarray in units of memory subarrays, and commonly receives cell plate voltage VCP. The region of fourth level conductive layer 906 facing to cylindrical region at the upper portion of third conductive layer 904 via capacitor insulation film 905 functions as a memory cell capacitor.

Memory access transistor MT is formed of impurity regions 901a and 901b and first level conductive layer 902.

Substrate region 900 functions as the back gate of this memory access transistor, and receives a negative voltage Vbb. The potential of third level conductive layer 904 is determined depending upon the stored data. As depicted by the broken line in FIG. 69, the charge stored in the memory capacitor is reduced by the leakage current through the junction capacitance of storage node SN (the PN junction between impurity region 901$b$ and substrate region 900), the leakage current through the channel region beneath second conductive layer and the leakage current to capacitor insulation film 905.

FIG. 70 represents a time dependent change in the potential level of storage node SN. The change shown in FIG. 70 is encountered in the case where precharge voltage VBL (=VCCS/2) is applied to bit line BL and ground voltage VSS is applied to word line WL (subword line SWL). Voltage V (SN) of storage node SN has the time dependency represented by the following equation due to leakage current.

$$V(SN) \approx Vbb + (VCCS - Vbb) \cdot \exp(-T/\tau a),$$

where T represents the time and coefficient $\tau a$ is the characteristic value indicating the charge retention characteristic when H level data is written to the memory cell. A larger characteristic value $\tau a$ indicates a longer charge retention time of the memory cell.

When data of an H level is written into storage node NS, voltage V (SN) of the storage node corresponds to the level of sense power supply voltage VCCS. Storage node voltage V (SN) is gradually reduced according to the leakage current through the junction at the elapse of time T. In the case where memory cell data is read out to the bit line when the storage node voltage V(SN) is Vcr at time T1, the voltage difference between the bit lines, (Vcr−VBL)·(Cs/(Cs+Cb)), becomes lower than the sensitivity of the sense amplifier. Here, Cs and Cb represent the parasitic capacitances of the memory cell capacitor and bit line, respectively. More specifically, at the elapse of time T1, the sense amplifier will operate erroneously to amplify H level data as L level data, resulting in H data readout error. It is therefore required to carry out refresh as to the memory cell within time T1. Characteristic value $\tau a$ differs for each memory cell (by variation of a fabrication process parameter). The refresh interval is determined based on the worst case. In other words, refresh interval tREFmax is determined depending upon the shortest data retaining time i.e. the smallest value of characteristic value $\tau a$ in the semiconductor memory device.

As to the process of an embedded DRAM, a fabrication process identical to that of the logic integrated on the same chip is employed. In order for the transistors of the logic to exhibit the full performance, the process such as the salicide process to the source and drain diffusion layers of the transistor, which is the standard in the process of the logic, is also introduced in the process of the embedded DRAM. Therefore, the thermal budget of a high temperature thermal process, the product of the execution time to temperature of thermal process, for the formation of the memory capacitor is reduced. This means that a thermal process at a predetermined temperature for a sufficient period of time cannot be applied to the impurity region and insulation film for the embedded DRAM, compared to that of a general purpose of standard DRAM. Therefore, the junction leakage current and leakage current through the capacitor insulation film is slightly greater in the embedded DRAM.

When a cylindrical stacked capacitor cell structure as shown in FIG. 50 is employed, there will be a great step gradation between the DRAM area and the logic area. Although the interlayer insulation film between the interconnection lines can be planarized to a certain level by the CMP (chemical-mechanical polishing) process, this stepped gradation cannot be eliminated completely. The irregular reflection of the reflected light at the stepped portion in the exposure step of the photolithography process will impede the sufficient reduction of the pitch of the metal interconnection lines. It is therefore difficult to realize a metal interconnection line pitch that is required in the library of high density of the logic. With a penalty, to some extent, of the capacitance of the memory cell capacitor, the height of the storage node of the stacked capacitor (reduce the height of the cylindrical portion) is reduced to completely planarize the interlayer insulation film between the interconnection lines, aiming to eliminate the stepped gradation between the DRAM and the logic for increasing the gate density of the logic library. Thus, the capacitance of the memory cell capacitor is smaller than that of the general purpose DRAM. Accordingly, the amount of stored charge is also reduced.

The embedded DRAM is integrated, on a common semiconductor chip, together with the logic unit that operates at high speed. The temperature of the embedded DRAM is apt to become higher than that of the general purpose DRAM by heat transfer from the logic unit that operates at high speed. Furthermore, the power supply line and the substrate of the embedded DRAM is susceptible to noise due to the high speed operation of the logic unit. By these various factors of the process and chip operation, the refresh characteristics of the embedded DRAM is made inferior to that of the general purpose DRAM. Furthermore, the refresh interval of the embedded DRAM must be set shorter than that of the general purpose DRAM, inducing increase in the consumed current for retaining data.

When the operation of the logic unit is ceased as in a sleep mode, the self refresh operation of executing refresh periodically must be carried out to retain the data stored in the embedded DRAM. Since the refresh interval in the self refresh mode becomes shorter than that of the general purpose DRAM, the current consumption in the sleep mode is also increased. Particularly in the case where a system LSI employing an embedded DRAM is applied to the products, such as portable information equipment and digital cameras, driven by battery, reduction in power consumption will become a more important factor than the increase of the storage capacity. Thus, increase of current consumption in accordance with degradation of the refresh characteristics will become a more significant problem in the application to equipment driven by battery.

Moreover, since the DRAM is integrated on a semiconductor substrate common to that of the logic, it is preferable for the embedded DRAM to operate following the operation speed of the logic, to reduce the waiting time of the logic. To this end, the conventional embedded DRAM employs the hierarchical word line structure to reduce the time required for row selection. Therefore, it is preferable not only to reduce current consumption and but also to minimize the row access time (the time required for row selection).

SUMMARY OF THE INVENTION

An object of the present invention is to provide semiconductor memory device that can have current consumption reduced.

Another object of the present invention is to provide an embedded DRAM improved in refresh characteristics.

A further object of the present invention is to provide a semiconductor memory device that can have power consumption and row access time reduced.

Still another object of the present invention is to provide an embedded DRAM improved in both refresh characteristics and row access time.

A still further object of the present invention is to provide a semiconductor memory device of low current consumption, in which a defect in rows can be repaired efficiently.

Yet a further object of the present invention is to provide a semiconductor memory device that operates in a twin cell mode with improved repair efficiency of a defective row.

According to an aspect of the present invention, a semiconductor memory device includes a plurality of memory cells arranged in rows and columns, a plurality of word lines arranged corresponding to the rows, each word line having memory cells of a corresponding row connected thereto, and a plurality of bit lines arranged corresponding to the columns, each bit line having memory cells of a corresponding column connected thereto. The plurality of bit lines are arranged in pairs. Each memory cell is arranged corresponding to a crossing of one bit line in a pair and a corresponding word line.

The semiconductor memory device according to one aspect of the present invention includes row select circuitry for simultaneously selecting word lines of an addressed row and a related row according to an address signal. The row select circuitry selects the related row according to an address such that a memory cell is arranged corresponding to each crossing between the addressed row and related row and the bit lines in a pair. The row select circuitry includes a drive circuit for driving the addressed row and related row to selected states individually.

The semiconductor memory device according to one aspect of the present invention further includes a sense amplifier circuit arranged corresponding to each bit line pair to amplify differentially the potential of the corresponding bit line pair when made active.

According to another aspect of the present invention, a semiconductor memory device includes a plurality of memory subarrays each having a plurality of memory cells arranged in rows and columns, a plurality of subword lines arranged corresponding to the memory cell rows in each memory subarray, each subword line having memory cells of a corresponding row connected thereto, a plurality of main word lines arranged extending in the row direction commonly to the plurality of memory subarrays, each main word line arranged corresponding to a predetermined number of subword lines in each memory subarray, and a plurality of subword line drivers arranged corresponding to the plurality of subword lines, each subword line driver driving a corresponding subword line to a selected state according to a signal on a corresponding main word line and subdecode signal. The subdecode signal identifies simultaneously two subword lines out of the predetermined number of subword lines.

The semiconductor memory device according to the another aspect of the present invention further includes a plurality of bit line pairs provided corresponding to memory cell columns in each memory subarray, each bit line pair having memory cells of a corresponding column connected thereto, and a plurality of sense amplifier circuits provided corresponding to the plurality of bit line pairs, each sense amplifier circuit amplifying differentially the voltages of a corresponding bit line pair. A memory cell is connected to the bit lines in each bit line pair, correspondingly to each crossing of the bit lines and the two subword lines identified simultaneously by the subdecode signal. The subword line pair identified simultaneously by the subdecode signal is connected at their both ends by conductive layers.

According to a further aspect of the present invention, a semiconductor memory device includes a plurality of memory cells arranged in rows and columns, a plurality of word lines arranged corresponding to the rows of memory cells, each word line having memory cells of a corresponding row connected thereto, a plurality of column lines arranged corresponding to the columns of memory cells, each column line having memory cells of a corresponding column connected thereto, and a plurality of column voltage hold circuits provided corresponding to the plurality of column lines to hold corresponding column lines at a predetermined voltage level in a standby state. The plurality of column voltage hold circuits transmit the current-limited voltage to the corresponding column lines as the predetermined voltage.

According to a still further aspect of the present invention, a semiconductor memory device includes: a plurality of normal memory cells arranged in rows and columns; a plurality of normal subword lines arranged corresponding to each normal memory cell row, each normal subword line having normal memory cells of a corresponding row connected thereto; a plurality of normal main word lines each arranged corresponding to a predetermined number of normal subword lines; a plurality of spare memory cells arranged in at least the predetermined number of rows; a plurality of spare subword lines arranged corresponding to these rows of spare memory cells, each spare subword line having spare memory cells of a corresponding row connected thereto; at least one spare main word line arranged corresponding to the predetermined number of subword lines out of the plurality of spare subword lines; a first spare determination circuit determining whether a defective normal subword line is specified or not according to an address signal; a second spare determination circuit determining whether a defective normal main word line is specified or not according to the address signal; a normal row select circuit selectively driving a normal main word line and a normal subword line to a selected state according to the address signal and the output signals of the first and second determination circuits; and a spare row select circuit selectively driving a spare main word line and a spare subword line to a selected state according to the address signal and the output signals of the first and second determination circuits.

The normal row select circuit brings a normal main word line and a corresponding normal subword line to a non-selected state when the first determination circuit detects a defect, and drives an addressed main word line to a selected state and an addressed normal subword line to a selected state while maintaining a predetermined normal subword line out of the predetermined number of corresponding normal subword lines at a non-selected state independent of the address signal when the second determination circuit detects a defect.

The spare row select circuit drives a corresponding spare main word line and spare subword line to a selected state according to an address signal when the first determination circuit detects a defect, and selectively drives a corresponding spare main word line to a selected state and a spare subword line corresponding to the address signal to a selected state while maintaining a spare subword line excluding the spare subword line corresponding to the predetermined normal subword line among corresponding spare subword lines at a non-selected state when the second determination circuit detects a defect.

According to yet a further aspect of the present invention, a semiconductor memory device includes a plurality of memory cells arranged in rows and columns, a plurality of word lines arranged corresponding to the memory cell rows and each having memory cells of a corresponding row connected thereto, and a row select circuit to drive to a selected state simultaneously a pair of word lines with one word line interposed therebetween out of the plurality of word lines.

Preferably, a bit line pair is arranged corresponding to each memory cell column. The memory cells are arranged so that, in a particular operation mode, complementary data is read out to each bit line pair, and when one word line is selected in a normal operation mode, memory cell data is read out to one bit line in each bit line pair.

Information of one bit is stored by two memory cells. Complementary data is written into these two memory cells by the sense amplifier circuit. In selection of a memory cell, a pair of bit lines has complementary signals transmitted thereon, and accordingly the potential difference between the bit lines is increased. Therefore, even if the charge in the memory cell storing H level data is reduced by leakage current, sufficient potential difference can be generated between the bit lines. Accordingly, the refresh interval can be lengthened. Thus, the number of times of refresh operations in the data holding mode can be reduced to reduce power consumption.

Since the subword lines driven simultaneously to a selected state are connected by the conductive layers at respective both ends thereof so as to be driven by the subword line driver from both sides, the subword lines can be driven to the selected state at high speed. Accordingly, memory cell data can be read out to the bit line pair at high speed. This means that the sense start timing of sense amplifier circuit can be set faster to reduce the row access time.

By transmitting a predetermined voltage (precharge voltage) through a current limiting facility to the bit lines, leakage current in a standby mode through micro short between a bit line and a subword line, if any, can be reduced. Accordingly, current consumption can be reduced even in the case where many micro shorts are present.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
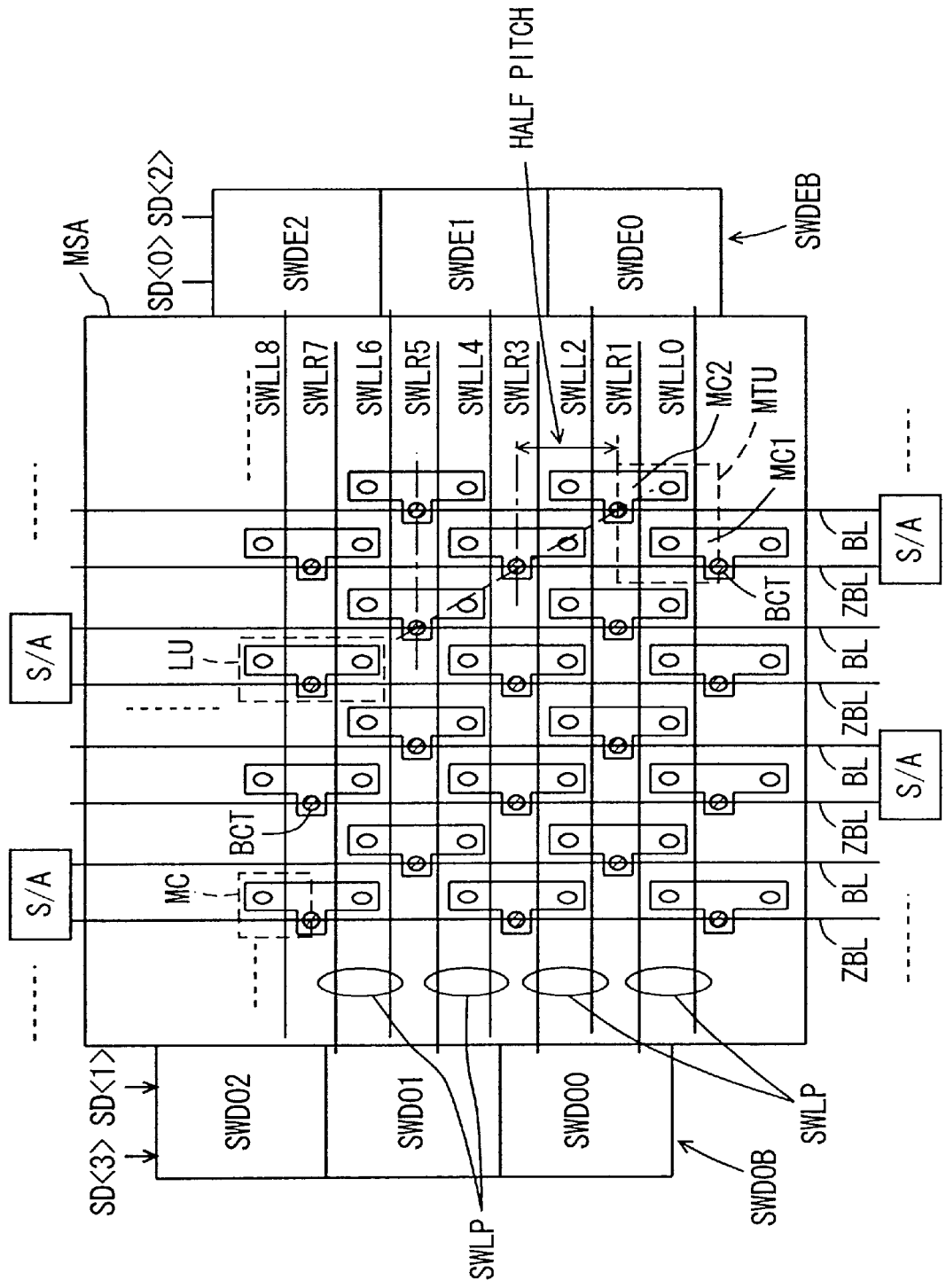
FIG. 1 schematically shows a structure of an array of a semiconductor memory device according to a first embodiment of the present invention.

FIG. 1 schematically shows a structure of an array portion of a semiconductor memory device according to a first embodiment of the present invention. In FIG. 1, a memory cell MC is arranged so as to share a bit line contact BCT with a memory cell adjacent in the column direction. One layout unit LU is formed by the two memory cells MC sharing bit line contact BCT. Layout units LU are arranged on alternate columns in the column direction and on every two rows in the row direction. Accordingly, bit line contacts BCT are arranged on every 4 rows in alignment in the column direction, and on alternate columns in the row direction. In the row direction, layout units LU are arranged shifted by one column. As shown in FIG. 1, the smallest pitch length of memory cell MC obtained by connecting bit line contacts BCT obliquely is projected in the bit line direction to provide a length equal to ½ the arrangement pitch of memory cells MC in the column direction. Therefore, the memory cell arrangement shown in FIG. 1 is referred to as "half pitch cell" arrangement.

Bit lines BL and ZBL are arranged alternately corresponding to each column of memory cells MC (layout unit LU). Bit lines BL and ZBL are arranged in pairs. A sense amplifier circuit S/A is arranged corresponding to each bit line pair.

A subword line SWL is arranged corresponding to each row of memory cells MC. Memory cells MC of a row are connected to a corresponding subword line SWL. Subword lines SWL are driven by subword drivers provided in subword driver bands SWDEB and SWDOB arranged at both sides of memory subarray MSA. Subword drivers SWDE0, SWDE1 and SWDE2 in subword driver band SWDEB drive even numbered subword lines SWLL0 and SWLL2, SWLL4 and SWLL6, and SWLL8, respectively, according to the signals on corresponding main word lines not shown and subdecode signals SD<0> and SD<2>. When the corresponding main word line is selected, each of subword drivers SWDE0, SWDE1 and SWDE2 drives one of the corresponding two subword lines to a selected state (when a subdecode signal is selected) according to subdecode signals SD<0> and SD<2>.

In subword driver band SWDOB, subword drivers SWDO0, SWDO1 and SWDO2 are provided corresponding to odd numbered subword lines SWLR1 and SWLR3, SWLR5 and SWLR7, and not shown subword lines. Subword drivers SWDO0, SWDO1 and SWDO2 are each provided corresponding to two subword lines. Subword drivers SWDO0, SWDO1 and SWDO2 each drive a corresponding subword line to a selected state according to the signal on a corresponding main word line not shown and subdecode signals SD<3> and SD<1>.

One main word line is disposed for four subword lines. More specifically, one main word line is disposed corresponding to subword lines SWLL0, SWLR1, SWLL2 and SWLR3, and one main word line is arranged corresponding to subword lines SWLL4, SWLR5, SWLL6 and SWLR7.

In a row selection, adjacent subword lines are selected simultaneously. More specifically, according to an address signal, a subword line pair SWLP of an addressed subword line and a subword line adjacent thereto is selected simultaneously. As shown in FIG. 1, subword lines SWLL0 and SWLR1 are selected simultaneously, for example. Memory cells MC1 and MC2 serves as a memory unit (referred to as "twin cell unit" hereinafter) MTU to store information of 1 bit in a 1 bit/2 cell mode (twin cell mode). More specifically, H level data is written into one of memory cells MC1 and MC2, and L level data is written to the other of memory cells MC1 and MC2. Sense amplifier circuit S/A amplifies differentially the potentials of bit lines BL and ZBL. Complementary memory cell data are always read out to bit lines BL and ZBL, and H level data and L level data are transmitted to bit lines BL and ZBL, to be amplified differentially by sense amplifier circuit S/A.

Two subword lines arranged between the closest bit line contacts in the column direction are selected at the same time. Since the half pitch cell arrangement is employed, by simultaneously driving the two subword lines arranged between the bit line contacts to a selected state, nearest neighboring memory cells MC in layout units LU adjacent in the row and column directions are coupled to bit lines BL and ZBL, respectively. Thus, H level data and L level data are written into two memory cells of memory unit MTU in a twin cell mode.

Figure 2:
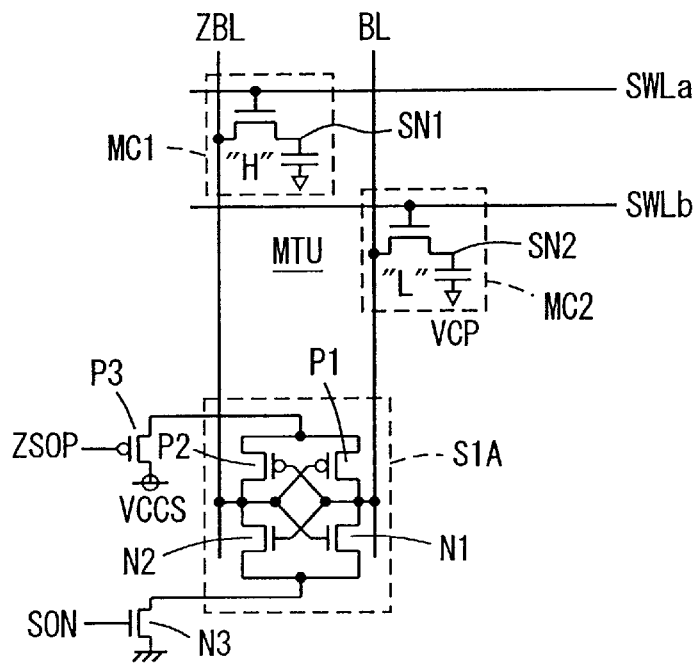
FIG. 2 shows a structure of memory cells selected simultaneously in the first embodiment.

For example, as shown in FIG. 2, memory cells MC1 and MC2 are arranged at the crossings between adjacent subword lines SWLa and SWLb and bit lines ZBL and BL. In the 1 bit/2 cell mode (referred to as "twin cell mode" hereinafter), these two memory cells MC1 and MC2 are employed as the twin cell unit MTU for storing 1-bit information. Bit lines BL and ZBL are coupled to sense amplifier circuit S/A, and have the potentials thereof amplified. Thus, complementary data are always stored in memory cells MC1 and MC2.

Figure 3:
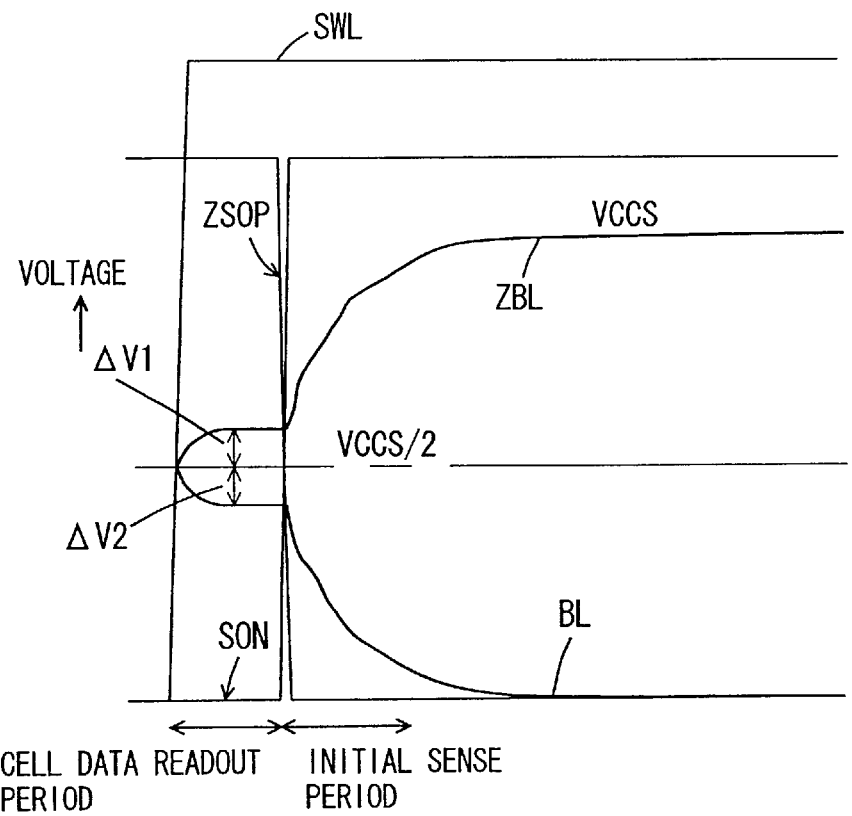
FIG. 3 is a signal waveform diagram representing the data readout operation of the memory cells shown in FIG. 2.

FIG. 3 is a signal waveform diagram representing the potential change of the bit lines in reading out the stored information of bit 0 of twin cell unit MTU shown in FIG. 2. In a standby state, i.e., when subword lines SWLa and SWLb are non-selected, bit lines BL and ZBL are precharged and equalized to the level of intermediate voltage VCCS/2. When a row select operation is initiated in response to the input of a row active command and the subword lines are driven to a selected state, subword lines SWLa and SWLb are both driven to the level of boosted potential VPP. When subword lines SWLa and SWLb are driven to the selected state of the boosted voltage Vpp, H level data is read out from memory cell MC1 to bit line ZBL whereas L level data is read out from memory cell MC2 to bit line BL. Therefore, bit line ZBL has its voltage level raised from intermediate voltage VCCS/2 by readout voltage $\Delta V1$. Bit line BL has its voltage level reduced from intermediate voltage VCCS/2 by readout voltage $\Delta V2$. This period corresponds to the cell data readout period.

Upon completion of this cell data readout period, sense amplifier activation signals SON and ZSOP are rendered active, and sense amplifier circuit S/A is rendered active. Sense amplifier circuit S/A amplifies differentially the potential difference of bit lines BL and ZBL, ($\Delta V1+\Delta V2$). Therefore, when sense amplifier activation signal SON is rendered active, one of N channel MOS transistors N1 and N2 in sense amplifier circuit S/A is immediately rendered conductive, whereby the bit line of the low level is driven to the level of the ground voltage. More specifically, since the readout voltage of an H level and the readout voltage of an L level are always transmitted to sense amplifier circuit S/A regardless of whether the stored data in twin cell unit MTU is 1 or 0, N channel MOS transistors N1 and N2 of sense amplifier circuit S/A execute the sense operation at high speed when sense amplifier activation signal SON is activated. Therefore, a sense operation can be carried out at higher speed in comparison to the sense operation in the conventional operation mode of 1 bit/1 cell. The potential difference of bit lines BL and ZBL is ($\Delta V1+\Delta V2$), and the readout voltage is greater than that in the conventional operation mode of 1 bit/1 cell. Therefore, a sufficient sense margin can be ensured.

Figure 4:
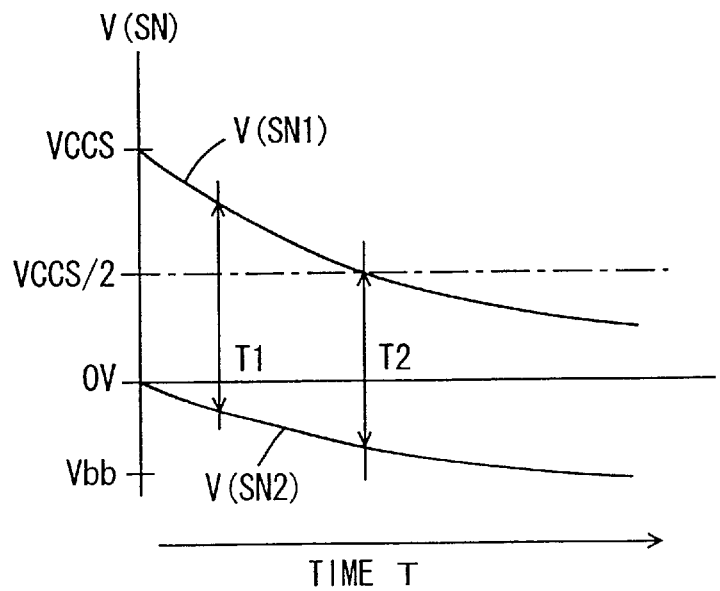
FIG. 4 represents the voltage of the storage node of the memory cell shown in FIG. 2 over time.

FIG. 4 represents the change of the amount of stored charge in memory cells MC1 and MC2 of twin cell unit MTU of FIG. 2 over time. Since H level data is written, voltage V (SN1) of storage node SN1 of memory cell MC1 is at a level of array power supply voltage VCCS at the start. In contrast, voltage V (SN2) of storage node SN2 of memory cell MC2 is at a level of ground voltage VSS (=0 V) at the start since L level data is stored. Under this state, the standby state is entered. Subword lines SWLa and SWLb are set at the level of the ground voltage, and bit lines BL and ZBL are set at the level of intermediate voltage VCCS/2. A negative voltage Vbb is applied to the substrate region of the memory transistor. Here, the voltages of storage nodes SN1 and SN2 over time are represented by the following expressions.

$V(SN1) \approx Vbb + (VCCS - Vbb) \cdot \exp(-T/\tau a)$, $V(SN2) \approx Vbb \cdot \{1 - \exp(-T/\tau b)\}$ In this case, the readout voltage difference $\Delta VBL$ of bit lines BL and ZBL is represented by the following equation.

$\Delta VBL = Cs \cdot (V(SN1) - V(SN2)) / (Cs + Cb)$

At time T1, the sense margin is inadequate for a DRAM of the conventional 1 bit/1 cell structure, causing erroneous readout. In the 1 bit/2 cell operation mode, the difference between storage node voltages V (SN1) and V (SN2) is great enough even at time T1. Even if voltage V (SN1) of storage node SN1 is reduced to the level of intermediate voltage VCCS/2, voltage V(SN2) of storage node SN2 is reduced similarly, so that the potential difference between these voltages V (SN1) and V (SN2) is large enough.

At time T2 when data is read out, intermediate voltage VCCS/2 is transmitted to bit line ZBL and the voltage level thereof does not change. A readout voltage of L level data ($-\Delta V2$) is transmitted to bit line BL. Even in this state, the bit line potential difference is adequately large, and sensing operation can be performed correctly.

Figure 5:
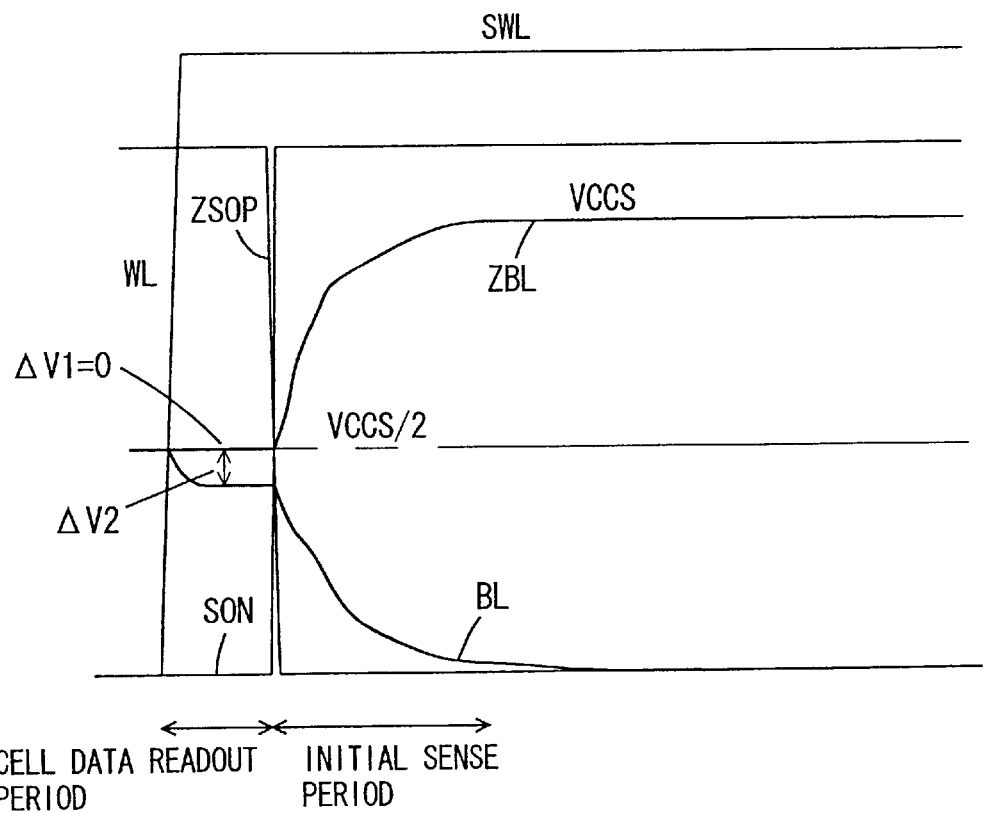
FIG. 5 is a signal waveform diagram representing the signal waveforms in memory cell data reading out at time T4 of FIG. 4.

FIG. 5 is a signal waveform diagram representing the sense operation of the memory cell data at time T2 of FIG. 4. Referring to FIG. 5, when memory cell data is read out at time T2 of FIG. 4, readout voltage ΔV1 on bit line ZBL is equal to 0 V. A readout voltage −ΔV2 corresponding to the voltage level of storage node SN2 is transmitted to bit line BL. A readout voltage of a level substantially equal to the readout voltage in reading out L level data in the DRAM of the conventional 1 bit/1 cell structure is transmitted on bit line BL. Therefore, a waveform identical to that in reading L level data in the DRAM of the conventional 1 bit/1 cell structure is obtained. A sense operation can be carried out correctly at a sense speed similar to that of the conventional DRAM.

Referring to FIG. 4 again, even if voltage V (SN1) of storage node SN1 becomes lower than bit line precharge voltage VCCS/2 after time T2 the sense and amplify operation of memory cell data can be carried out correctly although the sense operation is slightly slowed down (the transition speed of N channel MOS transistor to ON state becomes slower) as long as the potential difference between bit lines BL and ZBL is above the sensitivity of sense amplifier circuit S/A.

Therefore, a long refresh mode increasing the maximum refresh time tREFmax can be set. In this long refresh mode, the cycle of refresh request signal FAY shown in FIG. 48 can be made greater one order or so to allow reduction of current consumption for retaining data.

By the complementary data read out to the pair of bit lines BL and ZBL, a correct sense operation can be carried out if readout voltage −ΔV2 of L level data is of an adequate level even if readout voltage ΔV1 of H level data is small. Therefore, it is no longer necessary to transmit a full VCCS to storage node SN. This means that the restriction that the voltage level required for the voltage driving a word line (main/subword line) must be sufficiently higher than the sum of the array power supply voltage (sense power supply voltage) VCCS and the threshold voltage (Vthc) of the access transistor of the memory cell can be alleviated. In other words, the level of boosted voltage VPP can be appropriately reduced to lower current consumption of the boosted voltage generation circuit for generating boosted voltage VPP, which is formed generally of a charge pump circuit. Accordingly, the current consumption in the normal operation of the semiconductor memory device can be reduced.

Figure 6:
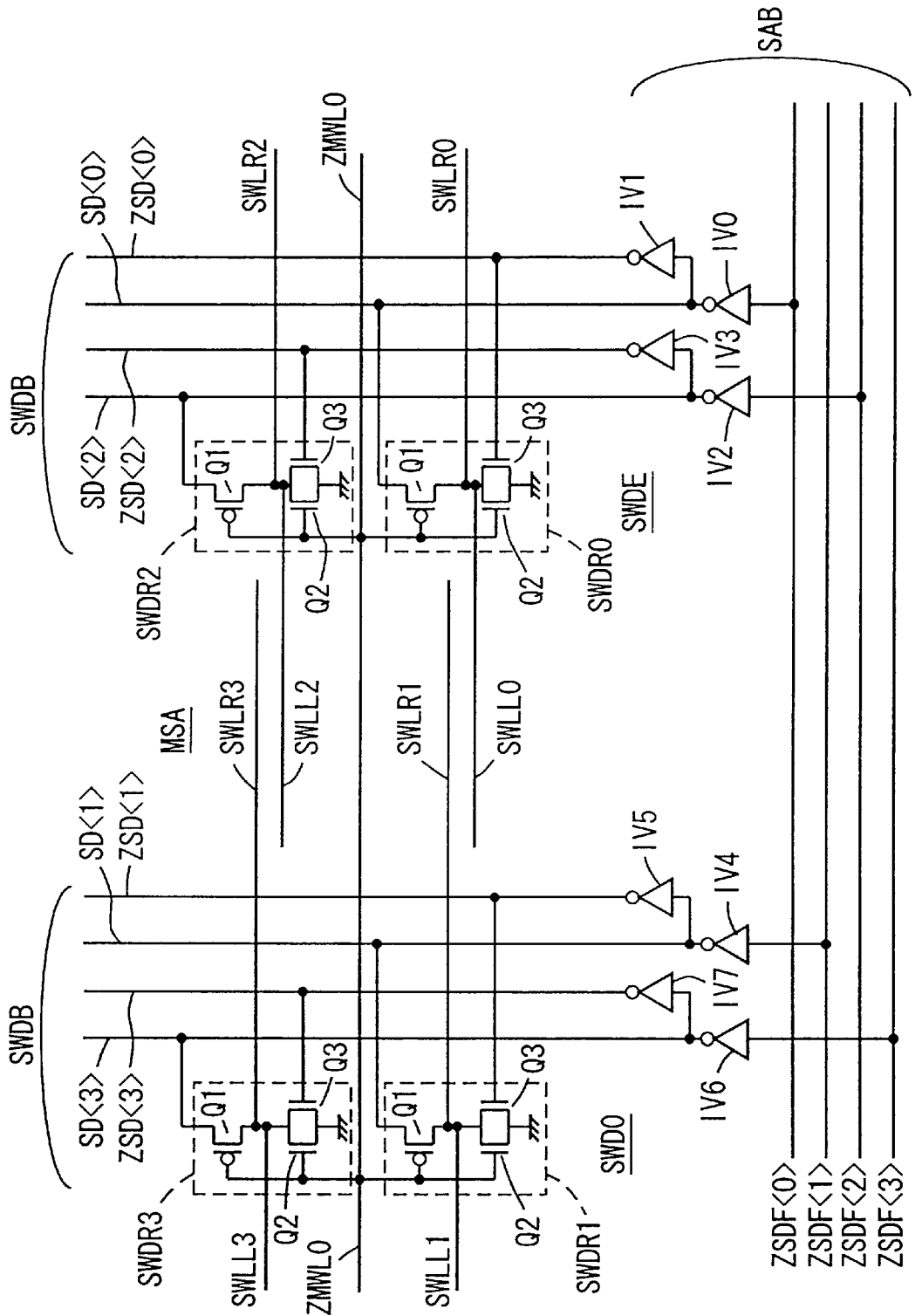
FIG. 6 shows a structure of a word line driving unit of the semiconductor memory device according to the first embodiment.

FIG. 6 shows a structure of a subword driver. The structure of the subword driver portion related to main word line ZMWL0 is depicted in FIG. 6.

In memory subarray MSA, four subword lines SWLL0, SWLR1, SWLL2 and SWLR3 are arranged for main word line ZMWL0.

For this main word line ZMWL0, an odd numbered subword driver SWDO is arranged at one of the subword driver bands and even numbered subword driver SWDE is arranged at the other subword driver band SWDB. Even numbered subword driver SWDE includes a subword driver circuit SWDR0 driving subword line SDLR0 according to the signal on main word line ZMMWL0 and subdecode signals SD<0> and ZSD<0>, and a subword driver circuit SWDR2 driving subword lines SWLR2 and SWLL2 according to the signal on main word line ZMWL0 and subdecode signals SD<2> and ZSD<2>. Since the subword line in two memory subarrays can be driven by one subword drive circuit SWDR, the area penalty by the subword driver band can be reduced.

Subword driver SWDO includes a subword drive circuit SWDR1 driving subword lines SWLR1 and SWLL1 according to the signal on main word line ZMWL0 and subdecode signals SD<1> and ZSD<1>, and a subword driver circuit SWDR3 driving subword lines SWLR3 and SWLL3 according to the signal on main word line ZMWL0 and subdecode signals SD<3> and ZSD<3>. Each of subword drive circuits SWDR1 and SWDR3 drives the subword lines in the two memory subarrays at the same time.

Subdecode signals SD<0>–SD<3> and ZSD<0>–ZSD<3> are generated from subdecode fast signals ZSDF<0>–ZSDF<3> transmitted on the signal line extending along sense amplifier band SAB. More specifically, subdecode signal SD<0> is generated from inverter IV0 receiving subdecode fast signal ZSDF<0>. Complementary subdecode signal ZSD<0> is generated from inverter IV1 receiving the output signal of inverter IV0. Subdecode signal SD<2> is generated from inverter IV2 receiving subdecode fast signal ZSDF<2>. Subdecode signal ZSD<2> is generated from inverter IV3 receiving the output signal of inverter IV2. Subdecode signal SD<1> is generated from inverter IV4 receiving subdecode fast signal ZSDF<1>. Subdecode signal ZSD<1> is generated from inverter IV5 receiving the output signal of inverter IV4. Subdecode signal SD<3> is generated from inverter IV6 receiving subdecode fast signal ZSDF<3>. Subdecode signal ZSD<3> is generated from inverter IV7 receiving the output signal of inverter IV6. The output signal lines of inverters IV0–IV7 extend only within memory subarray MSA. Inverters IV0–IV7 are arranged at the crossing of sense amplifier band SAB and subword driver band SWDB.

Each of subword drive circuits SWDR0–SWDR3 have the same structure. More specifically, subword drive circuit SWDRi (i=0–3) includes: a P channel MOS transistor Q1 turned on, when the signal on main word line ZMWL0 is at an L level, to transmit subdecode signal SD<i>; an N channel MOS transistor Q2 rendered conductive, when the potential of the signal on main word line ZMWL0 is at an H level, to hold corresponding subword lines SWLRi and SWLLi at the level of the ground potential; and an N channel MOS transistor Q3 rendered conductive, when subdecode signal ZSD<i> is at an H level, to hold corresponding subword lines SWLRi and SWLLi at the level of the ground voltage.

Main word line ZMWL0 is driven to the level of a ground potential when selected. At this selected state, MOS transistor Q2 is OFF. P channel MOS transistor Q1 conducts when subdecode signal SD<i> is at an H level, to transmit subdecode signal SD<i> to corresponding subword line SWLRi. Complementary subdecode signal ZSD<i> is at an L level, and N channel MOS transistor Q3 is OFF.

When subdecode signal SD<i> is at an L level, P channel MOS transistor Q1 has the source and gate set at the same potential, to be turned off. In this state, subdecode signal ZSD<i> is at an H level, and MOS transistor Q3 is turned on, and corresponding subword lines SWLRi and SWLLi are held at the level of the ground potential. This prevents a non-selected subword line from attaining a floating state. Subdecode signals SD<0>–SD<3> are generated by decoding a predetermined row address bit. In the case of the 4-way hierarchical word line structure where four subword lines SWLL0, SWLR1, SWLL2 and SWLR3 are arranged for one main word line ZMWL, the subword lines simultaneously driven to a selected state correspond to the set of subword lines SWLL0 and SWLR1 or the set of subword lines SWLL2 and SWLR3. Therefore, subdecode signals SD<1> and SD<0> or subdecode signals SD<2> and SD<3> are set to the selected state simultaneously.

Figure 7:
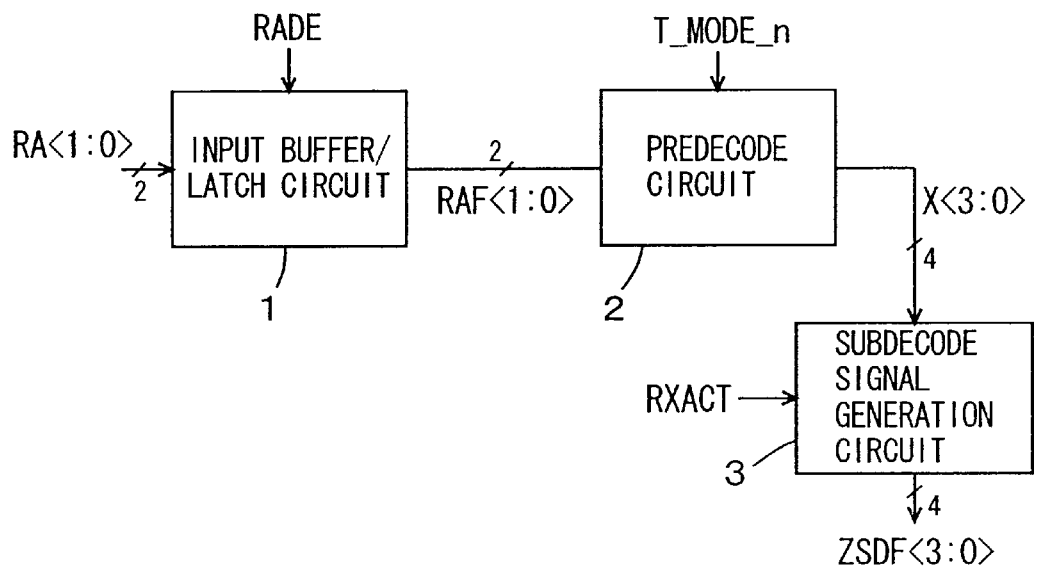
FIG. 7 schematically shows a structure of a subdecode signal generating unit of FIG. 6.

FIG. 7 schematically shows a structure of the subdecode fast signal generating unit.

Referring to FIG. 7, the subdecode fast signal generation unit includes an input buffer/latch circuit 1 responsive to activation of row address enable signal RADE for accepting 2-bit row address RA<1:0> applied from the logic to generate internal row address bits RAF<1:0>, a predecode circuit 2 predecoding internal row address bits RAF<1:0> to generate a predecode signal X<3:0>, and a subdecode signal generation circuit 3 responsive to activation of word line activation signal RXACT for generating a subdecode fast signals ZSDF<3:0> according to predecode signals X<3:0>.

When twin cell mode designation signal T_MODE_n is in an inactive state (H level), predecode circuit 2 predecodes internal row address bits RAF<1:0> to generate 4 predecode signals X<3:0>. When twin cell mode designation signal T_MODE_n is at an active state and the 1 bit/2 cell operation mode or the twin cell mode is specified, predecode circuit 2 degenerates internal row address bits RAF<0> to generate predecode signals X<3:0>. Subdecode fast signals ZSDF<3:0> are generated in a one to one correspondence to predecode signals X<3:0> when word line activation signal RXACT is rendered active. Therefore, when twin cell mode designation signal T_MODE_n is active, two bits of subdecode fast signal signals ZSDF<3:0> are driven to a selected state at the same time.

Figure 8:
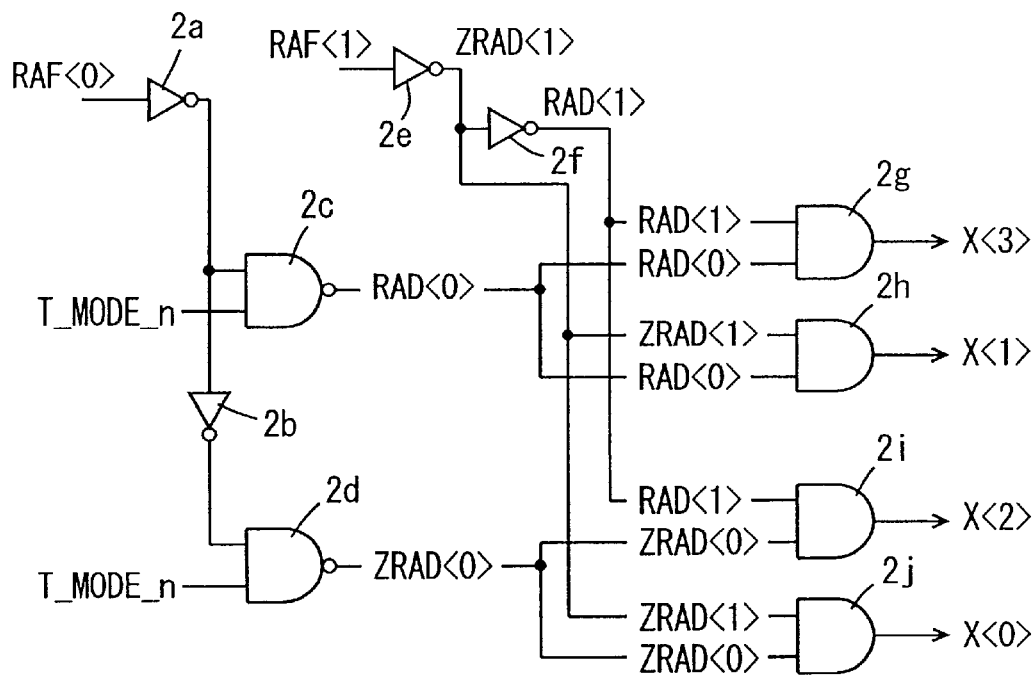
FIG. 8 shows a structure of a predecode circuit shown in FIG. 7.

FIG. 8 shows an example of a structure of predecode circuit 2 of FIG. 7. Referring to FIG. 8, predecode circuit 2 includes an inverter 2a receiving internal row address bit RAF<0>, an inverter 2b receiving the output signal of inverter 2a, a NAND gate 2c receiving the output signal of inverter 2a and twin cell mode designation signal T_MODE_n, and a NAND circuit 2d receiving output signal of inverter 2b and twin cell mode designation signal T_MODE_n. Internal row address bit RAD<0> is generated from NAND circuit 2c. Complementary internal row address bit ZRD<0> is output from NAND circuit 2d.

Predecode circuit 2 further includes an inverter 2e receiving row address bit RAF<1>, an inverter 2f receiving output bit ZRAD<1> of inverter 2e, an AND circuit 2g receiving row address bit RAD<1> from inverter 2f and row address bit RAD<0> from NAND circuit 2c to generate predecode signal X<3>, an AND circuit 2h receiving row address bit ZRAD<1> from inverter 2e and row address bit RAD<0> from NAND circuit 2c to generate predecode signal X<1>, an AND circuit 2i receiving row address bit RAD<1> from inverter 2f and row address bit ZRAD<0> from NAND circuit 2d to generate predecode signal X<2>, and an AND circuit 2j receiving row address bit ZRAD<1> from inverter 2e and row address bit ZRAD<0> from NAND circuit 2d to generate predecode signal X<0>.

Twin cell mode designation signal T_MODE_n is set at an L level when the 1 bit/2 cell twin cell operation mode is specified. In this state, row address bits RAD<0> and ZRAD<0> output from NAND circuit 2c and 2d both attain a selected state of an H level, and row address bit RA<0> is set into the degenerated state. Therefore, the set of predecode signals X<0> and X<1> or the set of predecode signals X<2> and X<3> is driven to the selected state of an H level according to the logic value of row address bits ZRAD<1> and RAD<1> from inverters 2a and 2f. Therefore, a set of adjacent word lines is constantly driven to the selected state in the twin cell mode.

When twin cell mode designation signal T_MODE_n is set at an H level, NAND circuits 2c and 2d operate as inverters. Therefore, row address bits RA<1:0> are predecoded to drive one of the four predecode signals X<0>–X<3> to a selected state. By this twin cell mode designation signal T_MODE_n, the operation mode can be switched between the 1 bit/1 cell mode and the twin cell mode.

Figure 9:
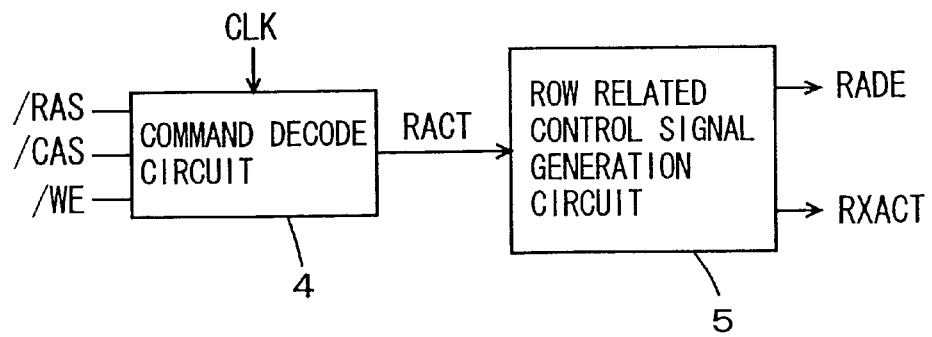
FIG. 9 schematically shows a structure of a control signal generating unit of FIG. 7.

FIG. 9 schematically shows a structure of the row related control signal generating portion of FIG. 7. Referring to FIG. 9, the row related control signal generation circuit includes a command decode circuit 4 accepting externally applied control signals /RAS, /CAS and /WE at the rising edge of clock signal CLK to generate a row select operation activation signal RACT when the control signals correspond to a row active command, and a row related control signal generation circuit 5 generating row related control signals such as a row address enable signal RADE and a word line activation signal RXACT according to row select operation activation signal RACT. Row related control signal generation circuit 5 generates the control signals to row related circuitry such as the sense amplifier circuit, bit line precharge/equalize circuit and row decoder. The main word line is driven to a selected state according to word line activation signal RXACT.

Figure 10:
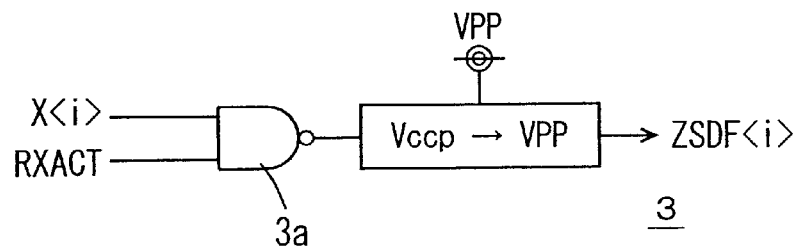
FIG. 10 shows a structure of a subdecode signal generation circuit of FIG. 7.

FIG. 10 shows an example of the structure of subdecode signal generation circuit 3 of FIG. 7. In FIG. 10, the structure corresponding to one subdecode fast signal ZSDF<i> is depicted. Referring to FIG. 10, subdecode signal generation circuit 3 includes a NAND circuit 3a receiving predecode signal X<i> and word line activation signal RXACT. NAND circuit 3a outputs a subdecode fast signal ZSFD<i> via a level shifter 3b converting the signal of the level of periphery power supply voltage Vccp into a signal of the level of high voltage Vpp. Subdecode fast signal ZSDF<i> is generated according to predecode signal X<i>. When the two predecode signals X<0> and X<1> or X<2> and X<3> are driven to a selected state, the two subdecode first signals are also driven to a selected state of an L level. By degenerating the row address bit by 1 bit in twin cell mode designation signal T_MODE_n in predecode circuit 2, two subword lines can be driven to a selected state at the same time.

Figure 11:
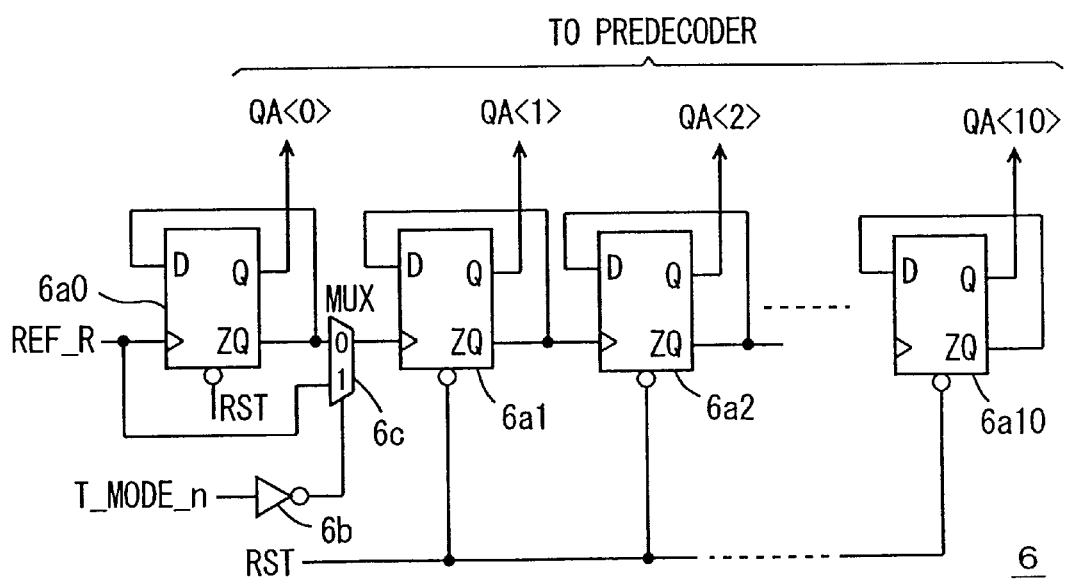
FIG. 11 shows an example of a structure of a refresh counter generating a refresh address.

FIG. 11 shows an example of a structure of refresh counter 6 generating a refresh address. Referring to FIG. 11, refresh counter 6 includes D type flip-flops 6a0–6a10 each responsive to the rise of the signal applied to a clock input to accept and output the signal applied to an input D, an inverter 6b receiving twin cell mode designation signal T_MODE_n, and a multiplexer 6c responsive to the output signal of inverter 6b for selecting the refresh operation complete designation signal REF_R or the signal from output ZQ of D type flip-flop 6a0 to apply the selected signal to the clock input of D type flip-flop 6a1.

Each of D type flip-flops 6a0–6a10 receives the signal outputted from its own output ZQ at its D input. D type flip-flops 6a1–6a10 each provide the signal from output ZQ to the clock input of the D type flip-flop of the next stage. The first-stage D type flip-flop 6a0 receives refresh operation completion designation signal REF_R at its clock input. D type flip-flops 6a0–6a10 each is responsive to reset signal RST for causing the signal from its output Q to be reset to 0.

Refresh counter 6 shown in FIG. 11 is essentially a ripple counter. Refresh address bits QA<0>–QA<10> are output from outputs Q of D type flip-flops 6a0–6a10 to be applied to the predecoder of the next stage. Multiplexer 6c selects refresh operation complete signal REF_R when twin cell mode designation signal T_MODE_n is at an L level and the 1 bit/2 cell twin cell mode is specified. Therefore, the count formed of bits QA<1>–QA<10>is incremented by one at each refresh operation in the 1 bit/2 cell mode (twin cell mode). In the 1 bit/1 cell mode, multiplexer 6c selects the output signal from output ZQ of D type flip-flop 6a. Therefore, the count formed of bits QA<0>–QA<10> is incremented by one at each refresh operation.

Figure 12A:
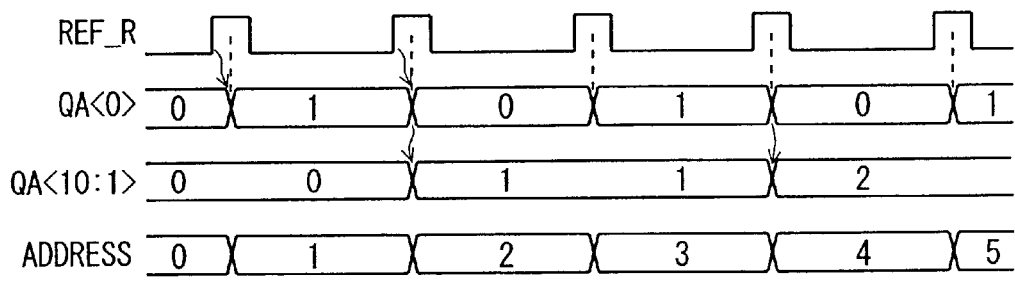
FIGS. 12A and 12B are timing charts representing the operation of the refresh counter shown in FIG. 17.
Figure 12B:
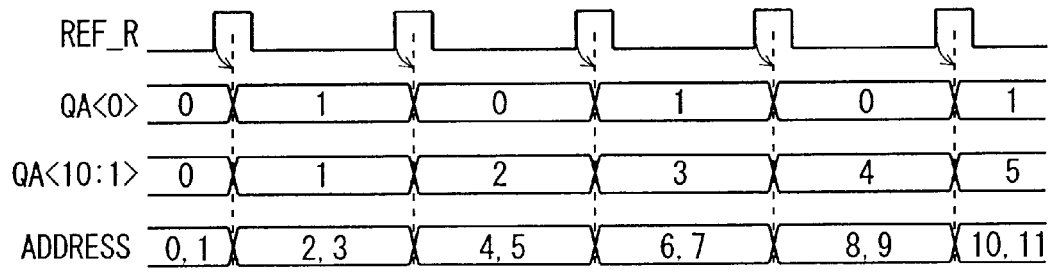

FIGS. 12A and 12B are timing charts representing the operation of a refresh address counter 6 of FIG. 11. The operation of refresh operation counter 6 of FIG. 11 will be described with reference to FIGS. 12A and 12B.

FIG. 12A represents the operation in the 1 bit/1 cell mode in which twin cell mode designation signal T_MODE_n is set to an H level. In this case, multiplexer 6d selects the signal from output ZQ of D type flip-flop 6a0. At each generation of refresh operation complete designation signal REF_R, output bit QA<0> from D type flip-flop 6a0 of the first stage alternately exhibits 0 and 1 repetitively. The remaining flip-flops 6a1–6a10 have the states of respective output bits altered when outputs ZQ of the D type flip-flops of the preceding stages rise to an H level, i.e. when address bit QA<j> from D type flip-flop 6aj of the preceding stage is pulled down to 0. Therefore, the count value of bit QA<10:1> is incremented by 1 every time when refresh operation complete designation signal REF_R is generated. Since the refresh address is 11-bit address of bit QA<10:0>. The refresh address is incremented by 1 every other time refresh operation complete designation signal REF_R is generated. When the refresh address is formed of 11 bits and the refresh operation is performed 2K times, refresh operation of one row is completed.

The operation of the twin cell mode will be described with reference to FIG. 12B. In a twin cell mode, multiplexer 6c selects refresh operation complete designation signal REF_R for application to the clock input of D type flip-flop 6a1. Refresh operation complete designation signal REF_R is applied also to D type flip-flop 6a0 of the first stage. Therefore, bit QA<0> repeatedly exhibits 0 and 1 alternately at each generation of refresh operation complete designation signal REF_R. Address bits QA<10:1> corresponds to the count value of refresh operation complete designation signal REF_R. The count of bits QA<10:1> is incremented by one as 0, 1, 2 . . . every time refresh operation complete designation signal REF_R is generated.

In the twin cell mode, address bit QA<0> is degenerated by the predecoder. Therefore, the refresh address is incremented by two as (0, 1), (2, 3), (4, 5) . . . , whereby the rows of two row addresses (subword line) are selected simultaneously. All the rows are refreshed once when the refresh is carried out 1K times. Thus, the refresh operation can be carried out correctly in both the twin cell mode and 1 bit/1 cell mode.

Figure 13:
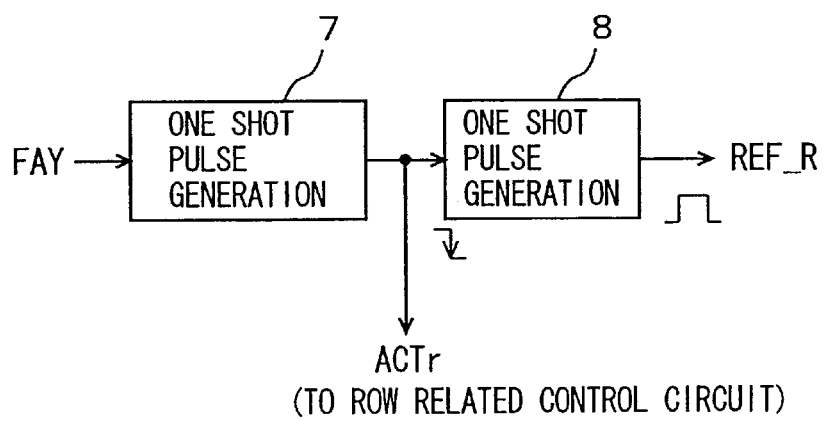
FIG. 13 schematically shows a structure of a refresh operation completion designation signal generating unit of FIG. 11.

FIG. 13 schematically shows a structure of the refresh operation complete designation signal generating unit. Referring to FIG. 13, the refresh operation complete designation signal generating unit includes a one shot pulse generation circuit 7 responsive to refresh request signal FAY for generating a one shot pulse signal of a predetermined time width determining the internal RAS width (row active period) required to refresh memory cell data, and a one shot pulse generation circuit 8 generating a one shot pulse signal in response to the fall (inactivation) of pulse signal ACTr from one shot pulse generation circuit 7. Refresh operation complete designation signal REF_R is output from one shot pulse generation circuit 8. Pulse signal ACTr from one shot pulse generation circuit 7 is applied to row related control circuitry as a row select operation activation signal. When pulse signal ACTr is in an active state, the row related control circuitry generates a word line activation signal RXACT as shown in FIG. 9 and others in a predetermined sequence.

Figure 14:
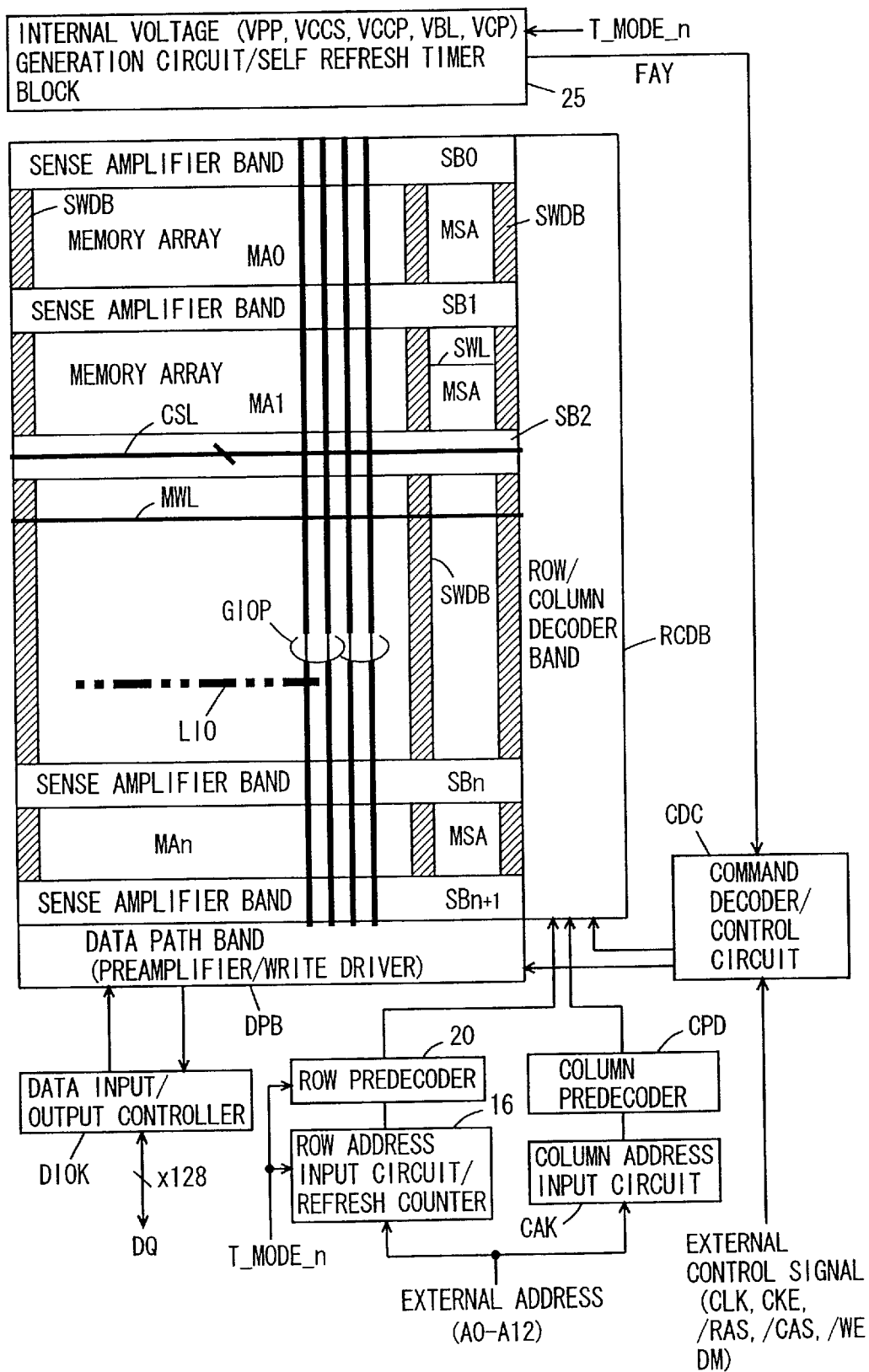
FIG. 14 schematically shows an entire structure of the semiconductor memory device according to the first embodiment.

FIG. 14 schematically shows an entire structure of the embedded DRAM according to the first embodiment. In FIG. 14, twin cell mode designation signal T_MODE_n is applied as a control signal to row address input circuit/refresh counter 16 and row predecoder 20. Twin cell mode designation signal T_MODE_n is also applied to an internal voltage generation circuit/self refresh timer block 25. Row predecoder 20 includes the predecode circuit shown in FIGS. 7 and 8 to degenerate the least significant address bit in a twin cell mode. Row address input circuit/refresh counter 16 includes a refresh counter 6 shown in FIG. 11. In a twin cell mode, the address generation manner is changed so that the number of times of refresh operations is halved.

Block 25 includes the circuit to generate boosted voltage VPP and a self refresh timer to generate refresh request signal FAY. In the twin cell mode, the level of boosted voltage VPP is reduced and the self refresh interval is increased. The remaining structure is similar to that shown in FIG. 29. Corresponding components have the same reference characters allotted.

Figure 15:
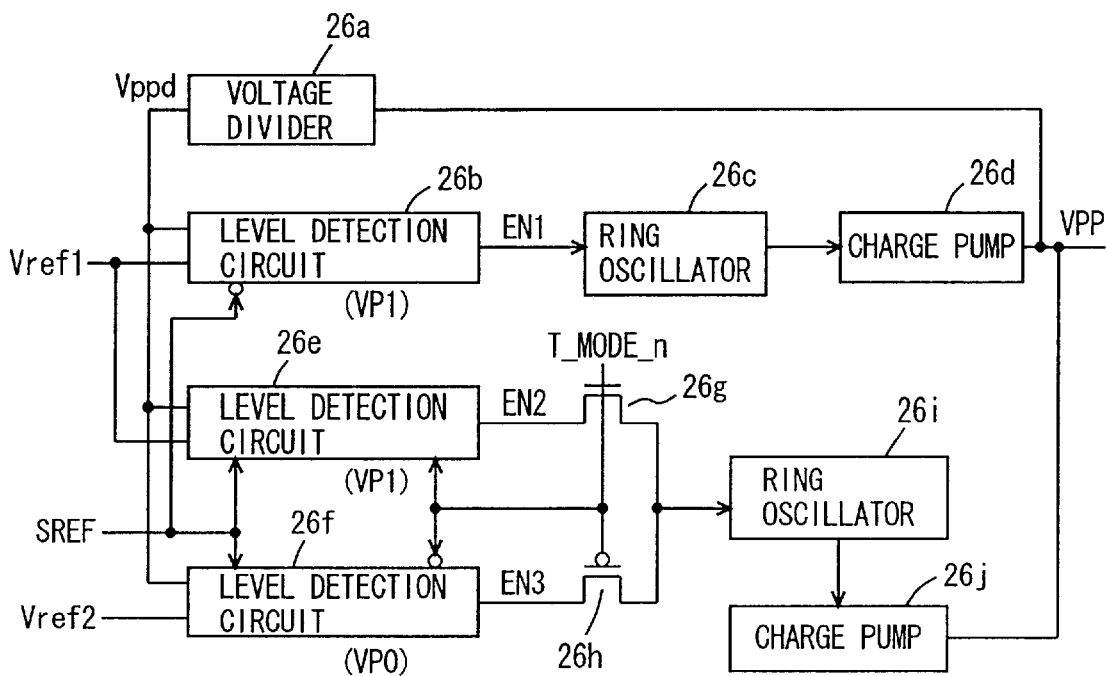
FIG. 15 schematically shows a structure of a boosted voltage generation circuit in an internal voltage generation circuit block of FIG. 14.

FIG. 15 schematically shows a structure of the VPP generation circuit in internal voltage generation circuit/self refresh timer block 25 of FIG. 14. Referring to FIG. 15, VPP generation circuit 25a includes: a voltage divider 26a voltage-dividing boosted voltage Vpp at a predetermined ratio to generate divided voltage Vppd; a level detection circuit 26b activated, when self refresh mode designation signal SREF is inactive, to compare a reference voltage Vref1 with divided voltage Vppd output from voltage divider 26a; a ring oscillator 26c started, when enable signal EN1 from level detection circuit 26b is active, to carry out an oscillation operation at a predetermined cycle; and a precharge pump circuit 26d carrying out a charge pump operation to generate boosted voltage VPP according to the oscillation signal from ring oscillator 26c. Level detection circuit 26b renders enable signal EN1 active when divided voltage Vppd becomes lower than reference voltage Vref1. Boosted voltage VPP is held at the level of voltage VP1. Charge pump 26d has a relatively large charge supply ability and carries out a charge pump operation when self refresh mode designation signal SREF is inactive.

VPP generation circuit 25a further includes a level detection circuit 26e rendered active to compare reference voltage Vref1 with divided voltage Vppd when self refresh mode designation signal SREF is active and twin cell mode designation signal T_MODE_n is inactive at an H level, a transfer gate 26g rendered conductive to transmit enable signal EN2 from level detection circuit 26e when twin cell mode designation signal T_MODE_n is inactive, a level detection circuit 26f rendered active to compare a reference voltage Vref2 with divided voltage Vppd when self refresh designation signal SREF and twin cell mode designation signal T_MODE_n are at an active state, a transfer gate 26h rendered conductive to transmit an enable signal EN3 from level detection circuit 26f when twin cell mode designation signal T_MODE_n is active, a ring oscillator 26i started to carry out an oscillation operation at a predetermined cycle when the enable signals from transfer gates 26g and 26h are activated, and a charge pump 26j carrying out a charge pump operation to generate boosted voltage VPP according to the oscillation signal from ring oscillator 26i.

Level detection circuit 26e is rendered active in the operation of the 1 bit/1 cell mode in a self refresh mode to render enable signal EN2 active when divided voltage Vppd becomes lower than reference voltage Vref1. In the 1 bit/1 cell mode, transfer gate 26g is in a conductive state. Ring oscillator 26i performs an oscillation operation according to enable signal EN2 from level detection circuit 26e. Charge pump 26j operates only in the self refresh mode, and its charge supply ability is set relatively small. Boosted voltage VPP is maintained at the level of voltage VP1 by level detection circuit 26e.

Level detection circuit 26f is rendered active when the twin cell mode is specified in the self refresh mode to render active enable signal EN3 when divided voltage Vppd becomes lower than reference voltage Vref2. In the twin cell mode, transfer gate 26h is turned on, and ring oscillator 26i carries out the oscillation operation according to enable signal EN3 from level detection circuit 26f. Level detection circuit 26f sets boosted voltage VPP at the level of voltage VP0. As described before, reference voltage Vref2 is lower in level than reference voltage Vref1, and satisfies the relationship of voltage VP1>VP0.

When the twin cell mode is specified, boosted voltage Vpp is maintained at the level of voltage VPO. In the 1 bit/1 cell mode, boosted voltage VPP is maintained at the level of voltage VP1. Consequently, the level of boosted voltage VPP can be altered easily according to the 1 bit/1 cell mode and 1 bit/2 cell mode (twin cell mode).

According to the structure of FIG. 15, the twin cell mode is specified when the self refresh mode is set. However, when this twin cell mode is specified in a normal operation mode, an additional level detection circuit comparing reference voltage Vref2 with divided voltage Vppd is provided in parallel to level detection circuit 26b. The enable signal from either this additional level detection circuit or level detection circuit 26b is applied to ring oscillator 26c depending upon the 1 bit/1 cell mode or the twin cell mode.

The generally used level detection circuit can be employed for structuring level detection circuits 26b, 26e and 26f. More specifically, the boosted voltage VPP is dropped by a diode-connected MOS transistor, and then is applied to the source of the comparing MOS transistor receiving a reference voltage at a gate thereof Whether boosted voltage VPP is kept at a predetermined level or not can be identified by the conduction/non-conduction of the comparing MOS transistor.

Figure 16:
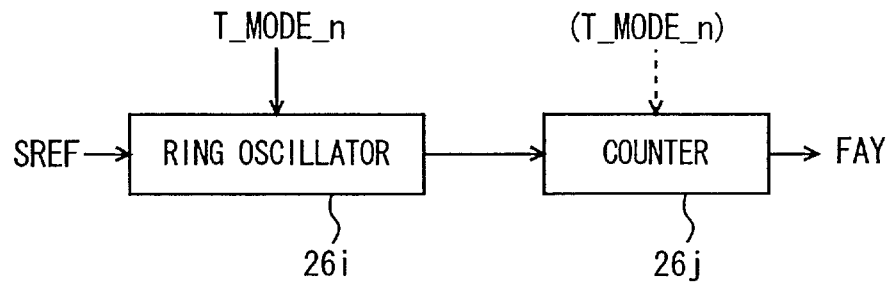
FIG. 16 schematically shows a structure of a self refresh timer in a self refresh timer block of FIG. 14.

FIG. 16 schematically shows a structure of self refresh timer 25b in internal voltage generation circuit/self refresh timer block 25 of FIG. 14. Referring to FIG. 16, self refresh timer 25b includes a ring oscillator 26i rendered active at the activation of sense refresh mode designation signal SREF to carry out an oscillation operation at a predetermined cycle, and a counter 26j counting the oscillation signal output from ring oscillator 26i to issue refresh request signal FAY when a predetermined count value is attained. Twin mode designation signal T_MODE_n is applied to ring oscillator 26i. When twin cell mode designation signal T_MODE_n is at an active state, the oscillation cycle of ring oscillator 26i is lengthened. In the 1 bit/1 cell mode, the oscillation cycle of ring oscillator 26i is shortened. The number of inverter delay stages of the ring oscillator is switched according to twin cell mode designation signal T_MODE_n. Since the oscillation cycle of ring oscillator 26i becomes longer in the twin cell mode, the time required for counter 26j to attain the count up value becomes longer, so that the cycle of issuing refresh request signal FAY is lengthened.

In the 1 bit/1 cell mode, the oscillation cycle of ring oscillator 26i is shortened, whereby counter 26j issues a refresh request signal FAY at a refresh interval similar to that of the normal general-purpose DRAM.

As the signal path in broken lines shown in FIG. 16, twin cell mode designation signal T_MODE_n may be applied to counter 26j of which count up value is switched between the 1 bit/1 cell mode and the twin cell mode. By switching the number of stages of the counter, increase/decrease (change) of the count up value can be implemented easily (refer to the structure of the refresh counter shown in FIG. 11).

Referring to FIG. 14 again, the structure of the embedded DRAM shown in FIG. 14 differs from that of the conventional embedded DRAM in that twin cell mode designation signal T_MODE_n is applied to internal voltage generation circuit/self refresh timer block 25, row predecoder 20, and row address input circuit/refresh counter 16. Therefore, utilizing the entire structure of a conventional embedded DRAM, an embedded DRAM that operates in both the 1 bit/1 cell mode and 1 bit/2 cell mode (twin cell mode) can be implemented.

Twin cell mode designation signal T_MODE_n can be generated with the potential of a particular pad fixed, or set in a mode register through a command.

Modification

Figure 17:
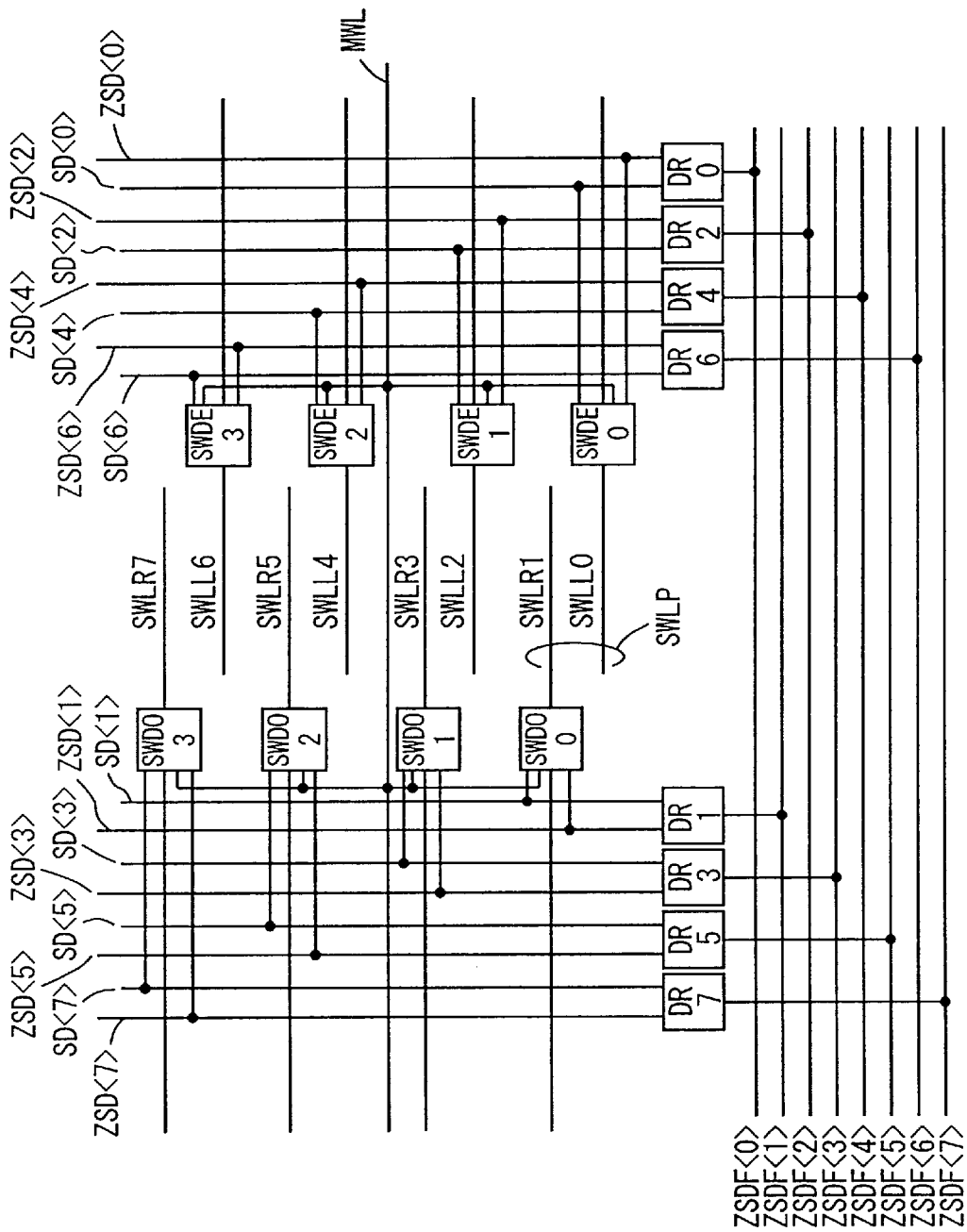
FIG. 17 schematically shows a structure of a modification of the first embodiment.

FIG. 17 schematically shows a structure of the array according to a modification of the first embodiment. According to the structure of FIG. 17, the word line has the 8-way hierarchical structure. Eight subword lines SWLL0, SWLR1, SWLL2, SWLR3, SWLL4, SWLR5, SWLL6 and SWLR7 are provided corresponding to one main word line MWL. Even number subword drive circuits SWDE0–SWDE3 are arranged for even numbered subword lines SWLL0, SWLL2, SWLL4 and SWLL6. Odd number subword drive circuits SWDO0–SWDO3 are arranged for odd numbered subword lines SWLR1, SWLR3, SWLR5 and SWLR7.

Similarly to the arrangement shown in FIG. 1, the memory cell is a half pitch cell. A bit line contact is arranged for every other column and every three rows in the row direction and column direction, respectively.

In order to select one subword line out of the eight subword lines SWLL0–SWLL7, 8-bit subdecode fast signals ZSDF<0>–ZSDF<7> are generated. Drive circuits DR0–DR7 each generating complementary subdecode signals are provided corresponding to subdecode fast signals ZSDF<0>–ZSDF<7>, respectively. Drive circuits DR0–DR7 each have a structure similar to that of the subword drive circuit shown in FIG. 6. Complementary subdecode signals SD<i> and ZSD<i> are generated from drive circuit DRi based on subdecode fast signal ZSDF<i>.

Complementary subdecode signals from odd number subword drive circuits DR1, DR3, DR5 and DR7 are applied to subword drive circuits SWDO0–SWDO3, respectively. Complementary subdecode signals from drive circuits DR0, DR2, DR4 and DR6 are applied to even numbered subword drive circuits SWDE0, SWDE1, SWDE2 and SWDE3, respectively.

Even in the 8-way hierarchical word line structure of FIG. 17, the memory cells are arranged in the half pitch cell arrangement. One of the sets of adjacent subword lines (SWLL0, SWLR1), (SWLL2, SWLR3), (SWLL4, SWLR5), and (SWLL6, SWLR7) is driven to a selected state. In response, complementary memory cell data are read out on bit lines BL and ZBL by the two selected subword lines.

Figure 18:
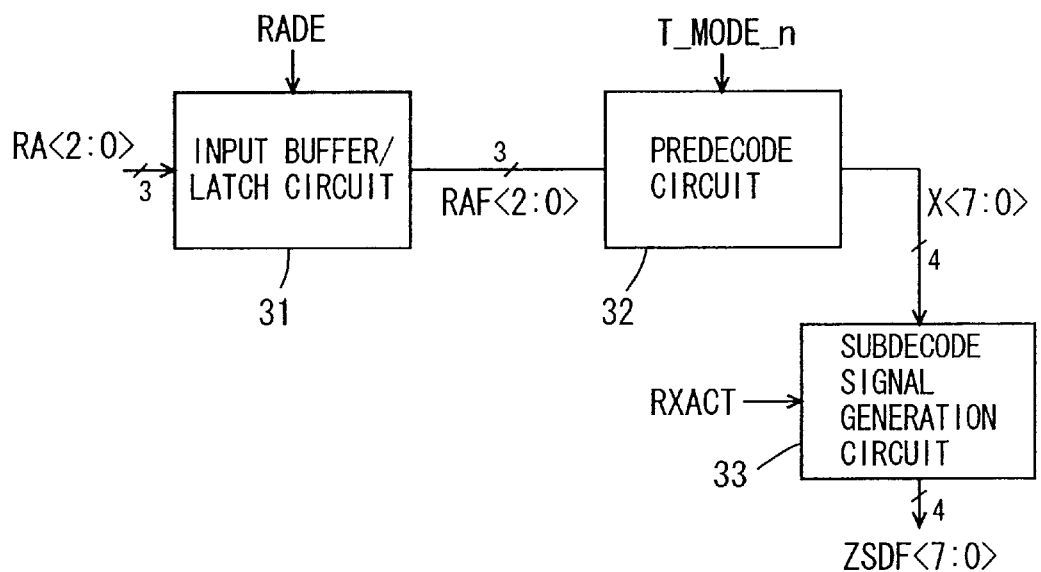
FIG. 18 schematically shows a structure of a subdecode signal generation circuit of FIG. 17.

FIG. 18 schematically shows the structure of the portion generating subdecode fast signal ZSDF<7:0>. Referring to FIG. 18, the subdecode fast signal generating unit includes an input buffer/latch circuit 31 generating an internal row address bits RAF<2:0> from external row address bits RA<2:0> according to row address enable signal RADE, similar to the previous 4-way hierarchical word line structure, a predecode circuit 32 predecoding internal row address bits RAF<2:0> to generate predecode signals X<7:0>, and a subdecode signal generation circuit 33 rendered active in response to word line activation signal RXACT, to generate subdecode fast signals ZSDF<7:0> according to predecode signals X<7:0>. Input buffer/latch circuit 31 is included in row address input circuit/refresh counter 16 shown in FIG. 14. Predecode circuit 32 is included in row predecoder 20 shown in FIG. 14. Subdecode signal generation circuit 33 is included in row/column decoder band RCDB.

When twin cell mode designation signal T_MODE_n is at an active state of an L level, predecode circuit 32 sets row address bit RAF<0>at a degenerated state to carry out predecoding, whereby two of predecode signals X<7:0> are driven to a selected state. Subdecode signal generation circuit 33 generates subdecode fast signals ZSDF<7:0> according to predecode signals X<7:0> when made active, whereby two subdecode fast signals are driven to a selected state at a time.

Figure 19:
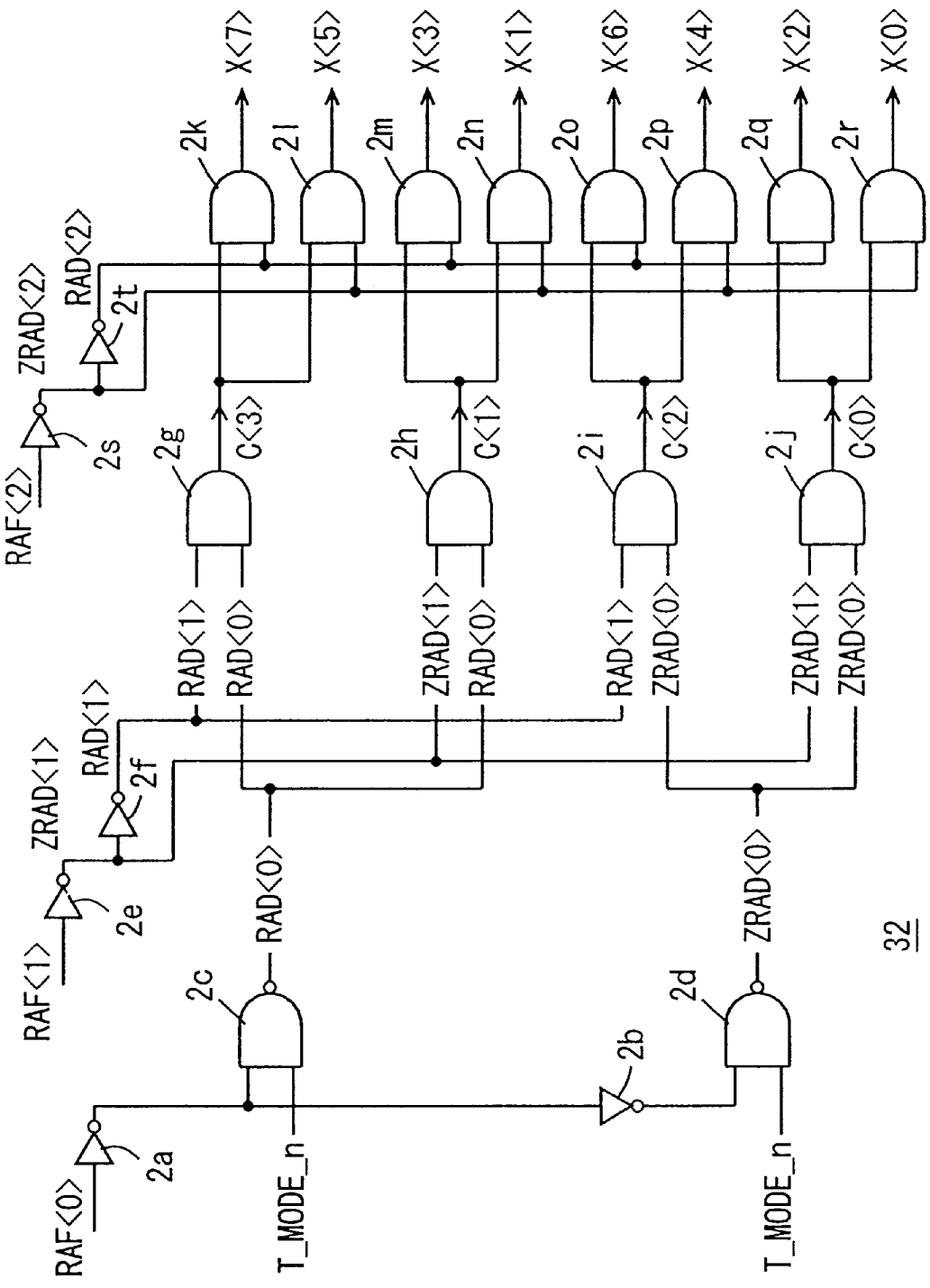
FIG. 19 shows a structure of a predecode circuit of FIG. 18.

FIG. 19 shows an example of a structure of predecode circuit 32 shown in FIG. 18. In FIG. 19, the structure of the portion generating internal signals C<3>–C<0> from 2-bit row address RAF<0> and RAF<1> in row predecode circuit 32 is similar to the structure of predecode circuit 2 shown in FIG. 8. Corresponding components have the same reference characters allotted, and detailed description thereof will not be repeated.

Predecode circuit 32 further includes an inverter 2s receiving row address bit RAF<2> to generate complementary internal address bit ZRAD<2>, an inverter 2t inverting the output signal of inverter 2s to generate internal row address bit RAD<2>, an AND circuit 2k receiving output signal C<3> from AND circuit 2g and the output bit RAD<2> from inverter 2t to generate predecode signal X<7>, an AND circuit 2l receiving bit ZRAD<2> output from inverter 2s and signal C<3> output from AND circuit 2g to generate predecode signal X<5>, an AND circuit 2m receiving signal C<1> output from AND circuit 2h and bit RAD<2> from inverter 2t to generate predecode signal X<3>, an AND circuit 2n receiving signal C<1> output from AND circuit 2h and bit ZRAD<2> output from inverter 2s to generate predecode signal X<1>, an AND circuit 2o receiving bit RAD<2> and signal C<2> output from AND circuit 2i to generate predecode signal X<6>, an AND circuit 2p receiving bit ZRAD<2> and signal C<2> output from AND circuit 2i to generate predecode signal X<4>, an AND circuit 2q receiving signal C<0> output from AND circuit 2j and bit RAD<2>to generate predecode signal X<2>, and an AND circuit 2r receiving bit ZRAD<2> and signal C<0> output from AND circuit 2j to generate predecode signal X<0>.

In the twin cell mode, twin cell mode designation signal T_MODE_n attains an L level, whereby internal row address bits RAD<0> and ZRAD<0> both attain a selected state. Under this state, one of the set of signals C<3> and C<2> and the set of signals C<1> and C<0> is driven to a selected state according to the value of row address bit RAD<1>. The case is considered where signals C<3> and C<2> both attain an H level. In this case, both predecode signals X<7> and X<6> or both predecode signals X<5> and X<4> are selected by bits RAD<2> and ZRAD<2> to be driven to a selected state simultaneously. Similarly, when signals C<1> and C<0> are both at a selected state, predecode signals X<3> and X<2> are both selected at the same time or predecode signals X<1> and X<0> are selected at the same time, according to the value of row address bit RAD<2>.

Therefore, the set of adjacent two predecode signals are driven to a selected state simultaneously in predecode signals X<0>–X<7>. Therefore, adjacent subword lines can be driven to a selected state, whereby the memory cells nearest in the row and column directions are selected simultaneously to be connected to bit lines BL and ZBL in the 8-way hierarchical word line structure. Thus, 1 bit/2 cell mode, or the twin cell mode can be implemented.

The structure of the control circuitry is identical to that of the previous 4-way hierarchical word line structure.

According to the structure of the first embodiment, information of 1 bit is stored by two memory cells which are connected to complementary bit lines, and the voltage between the bit lines in a pair can be maintained over a long period of time. Accordingly, the number of times of refresh operations can be reduced, which allows reduction of power consumption in the data retaining mode.

The twin cell mode is implemented by simply degenerating the address bit according to a control signal. Switching between the 1 bit/1 cell mode and 1 bit/2 cell mode can be realized with a simple circuit configuration.

Second Embodiment

Figure 20:
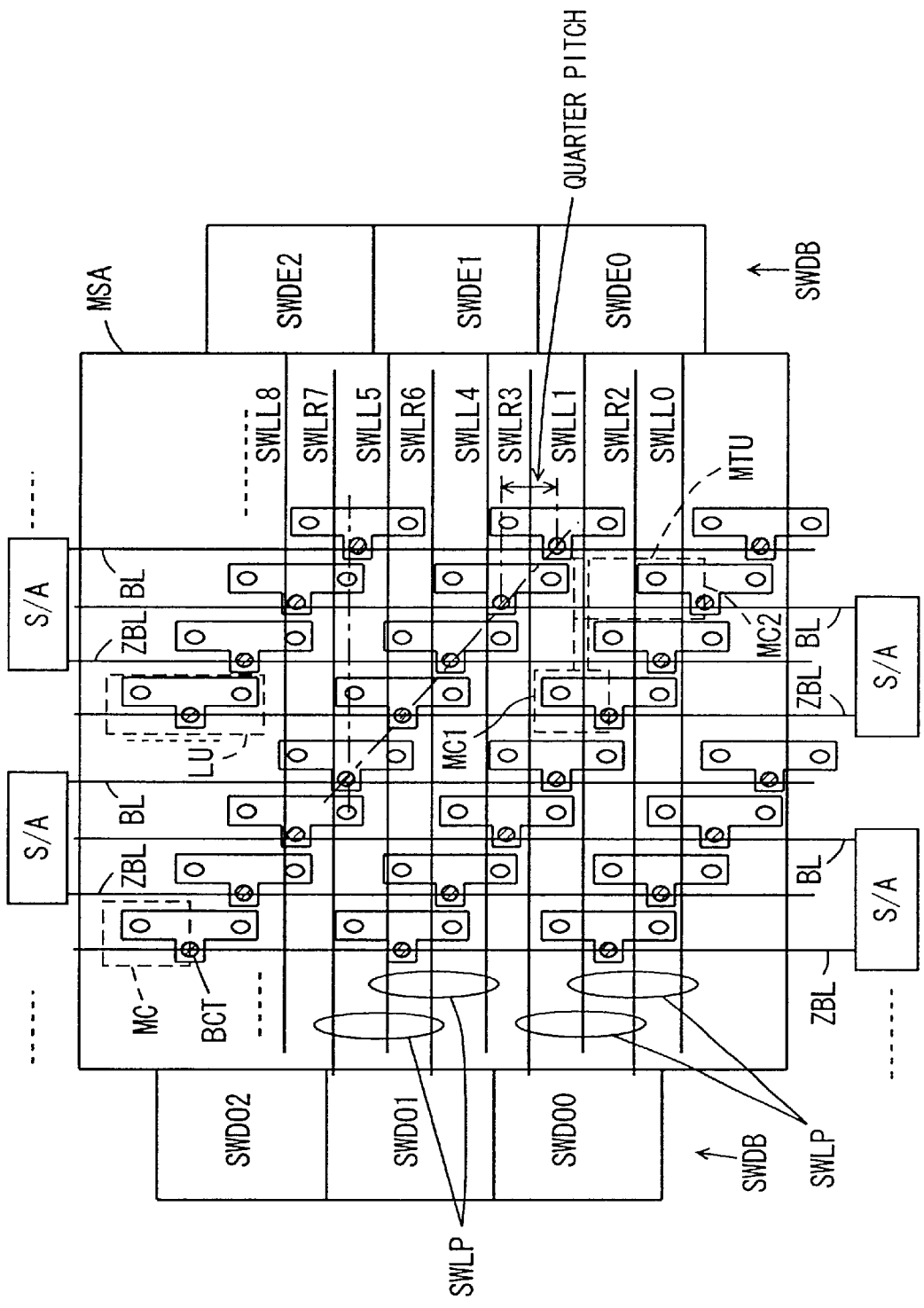
FIG. 20 schematically shows a structure of an array of a semiconductor memory device according to a second embodiment of the present invention.

FIG. 20 schematically shows a structure of a memory subarray MSA of a semiconductor memory device according to a second embodiment of the present invention. In the structure of FIG. 20, memory cell MC is the so-called quarter pitch cell, and the 4-way hierarchical word line structure is employed. In the quarter pitch cell structure, a bit line contact BCT connecting a memory cell with a corresponding bit line is arranged for every 4 columns and every 4 rows. The length projected in the bit line direction of the smallest pitch length of memory cell MC obtained by connecting bit line contacts BCT obliquely is ¼ the arrangement pitch of memory cells MC in the column direction. In other words, the cell units MTU closest in the row and column directions are shifted by 1 row in the column direction. In the row direction, layout units LU each including two memory cells are arranged at every two rows.

In the quarter pitch cell structure, the bit lines forming a pair are the bit lines spaced by two columns, not the adjacent columns spaced by one column. A sense amplifier circuit S/A is coupled to a pair of bit lines sandwiching a bit line connected to another sense amplifier circuit therebetween. In the quarter pitch cell structure, the cell unit MTU in the twin cell mode is formed of memory cells remote by one additional column and by one additional row, not adjacent rows and adjacent columns. FIG. 20 shows the case where memory cells MC1 and MC2 form the twin cell unit MTU. In order to select simultaneously memory cells MC1 and MC2 located two rows spaced, the subword line must be selected located one additional row apart.

Subword lines SWLL0, SWLR2, SWLL1, SWLR3, SWLL4, SWLR6, SWLL5, SWLR7 and SWLL8 are arranged corresponding to respective rows of memory cells. Subword lines SWLL0 and SWLL1 are driven by a subword line driver SWDE0. Subword lines SWLR3 and SWLR6 are driven by a subword line driver SWDE1. Subword line SWLL8, (and a subword line SWLL9 not shown) is driven by a subword line driver SWDE2. Subword line drivers SWDE0–SWDE2 each receive a pair of complementary signals of subdecode signals SD<0> and SD<1>.

Subword lines SWLR2 and SWLR3 are driven by a subword line driver SWDO0. Subword lines SWLR6 and SWLR7 are driven by a subword line driver SWDO1. The pair of complementary signals of subdecode signals SD<2> and SD<3> are applied to subword line drivers SWDO0–SWDO2. The sets of subword lines SWLP driven to a selected state simultaneously are the subword lines (SWLL0, SWLL1), (SWLR2, SWLR3), (SWLL4, SWLL5), (SWLR6, SWLR7). These subword line pairs are each arranged with one row placed therebetween. Data stored by the memory cells are always read out onto bit lines BL and ZBL. By the differential-amplification of sense amplifier circuit S/A, an advantage similar to that of the first embodiment can be obtained.

Figure 21:
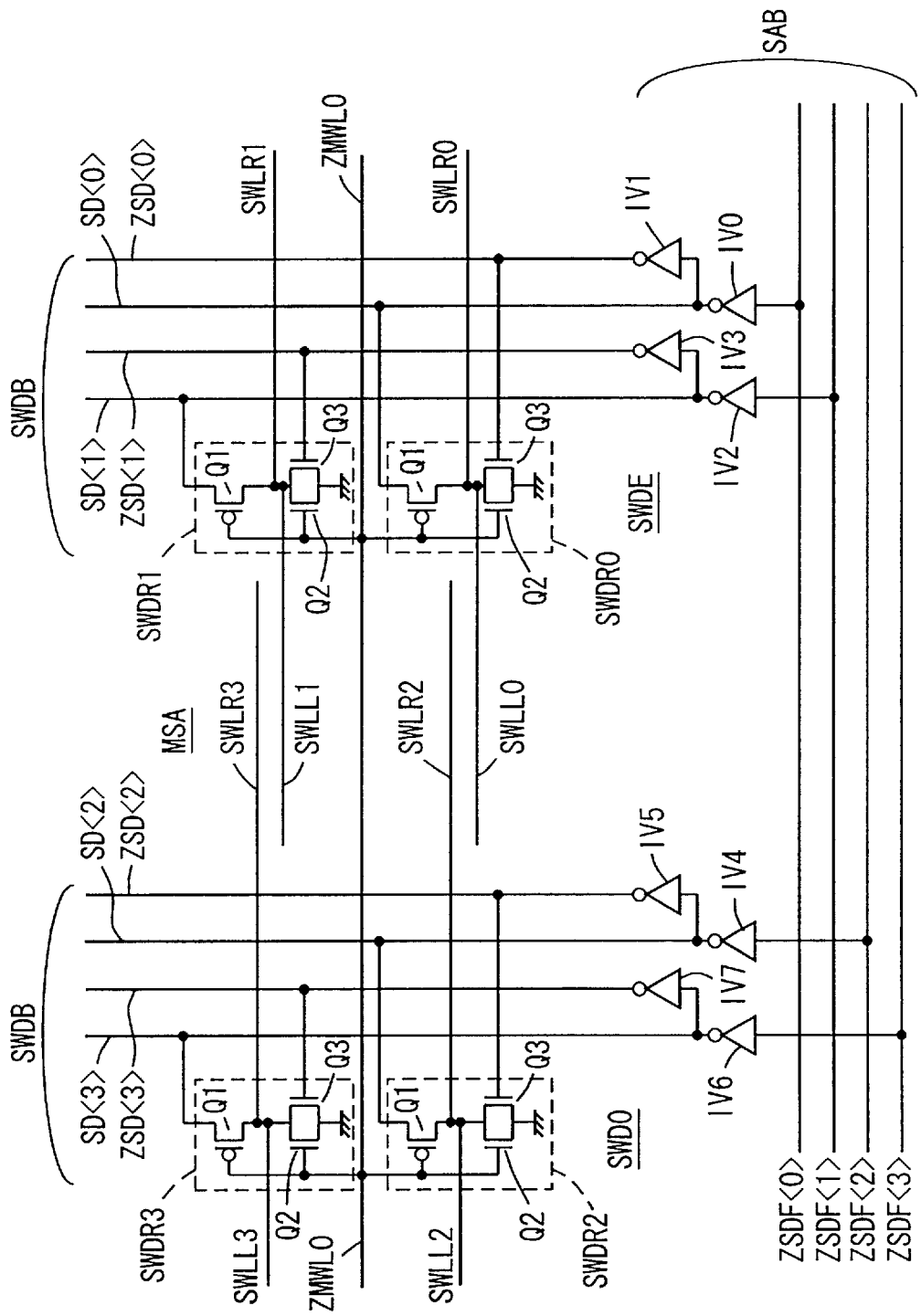
FIG. 21 shows a structure of a subword driver of FIG. 20.

FIG. 21 shows the arrangement of the subdecode signals in the second embodiment. In FIG. 21, four subword lines SWLL0, SWLR1, SWLL2 and SWLR3 related to main word line ZMWL0 are depicted. Subword line drive circuits SWDR0 and SWDR1 are arranged corresponding to subword lines SWLL0 and SWLR1, respectively. Subword line drive circuits SWDR2 and SWDR3 are arranged for subword lines SWLR2 and SWLR3, respectively. Subdecode signals SD<0> and ZSD<0> are applied to subword line driver circuit SWDR0. Subdecode signals SD<1> and ZSD<1> are applied to subword line drive circuit SWDR1. Subdecode signals ZSD<2> and SD<2> are applied to subword line drive circuit SWDR2 driving subword line SWLR2. Subdecode signals SD<3> and ZSD<3> are applied to subword line drive circuit SWDR3 that drives subword line SWLR3. Subdecode signals SD<0>–SD<3> are generated from subdecode fast signals ZSDF<0>–ZSDF<3>. In the arrangement of FIG. 21, the location of subdecode signals SD<1> and ZSD<1> and subdecode signals SD<2> and ZSD<2> are exchanged with respect to the structure of the first embodiment.

In the twin cell mode, subdecode signals transmitted through the same subword driver band SWDB are driven to a selected state. By carrying out address bit degeneration as in the first embodiment, subword lines two rows spaced can be driven to a selected state, whereby an advantage similar to that of the first embodiment can be achieved.

Subword lines spaced by two rows from each other are selected simultaneously in the twin cell mode and bit lines spaced by two columns from each other are employed as a pair in the quarter pitch cell structure, and therefore, complementary memory cell data can be read out to the pair of complementary bit lines connected to the sense amplifier circuit.

Third Embodiment

Figure 22:
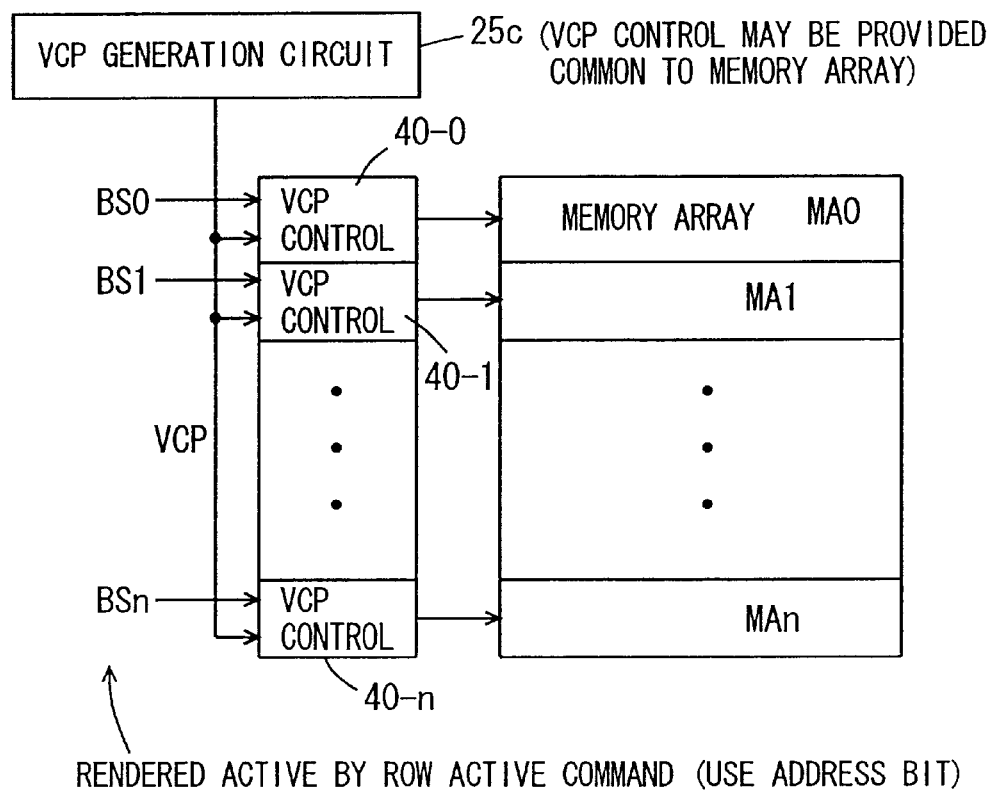
FIG. 22 schematically shows a structure of a main part of a semiconductor memory device according to a third embodiment of the present invention.

FIG. 22 schematically shows a structure of a main part of a semiconductor memory device according to a third embodiment of the present invention. In FIG. 22, VCP control circuits 40-0~40-n to transmit a cell plate voltage VCP from VCP generation circuit 25c are arranged for memory arrays MA0–MAn of the memory mat. VCP control circuit 40-i (40-0~40-n) transmits cell plate voltage VCP to a corresponding memory array MAi when block select signal BSi selecting the corresponding memory array MAi is at a selected state. When corresponding block select signal BSi is at a non-selected state, supply of cell plate voltage VCP to the corresponding memory array is ceased, and the cell plate electrode in the corresponding memory array MAi is set at a high impedance state.

VCP control circuits 40-i (40-0~40-n) is formed of, for example, a transmission gate operating in response to block select signal BSi.

Figure 23:
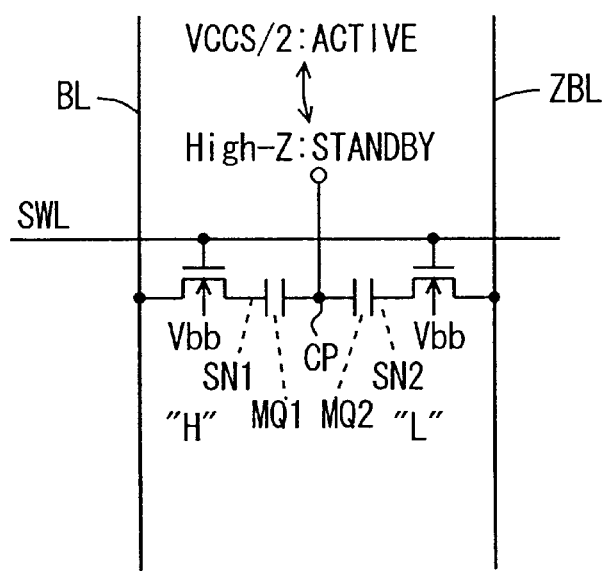
FIG. 23 is a diagram for explaining an operation of the semiconductor memory device of the third embodiment.

FIG. 23 shows an equivalent structure of the twin cell unit in the twin cell mode. The subword lines selected simultaneously are represented by one subword line SWL. In the twin cell mode, H level data is written into a half of the memory cells and L level data in written into a remaining half of the memory cells in the memory array regardless of the stored data pattern in the memory array. When H level data is written into memory capacitor MQ1 shown in FIG. 23, L level data is written into memory capacitor MQ2. ½ the entire cell plate capacitance Cp is assigned to the cells in which H level data is written and to the cells in which L level data is written. Therefore, VCP control circuit 40-i supplying cell plate voltage VCP (=VCCS/2) to cell plate node CP is set at the output high impedance state in the standby state of the corresponding memory array. In this case, the cell plate node attains a floating state, and potential drop substantially equal in level to the potential drop of the storage node at the H or L side appears at the storage node that stores data of an L or H level by the capacitive coupling. In a standby state, the voltages of storage nodes SN1 and SN2 are represented by $$V(SN1)=VCCS-\delta V1-\delta V2',$$

$$V(SN2)=0V-\delta V1'-\delta V2,$$

where $\delta V1$ and $\delta V2$ are the amount of potential drop by junction leakage current or channel leakage current, and $\delta V1'$ and $\delta V2'$ are the potential change caused by the capacitive coupling of potential drop $\delta V1$ and $\delta V2$ of storage nodes SN1 and SN2. Therefore, $\delta V1$ and $\delta V2$ are substantially equal to $\delta V1'$ and $\delta V2'$, respectively.

When a memory array is selected and returns to a row active state where a row is selected, VCP control circuit 40-i supplies again cell plate voltage VCP (=VCCS/2) to the cell plate node of corresponding memory array MAi. Since cell plate voltage VCP reduced by the leakage current of cell plate node CP rises, potential change $\delta V3$ and $\delta V3'$ of substantially the same level occurs on storage nodes SN1 and SN2 by the capacitive coupling. Voltages V (SN1) and V (SN2) of storage nodes SN1 and SN2 prior to word line selection are represented by the following equations.

$$V(SN1)=VCCS-\delta V1-\delta V2+\delta V3,$$

$$V(SN2)=0V-\delta V1'-\delta V2+\delta V3'.$$

The potential difference between storage nodes SN1 and SN2 of two cells of twin cell unit MTU in the twin cell mode is represented by the following equation.

$$V(SN1)-V(SN2)=VCCS-\delta,$$

where $\delta$ is a value extremely smaller than 1. The lost amount of the data stored in twin cell unit MTU is extremely small. Therefore, by controlling cell plate voltage VCP, the refresh time can be increased to an extent such that pseudo refresh free is achieved.

In the twin cell mode, the cell plate node is set to a high impedance state in the standby state and cell plate voltage is supplied in an active state. Therefore, by the capacitive coupling between the storage node and the cell plate, a potential change of substantially equal level can be generated at the pair of storage nodes in the twin cell unit. The voltage difference between the storage nodes of the two memory cells in the twin cell unit can be maintained at substantially the level of array power supply voltage VCCS, to implement a pseudo refresh free state. The number of times of refresh operations for retaining data can be reduced extremely to reduce current consumption significantly.

Block select signals BS0–BSn are generated by decoding an appropriate bit of the row address. The block select signal is maintained at an active state during the row active state of the corresponding memory array. Control of cell plate voltage VCP can be executed common to memory arrays MA0–MAn.

Fourth Embodiment

Figure 24:
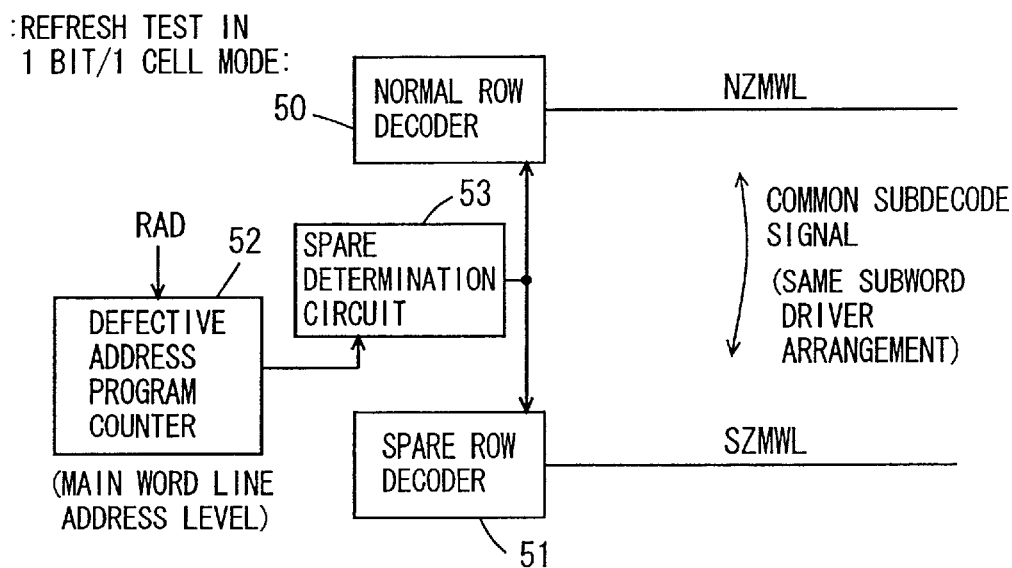
FIG. 24 schematically shows a structure of a main part of a semiconductor memory device according to a fourth embodiment of the present invention.

FIG. 24 schematically shows a structure of a main part of a semiconductor memory device (embedded DRAM) according to a fourth embodiment of the present invention. In FIG. 24, a spare main word line SZMWL is arranged for a normal main word line NZMWL. Spare main word line SZMWL may be arranged for each memory array. Alternatively such a structure may be employed in which a memory block dedicated for repair is provided commonly to memory arrays and a defective normal main word line in a memory array is repaired by the spare main word line provided in the memory block dedicated for repair.

A normal row decoder 50 is arranged for normal main word line NZMWL. A spare row decoder 51 is arranged for spare main word line SZMWL. Normal row decoder 50 decodes the row address bits to drive a corresponding normal main word line NZMWL to a selected state (L level) when a corresponding main word line is selected.

To carry out this redundancy replacement, there are provided a defective address program circuit 52 to store a defective address by programming at a main word line level, and a spare determination circuit 53 determining whether a defective main word line is addressed or not according to the signal from defective address program circuit 52. Defective address program circuit 52 may be adapted so as to apply a signal indicating the comparison result between each bit of internal row address bits RAD with each respective bit of the defective address stored in defective address program circuit 52 to spare determination circuit 53, and normal row decoder 50 or spare row decoder 51 is rendered active according to the determination result for the respective bits. In the event that a plurality of spare main word lines SZMWL are provided, such a structure may be employed that a defective address program circuit 52 is provided corresponding to each spare main word line SZMWL, and spare determination circuit 53 carries out determination of redundancy replacement according to the comparison results from the plurality of defective address program circuits 52. Spare determination circuit 53 is merely required to have the function of determining whether to carry out redundancy replacement or not at the main word line level.

Following completion of the process at the wafer level, the determination testing at the wafer level performed in the final step includes redundancy testing for defective bit repair. Determination of whether there is a defective row or not and also defect repairing when there is a defective row must be carried out. When the 1 bit/2 cell mode (twin cell mode) is employed in the case where the defect testing item is the refresh characteristics in this redundancy testing, the time required for the testing will be increased significantly since a long refresh cycle is set. Therefore, when the refresh characteristic is to be tested in the redundancy testing, the refresh characteristics is tested in the 1 bit/1 cell mode. Accordingly, the testing time is shortened.

In this case, the defective row is a row in the 1 bit/1 cell basis, and determination of the presence of defective row is performed on a row-by-row basis. This means that redundancy replacement is carried out for each main word line in the defect repairing operation. Since the subdecode signal is also applied to the subword drivers provided for the spare main word line and responsive to a signal thereon in the twin cell mode, two spare subword lines can be driven simultaneously to a selected state under the same corresponding relationship. Thus, the subword lines that are driven to a selected state at the same time in a twin cell mode are subjected to redundancy replacement even in the case of defect repairing of one row. Consequently, spare subword lines forming a pair can be driven to a selected state correctly even in the twin cell mode.

Modification 1

Figure 25:
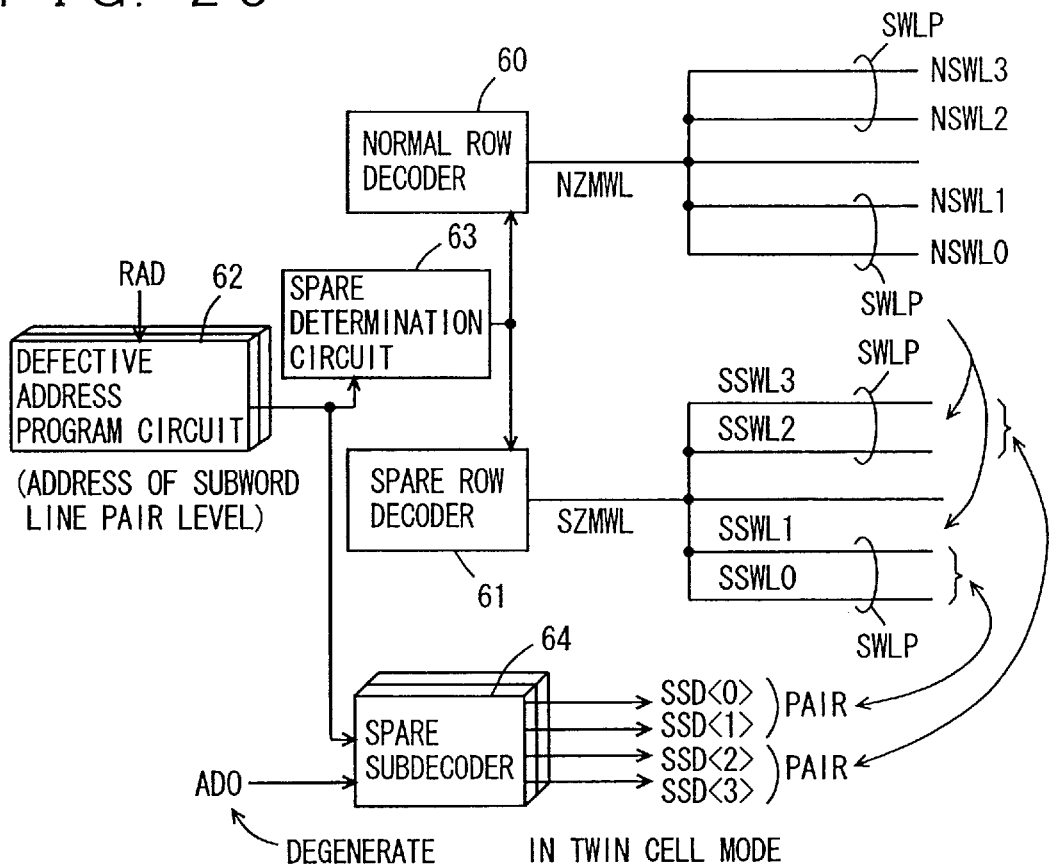
FIGS. 25 and 26 schematically show a structure of modification 1 and modification 2, respectively, of the fourth embodiment.

FIG. 25 schematically shows the structure of a modification 1 of the fourth embodiment. FIG. 25 represents the case where redundancy replacement is carried out for each pair of subword lines. Normal subword lines NSWL0–NSWL3 are arranged for normal main word line NZMWL. In the twin cell mode, normal subword lines NSWL0 and NSWL1 or normal subword lines NSWL2 and NSWL3 are driven to a selected state at the same time.

Similarly, spare subword lines SSWL0–SSWL3 arranged for spare main word line SZMWL. Redundancy replacement is carried out for each normal spare word line pair SWLP. More specifically, the pair of normal subword lines NSWL0 and NSWL1 is replaced with the pair of spare subword lines SSWL0 and SSWL1 or the pair of spare subword lines SSWL2 and SSWL3. To this end, a defective address program circuit 62 programming a defective address for each pair of subword lines is provided. In defective address program circuit 62, the address at the level of a subword line pair is programmed (the least significant row address bit is set to a degenerated state). Also, a spare subdecoder 64 is provided including a spare subdecode circuit corresponding to each pair of spare subword lines. Spare subdecoder 64 includes a spare subdecode circuit corresponding to each address program circuit of defective address program circuit 62.

When a defective address match detection signal is applied from defective address program circuit 62, spare subdecoder 64 has the corresponding spare subdecode circuit enabled, whereby a spare subdecode signal is generated according to an applied internal row address bit AD0 (corresponding to bit RAD<0>). These spare subdecode signals SSD<0> and SSD<1> are generated from one spare subdecode circuit, and spare subdecode signals SSD<2> and SSD<3> are generated from one spare subdecode circuit. The spare subdecode circuit rendered active in response to defective address match detection signal from defective address program circuit 62 drives one of the spare subdecode signals to a selected state according to address bit AD0. This spare subdecode circuit is provided corresponding to a pair of spare subword lines.

The match detection signal from defective address program circuit 62 is applied to spare determination circuit 63. Spare determination circuit 63 renders normal row decoder 60 inactive and spare row decoder 61 active when a match detection signal is applied from any of the program circuits of defective address program circuit 62. When a defective address is specified, spare row decoder 61 is rendered active to drive spare main word line SZMWL to a selected state. Normal row decoder 60 is at an inactive state, and normal main word line NZMWL maintains a non-selected state. Then, the spare subdecode circuit of spare subdecoder 64 is rendered active in response to the match detection signal from defective address program circuit 62 to decode address bit AD0.

For example, when the defective address program circuit corresponding to the pair of spare subword lines SSWL0 an SSWL1 detects a match, spare subdecode signal SSD<0> or SSD<1> is rendered active according to address bit AD0 in spare subdecoder 64 (1 bit cell mode). Accordingly, spare subword line SSWL0 or SSWL1 is driven to a selected state in the 1 bit/1 cell mode. In the twin cell mode, this address bit AD0 is set at a degenerated state. Spare subdecode signals SSD<0> and SSD<1> are both driven to a selected state, and spare subword line SSWL0 and SSWL1 are both driven to a selected state, whereby the twin cell mode operation is carried out. The same applies for the pair of spare subword lines SSWL2 and SSWL3. Spare subdecode signals SSD<2> and SSD<3> are driven to a selected state according to address bit AD0.

Thus, when redundancy replacement is carried out in the unit of the pair of subword lines, the spare subword lines forming a pair are correctly driven to a selected state. Thus, defective bit replacement can be carried out correctly and the twin cell mode can be effected.

Modification 2

Figure 26:
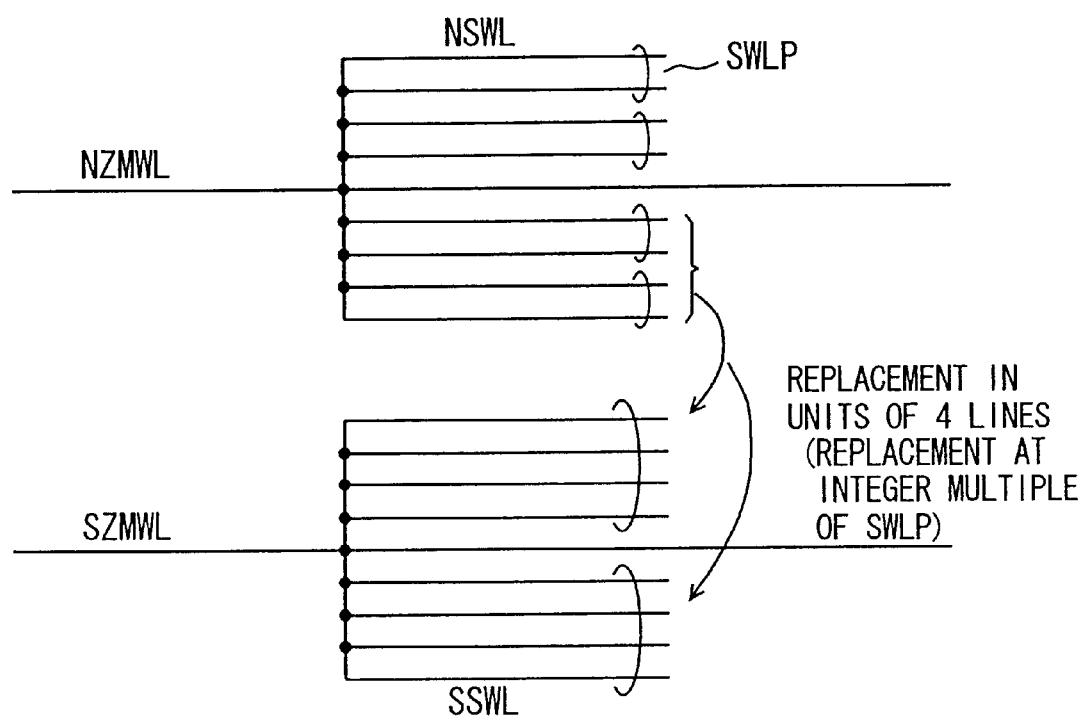

FIG. 26 schematically shows a structure of a modification 2 of the fourth embodiment. Referring to FIG. 26, eight normal subword lines NSWL are arranged with respect to normal main word line NZMWL. Similarly, eight spare subword lines SSWL are arranged with respect to spare main word line SZMWL. In a twin cell mode, a pair SWLP of normal subword lines NSWL is driven to a selected state at the same time. In this case, replacement with spare subword lines is effected for each four normal spare subword lines NSWL. Even in the case where redundancy replacement is effected for each four subword lines, the pair of spare subword lines selected simultaneously can be made corresponding to the pair of normal subword lines SWLP selected simultaneously, to allow correct defective bit repair.

As to the replacement in the unit of four subword lines, the structure shown in FIG. 25 can be employed. An address signal of 2 bits is applied to spare subdecoder 64. The remaining upper address bits are subjected to programming. In spare subdecoder 64, 4:1 decode operation is carried out in the 1 bit/1 cell mode and a 4:2 decode operation is carried out in the twin cell mode. Spare subword lines forming a pair are driven to a selected state simultaneously in the twin cell mode.

Generally, by carrying out redundancy replacement on spare subword lines of an integer multiple of the number of subword lines driven to a selected state at the same time in the twin cell mode, normal it can be prevented that subword lines forming a pair are replaced with spare subword lines of different pairs.

According to the fourth embodiment of the present invention, redundancy replacement is carried out in the unit of spare subword lines of a number corresponding to an integer multiple of the number of normal subword lines that are the unit in the twin cell mode. Accordingly, normal subword lines forming a pair can be prevented from being replaced with spare subword lines of different pairs, to allow defective bit repair to be carried out correctly even in the case where refresh characteristic deficiency is to be detected in the 1 bit/1 cell mode.

Fifth Embodiment

Figure 27:
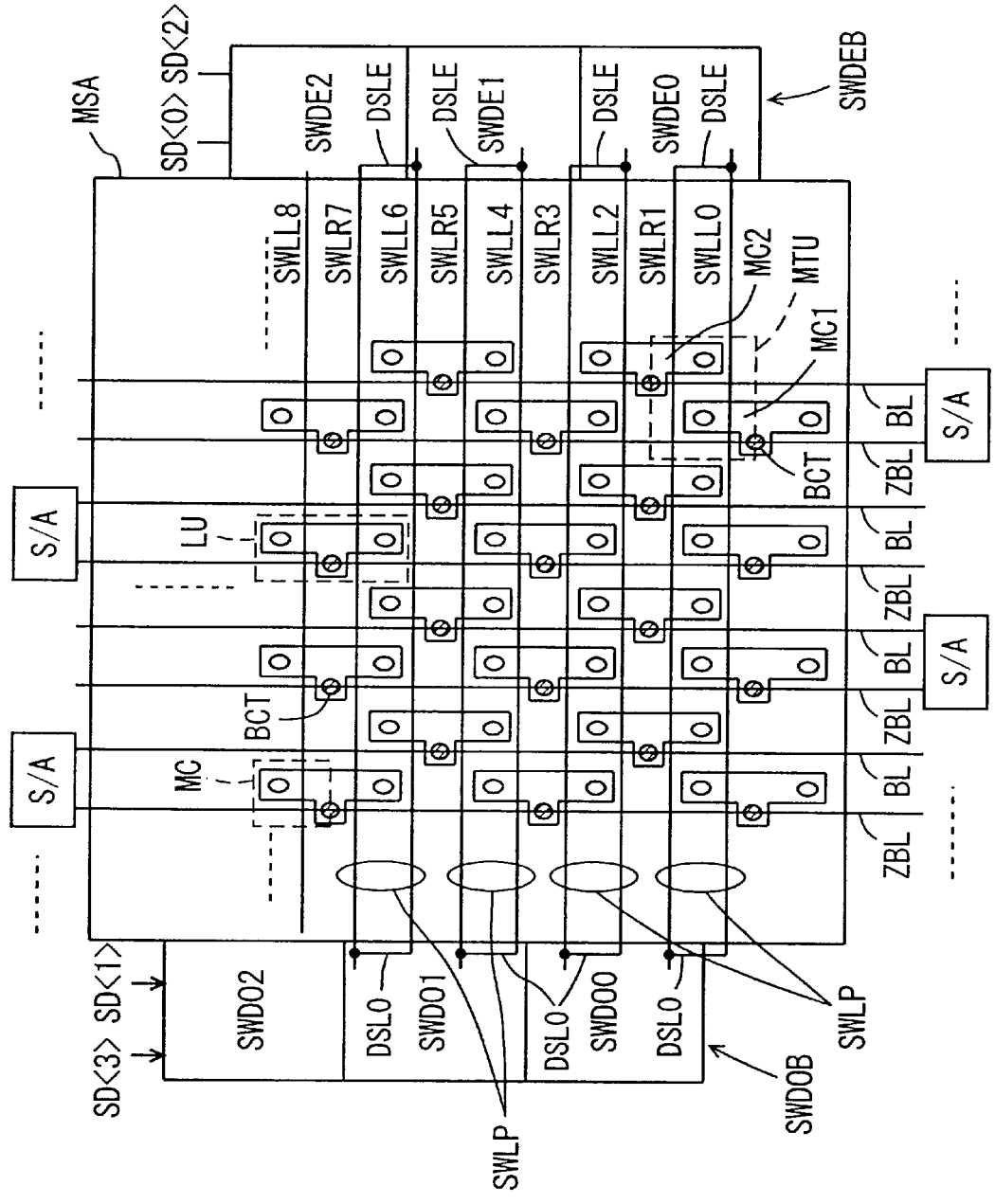
FIG. 27 schematically shows a structure of a main part of a semiconductor memory device according to a fifth embodiment of the present invention.

FIG. 27 shows a structure of a main part of semiconductor memory device according to a fifth embodiment of the present invention. Similar to the structure of FIG. 1, FIG. 27 represents a structure for a half pitch cell arrangement. Layout units LU each including two memory cells MC are connected alternately to bit lines BL and ZBL.

Subword line pair SWLP driven to a selected state at the same time in the twin cell mode is interconnected in the subword driver band using an interconnection layer identical to that of, for example, the subword line. Referring to FIG. 27, subword line pair SWLP is interconnected by a conductive line DSLE in subword driver band SWDEB. In odd number subword driver band SWDOB, subword line pair SWLP is interconnected by a conductive line DSLO. The remaining structure is identical to that shown in FIG. 1. Corresponding components have the same reference character allotted, and detailed description thereof will not be repeated.

In the structure of FIG. 27, subword line pair SWLP is driven by an even numbered subword driver SWDB and an odd numbered subword driver SWDO located at opposite sides. In subword line pair SWLP, the memory cell located at the center region is driven to a selected state at the slowest timing. When a subword line is driven with only the subword driver located at one side, the memory cell located farthest from the one subword driver is driven to a selected state at the slowest timing. In comparison to the structure where a subword line is driven by a subword driver located at one side, the time required for driving a row of memory cells connected to the subword line to a selected state can be made short enough, to make faster an operation start timing of a sense amplifier circuit.

Figure 28:
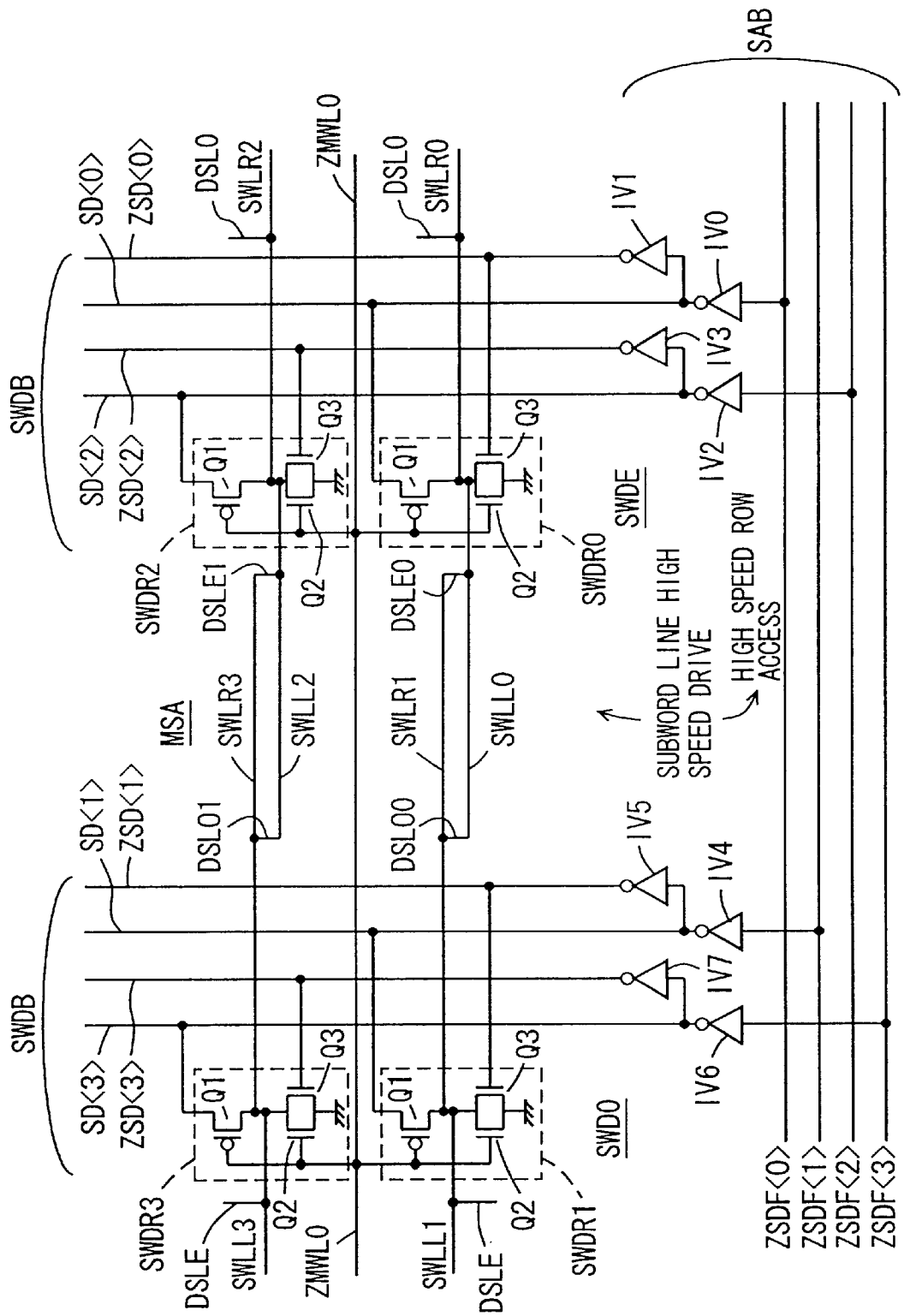
FIG. 28 shows in further detail a structure of the portion related to one set of subword lines of the semiconductor memory device of FIG. 27.

FIG. 28 shows a structure of the portion related to one subword line. The structure of FIG. 28 corresponds to the structure of FIG. 6. Referring to FIG. 28, subword lines SWLL0 and SWLR1 driven to a selected state simultaneously in the twin cell mode are interconnected by conductive lines DSLE0 and DSLO0 at opposite ends. Also, subword lines SWLL2 and SWLR3 are interconnected by conductive lines DSLE1 and DSLO1, at opposite ends. Even numbered subword line SWLL0 is driven by an even number subword line drive circuit SWDR0 whereas subword line SWLR1 is driven by an odd number subword line drive circuit SWDL1. In the twin cell mode, subword line drive circuits SWDR1 and SWDR0 are selected at the same time by subdecode fast signals ZSDF<0> and ZSDF<1>. Therefore, these subword lines SWLL0 and SWLR1 are driven to a selected state at the same time from both sides by subword line drive circuits SWDR0 and SWDR1.

Subword lines SWL2 and SWLR3 are interconnected by conductive lines DSLE1 and DSLO1 at both sides. In the twin cell mode, subword line drive circuits SWDR2 and SWDR3 are selected simultaneously by subdecode fast signals ZSDF<2> and ZSDF<3>. Therefore, subword lines SWL2 and SWLR3 are driven to a selected state simultaneously from both sides.

Similarly, other subword lines SWLL1 and SWLL3 are interconnected by conductive line DSLE in odd number subword driver pair SWDO to subword lines (SWLR0 and SWLR2) respectively as the paired subword lines. Also, subword lines SWLR0 and SWLR2 are interconnected with corresponding subword lines by conductive lines DSLO in an even number subword driver band SWDE. Therefore, both subword lines are driven to a selected state simultaneously by a subword line drive circuit provided at both sides, whereby the selected pair of subword lines is driven to a selected state at high speed. Increasing the speed of subword line selection causes the readout timing of the memory cell data onto the corresponding bit lines to be advanced, whereby the sense amplifier activation timing can be set faster. Accordingly, the ascertaining timing of the memory cell data can be advanced to increase the speed of row access.

When the paired subword lines are interconnected with an interconnection layer identical to that of the subword line, twin cell mode designation signal T_MODE_n is fixed at an L level. This is because the DRAM always operates in the twin cell mode. For operating in the 1 cell/1 bit mode as the general DRAM, conductive lines DSLO and DSLE are not provided, and all the subword lines are isolated. In this arrangement, twin cell mode designation signal T_MODE_n may be fixed at an H level, or the 1 cell/1 bit mode and twin cell mode may be selectively set by twin cell mode designation signal T_MODE_n shown in FIG. 28. In this twin cell structure, subword lines adjacent in the column direction are driven to a selected state simultaneously in the 4-way hierarchical word line structure. For the 8-way hierarchical word line structure, the subword lines selected at the same time are adjacent subword lines. By interconnecting both sides of these subword line pair with, for example, a first level metal interconnection line, a similar advantage can be obtained.

Sixth Embodiment

Figure 29:
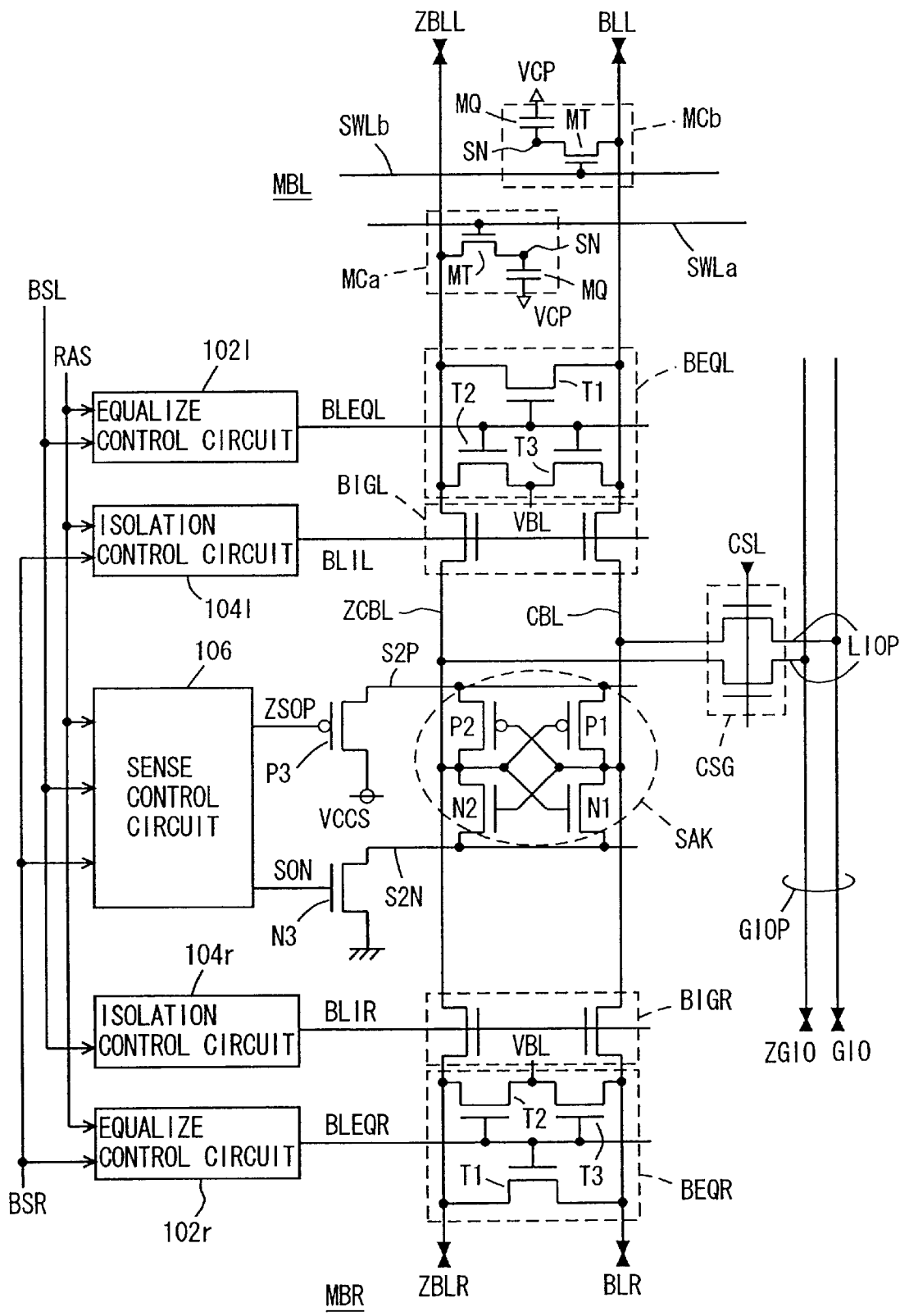
FIG. 29 schematically shows a structure of a main part of a semiconductor memory device according to a sixth embodiment of the present invention.

FIG. 29 schematically shows a structure of a main part of semiconductor memory device according to a sixth embodiment of the present invention. FIG. 29 shows a structure of the portion related to a sense amplifier SAK shared by the bit line pair of a memory block MBL (memory array MAL) and a memory block MBR (memory array MAR). Referring to FIG. 29, a bit line precharge/equalize circuit BEQL is provided in memory block MBL to precharge and equalize bit lines BLL and ZBLL to the level of precharge voltage VBL in response to a bit line equalize designation signal BLEQL from equalize control circuit 102l. A memory cell MCa is arranged corresponding to the crossing between bit line ZBLL and a subword line SWLa. A memory cell MCb is arranged corresponding to the crossing between a bit line BLL and a subword line SWLb. Memory cell MCa includes a memory cell capacitor MQ receiving cell plate voltage VCP at its cell plate electrode, and an access transistor MT connecting storage node SN of memory cell capacitor MQ to bit line ZBLL in response to the signal on subword line SWLa. Similarly, memory cell MCb includes a memory capacitor MQ receiving cell plate voltage VCP, and an access transistor MT coupling memory capacitor MQ with bit line BLL in response to the signal on subword line SWLb.

In memory block MBL, the memory cell stores data in the 1 bit/1 cell mode or 1 bit/2 cell mode (twin cell mode). In the twin cell mode, the pair of subword lines SWLa and SWLb are rendered active, whereby memory cells MCb an MCa are connected to bit lines BLL and ZBLL, respectively.

Bit line precharge/equalize circuit BEQL includes an equalizing N channel MOS transistor T1 rendered conductive in response to bit line equalize designation signal BLEQL to electrically short-circuit bit lines BLL and ZBLL, a precharging N channel MOS transistors T3 and T2 rendered conductive in response to bit line equalize designation signal BLEQL to transmit bit line precharge voltage VBL to bit lines BLL and ZBLL. Precharge voltage VBL is at the level of intermediate voltage VCCS/2 or array power supply voltage (sense power supply voltage) VCCS.

Bit lines BLL and ZBLL are coupled to common bit lines CBL and ZCBL via a bit line isolation gate BIGL. Bit line isolation gate BIGL is selectively rendered conductive/nonconductive in response to bit line isolation instructing signal BLIL from an isolation control circuit 104l.

A sense amplifier (sense amplifier transistors) SAK is provided for common bit lines CBL and ZCBL. Sense amplifier (sense amplifier transistors) SAK includes cross-coupled P channel MOS transistors P1 and P2, and cross-coupled N channel MOS transistors N1 and N2. For this sense amplifier (sense amplifier transistors) SAK, there are provided a sense drive P channel MOS transistor P3 rendered conductive in response to a sense amplifier activation signal ZSOP from sense control circuit 106 to transmit sense power supply voltage VCCS to a sense common power supply node S2P, and a sense drive N channel MOS transistor N3 rendered conductive in response to sense amplifier activation signal SON from sense control circuit 106 to transmit the ground voltage to a sense common ground node S2N. Sense amplifier (sense amplifier transistors) SAK is rendered active when sense common power supply node S2P and sense common ground node S2N attain the levels of sense power supply voltage VCCS and ground voltage GND, respectively, to amplify and latch the voltages of common bit lines CBL and ZCBL.

Common bit lines CBL and ZCBL are coupled to bit lines BLR and ZBLR of memory block MBR via bit line isolation gate BIGR. Bit line isolation gate BIGR is selectively rendered conductive/non-conductive in response to bit line isolation instructing signal BLIR from an isolation control circuit 104r. A bit line precharge/equalize circuit BEQR rendered active in response to bit line equalize designation signal BLEQR from equalize control circuit 102r is provided for bit lines BLR and ZBLR. Similar to bit line precharge/equalize circuit BEQL, this bit line precharge/equalize circuit BEQR includes equalizing N channel MOS transistor T1 and precharging N channel MOS transistors T2 and T3.

Common bit lines CBL and ZCBL are coupled to a local data line pair LIOP via a column select gate CSG rendered conductive in response to a column select signal CSL. This local data line pair LIOP is coupled to a global data line pair GIOP that is provided common to a plurality of memory blocks (memory array).

In the structure of FIG. 29, equalize control circuit 102l drives bit line equalize designation signal BLEQL in three values, H, L, and an intermediate level in response to an array activation signal RAS and a block select signal BSL. Isolation control circuit 104l drives bit line isolation instructing signal BLIL in two values, H and L according to a block select signal BSR and an array activation signal RAS. Sense control circuit 106 drives sense activation signals ZSOP and SON in two values according to array activation signal RAS and block select signals BSL and BSR. Isolation control circuit 104 drives bit line isolation instructing signal BLIR in two values according to block select signal BSL and array activation signal RAS. Equalize control circuit 102 drives bit line equalize designation signal BLEQR in three values according to array activation signal RAS and block select signal BSR.

Block select signals BSL and BSR specify memory blocks MBL and MBR, respectively. Array activation signal RAS is rendered active when a row access command is applied externally, and maintained at an active state (rendered inactive by application of a precharge command) during row selection in the semiconductor memory device.

Figure 30:
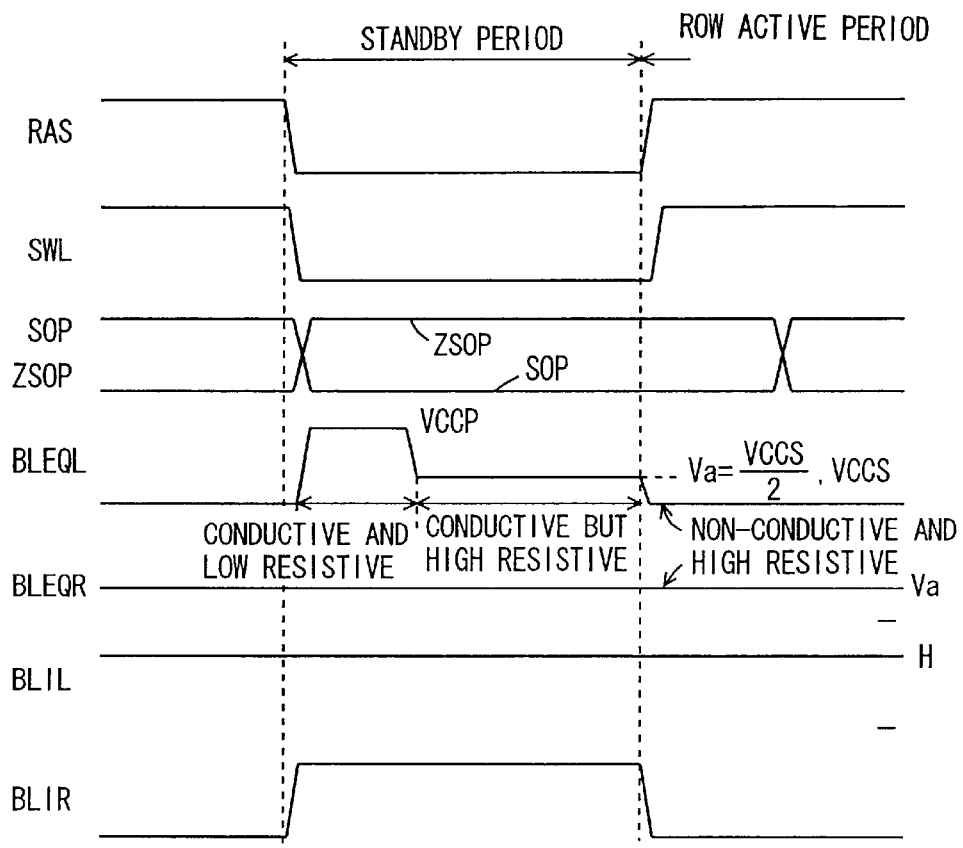
FIG. 30 is a signal waveform diagram representing an operation of the circuit of FIG. 29.

FIG. 30 is a signal waveform diagram representing an operation of the structure shown in FIG. 29. FIG. 30 represents the waveforms in the case where subword line SWL is selected in memory block MBL.

During the row active period where the addressed row is selected and maintained at the selected state, array activation signal RAS is in an active state of an H level, and also subword line SWL is in an active state. Here, sense amplifier activation signal SON is at an H level of periphery power supply voltage VCCP, and sense amplifier activation signal ZSOP is at the level of ground potential. Since subword line SWL is selected in memory block MBL, bit line equalize designation signal BLEQL is at the level of ground voltage, bit line precharge/equalize circuit BEQL at an inactive state, and MOS transistors T1–T3 are in an off state (high resistance, non-conductive state). Bit line isolation instructing signal BLIL is at an H level (Level of boosted voltage VPP) to connect bit lines BLL and ZBLL to common bit lines CBL and ZCBL.

Since memory block MBR is to be disconnected from sense amplifier SAK, bit line isolation instructing signal BLIR is at an L level, and bit line isolation gate BIGR is at a non-conductive state. In this state, bit line equalize designation signal BLEQR is at the level of an intermediate voltage (voltage Va) lower than that at an H level since memory block MBR maintains a precharged state. Therefore, MOS transistors T1–T3 of bit line precharge/equalize circuit BEQR are high resistive but conductive, and transmit, with their current supply ability restricted, precharge voltage VBL of the predetermined voltage level to bit lines BLR and ZBLR.

Upon completion of the row active period, array activation signal RAS is pulled down to an L level, which causes subword line SWL to be driven to a non-selected state. Then, sense amplifier activation signals SON and ZSOP from sense control circuit 106 are rendered inactive to attain an L level and an H level, respectively. In response to inactivation of array activation signal RAS, bit line equalize designation signal BLEQL is driven first to the level of periphery power supply voltage VCCP under control of equalize control circuit 102*l*, whereby bit line precharge/equalize circuit BEQL is rendered conductive. MOS transistors T1–T3 transmit precharge voltage VBL to bit lines BLL and ZBLL with a relatively great current supply ability. When bit lines BLL and ZBLL are precharge to the level of predetermined voltage VBL, bit line equalize designation signal BLEQL is reduced to the level of intermediate voltage Va. Intermediate voltage Va is at the level of VCCS/2 (when precharge voltage corresponds to the intermediate voltage level) or sense power supply voltage VCCS (when precharge voltage is at array power supply voltage level). In this state, the conductance of MOS transistors T1–T3 of bit line precharge/equalize circuit BEQL is reduced. MOS transistors T1–T3 attain a conductive state of high resistance, so that the current supply ability is degraded.

During this standby period, bit line isolation instructing signal BLIR is pulled up again to an H level. Common bit lines CBL and ZCBL are coupled to bit lines BLL, BLR and bit lines ZBLL and ZBLR, respectively. In this state, bit line precharge/equalize circuits BEQL and BEQR transmit precharge voltage VBL of a predetermined voltage level with the current supply ability reduced.

Array activation signal RAS is rendered active when the row active period starts again. When subword line SWL of memory block MBL is selected in this row active period, bit line equalize designation signal BLEQL attains an L level and bit line equalization designation signal BLIR attains the level of ground voltage. Bit line equalize designation signal BLEQR maintains the level of intermediate voltage Va.

When the memory block is in a standby state, bit line precharge/equalize circuit BEQ (BEQL, BEQR) is set to a conductive state of high resistance, so that the current supply ability is reduced. By reducing the current supply ability of this bit line precharge/equalize circuit so as to operate as the so-called "current limiter", current consumption caused by micro short-circuit or the like is reduced as will be described afterwards.

Figure 31:
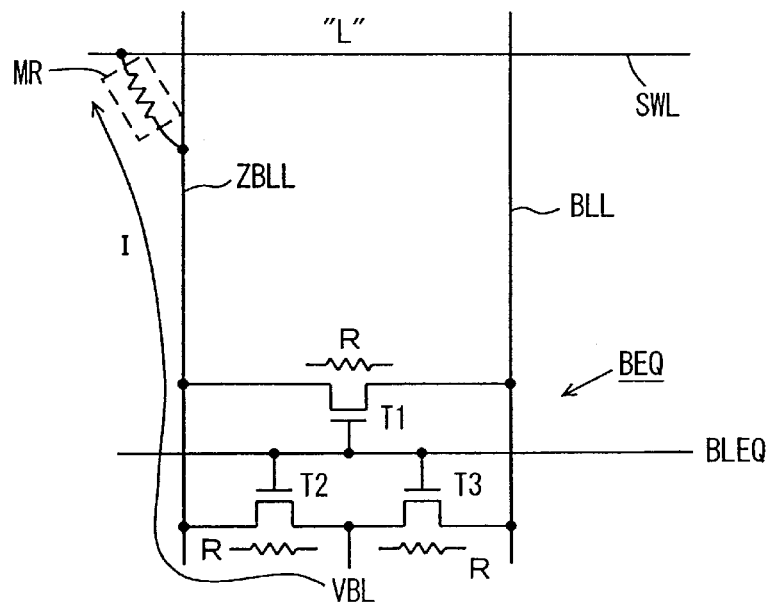
FIG. 31 schematically represents an operation of a bit line precharge/equalize circuit of the sixth embodiment.

The case will be considered where there is micro short-circuit MR between subword line SWL and bit line ZBLL due to contamination of a particle in a fabrication process or the like, as shown in FIG. 31. This micro short-circuit MR forms a current leakage path although high in resistance. This micro short-circuit MR only flows a small current through high resistance, and does not adversely affect the sense and latch operation of the sense amplifier in a row active period. The current flowing through micro short-circuit MR is so small that it will not affect current consumption in the row active period.

However, in a standby state, subword line SWL attains an L level, and bit lines BLL and ZBLL are precharged and equalized to the level of precharge voltage VBL by bit line precharge/equalize circuit BEQ (BEQL, BEQR). When there are many micro short-circuits MR, a small current flows to subword line SWL of a non-selected state via the plurality of micro short-circuits MR by bit line precharge/equalize circuit BEQ. The total flowing current will become large enough, resulting in an increased standby current. In the standby period, bit line equalize designation signal BLEQ is set at the level of intermediate voltage Va, and the channel resistance R of MOS transistors T1–T3 is increased so as to restrict the current flowing from the source of bit line precharge voltage VBL into subword line SWL via bit line BLL (ZBLL) and micro short-circuit MR. Accordingly, the leakage current during the standby period can be reduced by the current restriction function of MOS transistors T1 and T3 even in the presence of many micro short-circuits MR. Thus, increase of the standby current can be suppressed.

Even with an increased channel resistance R of MOS transistors T1–T3 of bit line precharge/equalize circuit BEQ, any deviation of the bit line precharge voltage from the predetermined level of, for example, sense power supply voltage (array power supply voltage) VCCS or intermediate voltage VCCS/2 caused by the leakage current through micro short-circuit MR will not adversely affect the sense operation when data is stored in the 1-bit/2 cell mode (twin cell mode) since complementary data are read out onto bit lines BLL and ZBLL. More specifically, even if the current drivability of bit line precharge/equalize circuit BEQ is reduced and the precharge voltage level of bit lines BLL and ZBLL deviates from the level of intermediate voltage VBL, the sense operation can be carried out correctly in the twin cell mode.

Figure 32:
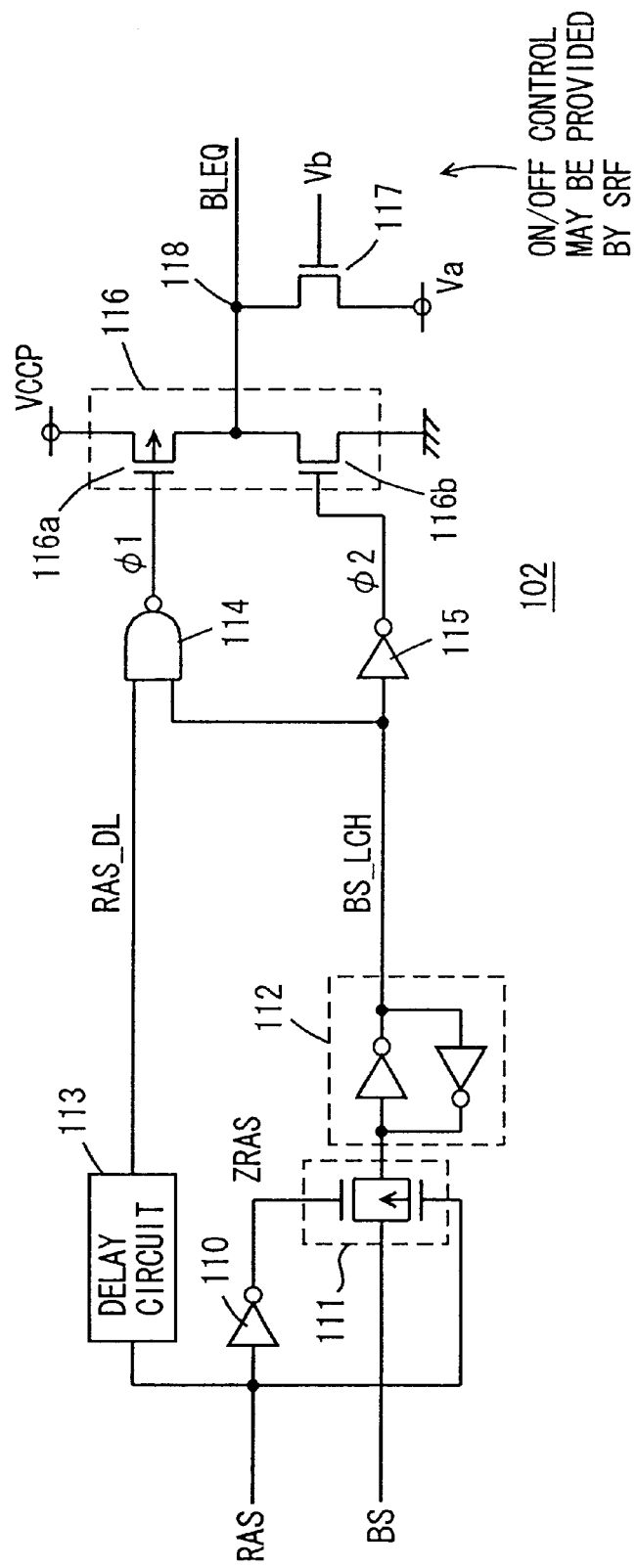
FIG. 32 shows a structure of an equalize control circuit of FIG. 29.

FIG. 32 shows a structure of equalize control circuits 102*l* and 102*r* of FIG. 29. Each of equalize control circuits 102*l* and 102*r* have the same internal structure, except that the applied block select signal differs. In FIG. 32, the structure of equalize control circuit 102 is indicated representatively.

Referring to FIG. 32, equalize control circuit 102 includes an inverter 110 inverting array activation signal RAS to generate a complementary array activation signal ZRAS, a CMOS transmission gate 111 passing through a block select signal BS according to array activation signals RAS and ZRAS, an inverter latch 112 latching block select signal BS applied via CMOS transmission gate 111, a delay circuit 113 delaying array activation signal RAS by a predetermined time, a NAND circuit 114 receiving a delay activation signal RAS_DL from delay circuit 113 and a latch block select signal BS_LCH from inverter latch 112, an inverter 115 receiving latch block select signal BS_LCH, a tristate inverter buffer 116 driving a node 118 in two values according to an output signal φ1 of NAND circuit 114 and an output signal φ2 of inverter circuit 115, and an N channel MOS transistor 117 to pull down the voltage of node 118 to the level of voltage Va.

Although delay circuit 113 is depicted as provided in equalize control circuit 102, delay circuit 113 may be provided at the central control circuit. Array activation signal RAS and block select signal BS are transmitted from the center control circuit arranged at a center to be delivered to the equalize control circuit provided corresponding to each sense amplifier band.

Tristate inverter buffer 116 includes a P channel MOS transistor 116a rendered conductive when the output signal from NAND circuit 114 is at an L level to charge node 118 to the level of periphery power supply voltage VCCP, and an N channel MOS transistor 116b discharging node 118 to the level of the ground voltage according to output signal φ2 from inverter 115.

Pull down MOS transistor 117 receives a constant voltage Vb at its gate. Constant voltage Vb corresponds to the level of sense power supply voltage VCCS or intermediate voltage VCCS/2. Voltage Va corresponds to the level of sense power supply voltage VCCS or intermediate voltage VCCS/2. Voltages Vb and Va satisfy the relationship of Vb≧Va. The current drivability of pull down MOS transistor 117 is set small enough, which is realized by increasing the ON resistance (channel resistance) or by reducing the size (ratio of channel width to channel length).

As described above, pull down MOS transistor 117 has a high channel resistance, or its current drivability set low enough as compared to MOS transistors 116a and 116b in tristate inverter buffer 116, and functions as a pull down element to pull down the voltage of node 118 to the level of voltage Va. The operation of equalize control circuit 102 of FIG. 32 will be described with reference to the signal waveform diagram of FIG. 33.

Figure 33:
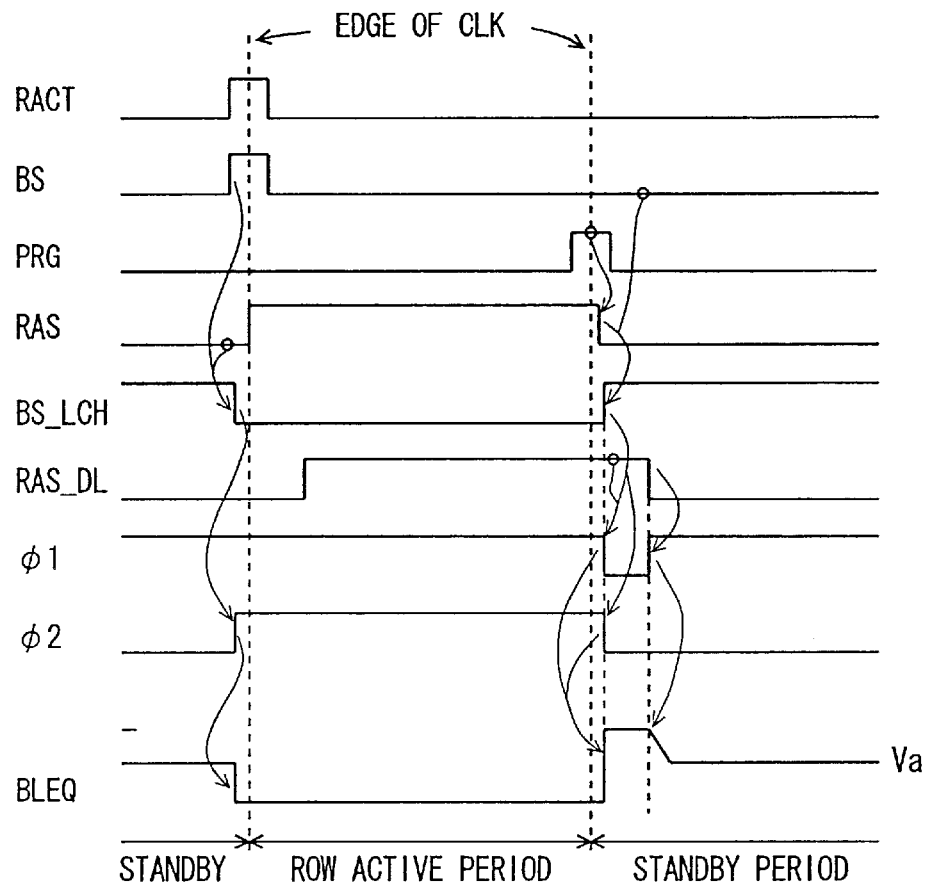
FIG. 33 is a signal waveform diagram representing an operation of the equalize control circuit of FIG. 32.

In FIG. 33, the rising edge of clock signal CLK is depicted by a broken line. Upon application of a row active command RACT designating memory cell row selection, a row address signal is also applied. Most significant bits of this row address signal are decoded asynchronously with clock signal CLK to drive block select signal BS to a selected state. In response to the rise of clock signal CLK, array activation signal RAS is rendered active according to row active command RACT. Prior to the rise of clock signal CLK, CMOS transmission gate 111 is at a conductive state to pass block select signal BS and inverter latch 112 latches this block select signal BS, whereby latched block select signal BS_LCH is pulled down to an L level. In response to the fall of latched block select signal BS_LCH, the signal φ2 from inverter 115 is pulled up to an H level. Since delayed activation signal RAS_DL from delay circuit 113 is at an L level, the signal φ1 from NAND circuit 114 is at an H level. In tristate inverter buffer 116, N channel MOS transistor 116b is on and P channel MOS transistor 116a is off, and bit line equalize designation signal BLEQ from node 118 is pulled down to an L level.

In response to array activation signal RAS attaining an H level at the rising edge of clock signal CLK, CMOS transmission gate 111 is rendered non-conductive, whereby latched block select signal BS_LCH is maintained at an L level. During this L level period of latched block select signal BS_LCH, the signal φ1 from NAND circuit 114 is at an H level and the signal φ2 from inverter circuit 115 is at an H level, whereby bit line equalize designation signal BLEQ maintains an L level. The current drivability of pull down MOS transistor 117 is smaller than that of N channel MOS transistor 116b, so that bit line equalize designation signal BLEQ is discharged to an L level at high speed.

In response to the application of precharge command PRG designating the end of row selection, array activation signal RAS is reset to be pulled down to an L level in the main control circuit. In response to the fall of array activation signal RAS to an L level, CMOS transmission gate 111 is rendered conductive. Latched block select signal BS_LCH is pulled up to an H level according to block select signal BS of an L level. Delayed activation signal RAS_DL from delay circuit 113 maintains an H level. Therefore, NAND circuit 114 outputs a signal φ1 of an L level. The signal φ2 from inverter 115 is driven to an L level in response to the rise of latched block select signal BS_LCH. Therefore, in tristate inverter buffer 116, P channel MOS transistor 116a is on and MOS transistor 116b is off, and node 118 is charged up to the level of periphery power supply voltage VCCP via MOS transistor 116a. Responsively, bit line equalize designation signal BLEQ is pulled up to the level of periphery power supply voltage VCCP.

At the elapse of the delay time of delay circuit 113, delayed activation signal RAS_DL attains an L level, whereby the output signal φ1 of NAND circuit 114 is driven to an H level, and tristate inverter buffer 116 attains an output high impedance state. Therefore, node 118 is discharged by pull down MOS transistor 117 and bit line equalize designation signal BLEQ attains the level of intermediate voltage Va.

By utilizing the structure of FIG. 32, bit line equalize designation signal BLEQ can be driven in three values. The bit line precharge/equalize circuit can be set to a conductive state of high resistance during the standby period.

By setting bit line equalize designation signal BLEQ at a conductive state of low resistance, the period required for precharging bit lines BLL and ZBLL to the level of intermediate voltage VBL is determined by the delay time of delay circuit 113. This period should have the time width of the so-called RAS precharge period, and accordingly the delay time of delay circuit 113 is to be determined appropriately according to the load of bit lines BLL and ZBLL, i.e., according to the time required to charge/discharge bit lines BLL and ZBLL to the intermediate voltage level.

When data is retained in the twin cell mode, self refresh designation signal SRF (self refresh mode designation signal SREF) can be applied to the gate of pull down MOS transistor 117. More specifically, the H level of self refresh designation signal SRF is set to correspond to the level of voltage Vb. In the normal access mode, bit line equalize designation signal BLEQ is driven in two states changing between the levels of H and L with pull down MOS transistor 117 turned off in high resistance. Although current consumption increases during the standby period in the normal operation mode where data is stored in the 1 bit/1 cell mode, the bit line can be precharged to a predetermined voltage level precisely.

Modification

Figure 34:
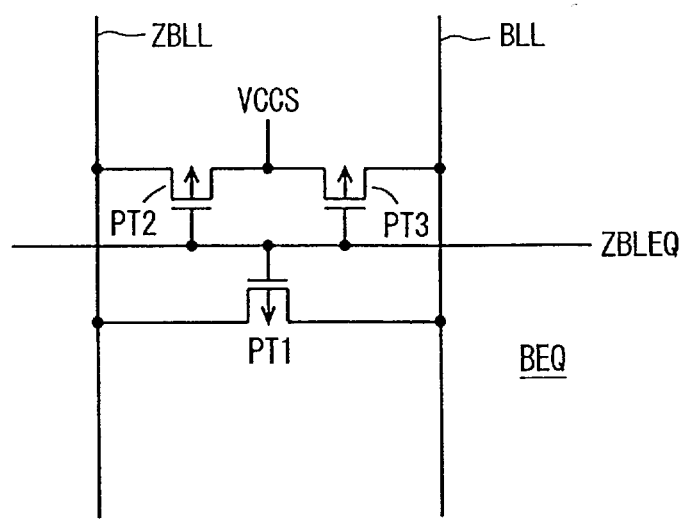
FIG. 34 shows a structure of a modification of a bit line precharge/equalize circuit of the sixth embodiment.

FIG. 34 shows a structure of a bit line precharge/equalize circuit according to a modification of the sixth embodiment. Referring to FIG. 34, bit line precharge/equalize circuit BEQ includes P channel MOS transistors PT1–PT3 rendered conductive when bit line equalize designation signal ZBLEQ is at an L level. MOS transistor PT1 electrically short-circuits bit lines BLL and ZBLL when conductive.

MOS transistors PT2 and PT3 transmit sense power supply voltage (array power supply voltage) VCCS to bit lines ZBLL and BLL when conductive.

According to the structure of bit line precharge/equalize circuit BEQ of FIG. 34, bit lines BLL and ZBLL are precharged and equalized to the level of sense power supply voltage (array power supply voltage) VCCS during the standby period. In the bit line VCCS precharging scheme, bit line precharge/equalize circuit BEQ is rendered conductive but high resistive in the standby period to reduce its current drivability, whereby the current from the array power source to bit lines BLL and ZBLL is restricted.

Figure 35:
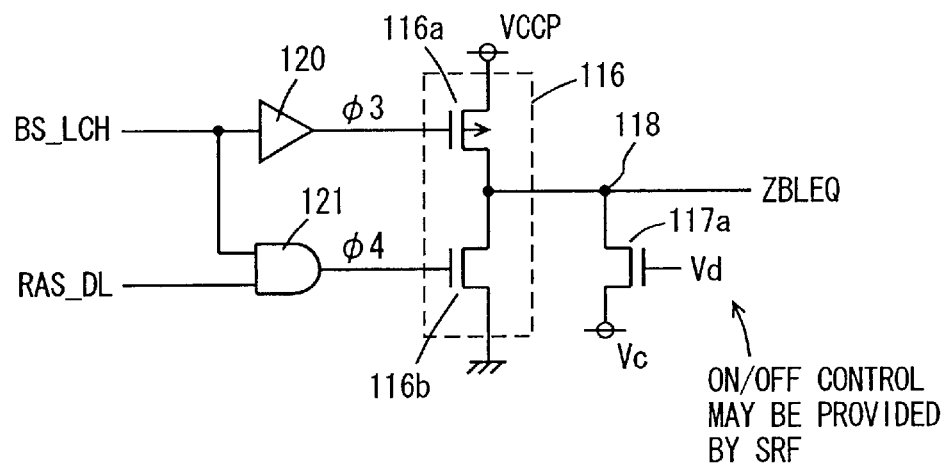
FIG. 35 shows a structure of a modification of an equalize control circuit of the sixth embodiment.

FIG. 35 shows the structure of a portion generating the bit line equalize designation signal shown in FIG. 34. Referring to FIG. 35, equalize control circuit 102 includes a buffer circuit 120 buffering latched block select signal BS_LCH to generate a control signal φ3, an AND circuit 121 receiving latched block select signal BS_LCH and delayed activation signal RAS_DL to generate a control signal φ4, a tristate inverter buffer 116 driving the node 118 to the level of periphery power supply voltage VCCP or ground voltage according to control signals φ3 and φ4, and a pull up N channel MOS transistor 117a for pulling up node 118 to the intermediate voltage level. MOS transistor 117a receives a voltage Vc at its drain and a voltage Vd at its gate. MOS transistor 117a has its current drivability set low sufficiently.

Bit line equalize designation signal ZBLEQ is at an L level of the ground voltage when active. The source node of MOS transistor 117a is connected to node 118. Therefore, even if the voltage Vc is at periphery power supply voltage VCCP, the voltage level of bit line equalize designation signal ZBLEQ can be set lower than periphery power supply voltage VCCP, as long as voltage Vd is at the level of array power supply voltage VCCS or intermediate voltage VCCS/2. Therefore, it is sufficient that the levels of the voltages Vc and Vd are determined appropriately according to the available voltage.

Tristate inverter buffer 116 includes a P channel MOS transistor 116a receiving control signal φ3 at a gate thereof, and an N channel MOS transistor 116b receiving control signal φ4 at a gate thereof Latched block select signal BS_LCH and delayed activation signal RAS_DL are generated by inverter latch 112 and delay circuit 113 shown in FIG. 32, respectively. The operation of the equalize control circuit of FIG. 35 will be described with reference to the signal waveform diagram of FIG. 36.

In the standby period, control signal φ3 is at an H level since latched block select signal BS_LCH is at an H level, and MOS transistor 116a maintains an off state. Control signal φ4 is at an L level since delayed activation signal RAS_DL is at an L level, and MOS transistor 116b is off. Therefore, tristate inverter buffer 116 is in an output high impedance state, and bit line equalize designation signal ZBLEQ is maintained at the intermediate voltage level determined by the relationship between the levels of voltages Vc and Vd by MOS transistor 117a.

Similar to the signal waveform of FIG. 33, latched block select signal BS_LCH for a selected memory block is pulled down to an L level in the active period. In response, control signal φ3 is driven to an L level, and bit line equalize designation signal ZBLEQ is pulled up to an H level (level of periphery power supply voltage VCCP). MOS transistors PT1–PT3 are all off. Control signal φ4 is maintained at the L level since latched block select signal BS_LCH is pulled down to an L level when selected. This state is maintained during the row active period. Delay activation signal RAS_DL is pulled up to an H level later than array activation signal RAS.

When the row active period ends and standby period starts, array activation signal RAS is pulled down to an L level according to precharge command PRG. In response, latched block select signal BS_LCH is pulled up to an H level. In response to the rise of latched block select signal BS_LCH to an H level, control signal φ3 is pulled up to an H level, and MOS transistor 116a is turned off. Delayed activation signal RAS_DL is at an H level, and control signal φ4 from AND circuit 112 is driven to an H level. MOS transistor 116b is turned on, whereby node 118 is discharged to the level of the ground voltage with a current drivability greater than that of MOS transistor 117a. More specifically, bit line equalize designation signal ZBLEQ is discharged to the level of the ground voltage, and MOS transistors PT1–PT3 shown in FIG. 30 are turned on. Bit lines BLL and ZBLL are precharged and equalized to the level of array power supply voltage VCCS.

In response to delayed activation signal RAS_DL driven to an L level, control signal φ4 from AND circuit 121 is pulled down to an L level, and MOS transistor 116b is turned off. Tristate inverter buffer 116 attains an output high impedance state. In this state, node 118 is pulled up to the level of the voltage determined by voltages Vc and Vd by MOS transistor 117a. Bit line equalize designation signal ZBLEQ is maintained at the intermediate voltage level (VCCS level or VCCS/2 level).

By setting the current drivability of pull up MOS transistor 117a sufficiently smaller than that of MOS transistors 116a and 116b, bit line equalize designation signal ZBLEQ can be driven to three states easily.

In this state, self refresh designation signal SRF may be applied to the gate of MOS transistor 117a, so that bit line equalize signal BLEQ is driven to three states only in the twin cell mode.

According to the sixth embodiment of the present invention, the bit line precharge/equalize circuit is driven into three states, and has its current drivability reduced by first attaining a conductive state of low resistance and then a conductive state of high resistance in the standby period. The leakage current in the standby state can be reduced to allow a smaller standby current even in the case where there are many micro short-circuits between the subword lines and the bit lines.

The embodiment of present invention is described with a bit line precharge/equalize circuit provided for each bit line pair. However, the bit line precharge/equalize circuit may be arranged adjacent to a sense amplifier circuit to be shared by adjacent bit line pairs.

Although the present invention addresses the presence of micro short-circuit between a subword line and a bit line, i.e., addresses a hierarchical word line structure, the sixth embodiment of the present invention is also applicable to a normal word line structure.

Seventh Embodiment

Figure 37:
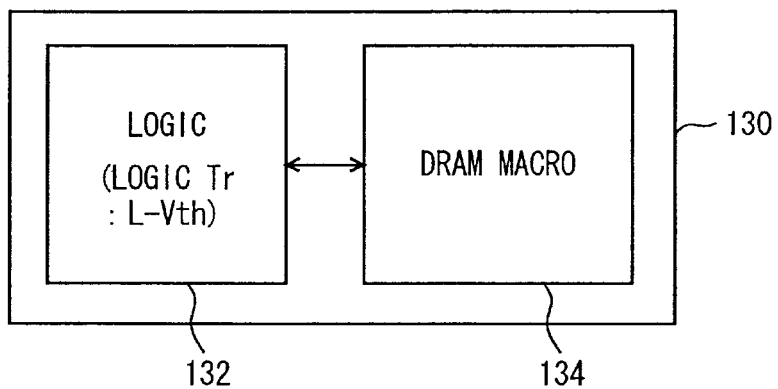
FIG. 37 schematically shows an entire structure of a semiconductor memory device according to a seventh embodiment of the present invention.

FIG. 37 schematically shows a structure of a semiconductor integrated circuit device including a semiconductor memory device according to a seventh embodiment of the present invention. Referring to FIG. 37, a semiconductor integrated circuit device 130 includes a logic 132 carrying out a predetermined process, and a DRAM macro 134 functioning as a main storage device or a working memory for logic 132. DRAM macro 134 has the structure of the semiconductor memory device described in any of the previous first to sixth embodiments. Since logic 132 operates at high speed, a MOS transistor forming the same is a low threshold voltage MOS transistor (L-Vth transistor) with a threshold voltage of small absolute value. In contrast, the memory cell transistor (access transistor) of DRAM macro 134 has the threshold voltage set greater than the absolute value of the threshold voltage of the logic transistor (Tr) which forms logic 132, since it receives the boosted voltage at a gate thereof, or has to reduce the subthreshold leakage current therethrough.

Figure 38:
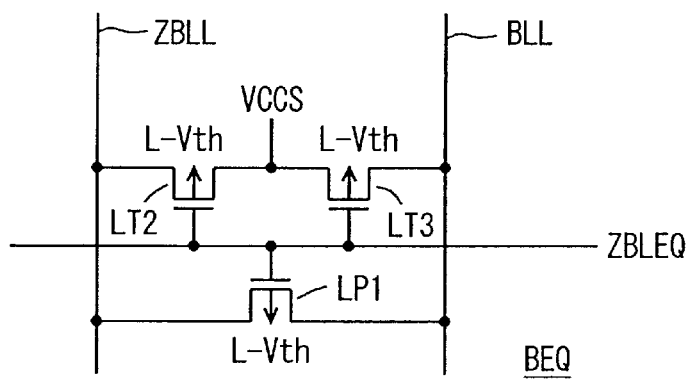
FIG. 38 shows a structure of a bit line precharge/equalize circuit according to a seventh embodiment of the present invention.

FIG. 38 shows a structure of a bit line precharge/equalize circuit according to a seventh embodiment of the present invention. Referring to FIG. 38, a bit line precharge/equalize circuit BEQ includes P channel MOS transistors LP1–LP3 of low threshold voltage rendered conductive in response to bit line equalize designation signal ZBLEQ. MOS transistors LP1–LP3 have a structure identical to that of the logic transistor. More specifically, MOS transistors LP1–LP3 have the same gate insulation film thickness and gate insulation film material as those of the logic transistor.

Figure 36:
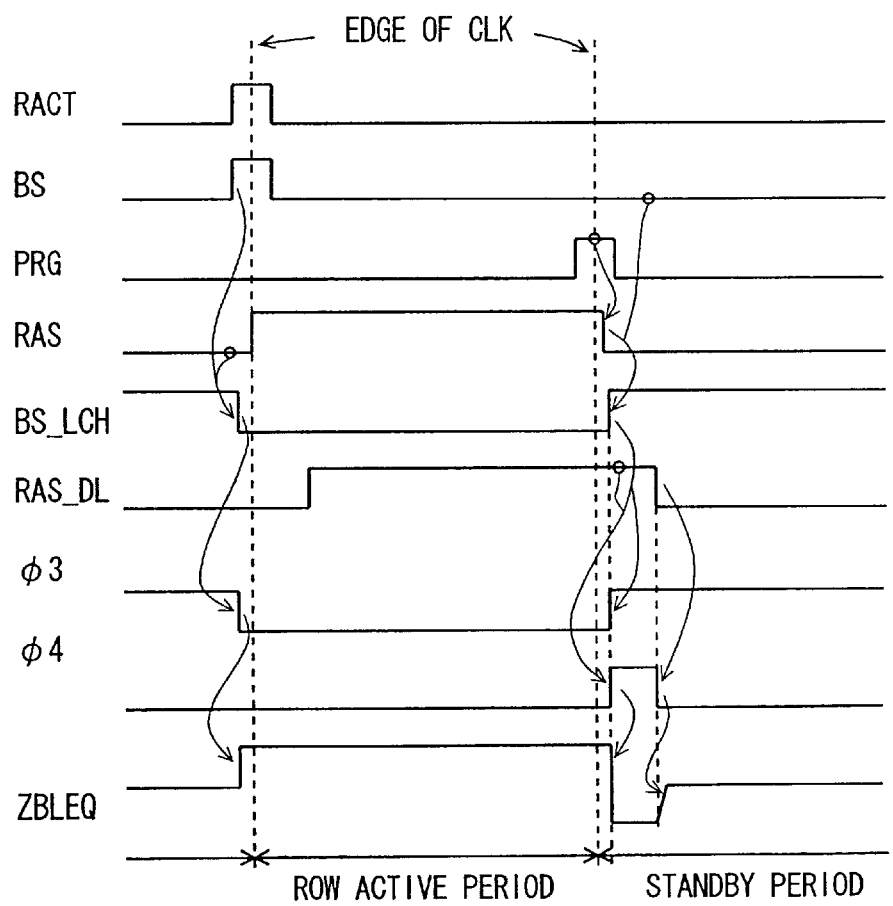
FIG. 36 is a signal waveform diagram representing an operation of an equalize control circuit of FIG. 35.

Bit line equalize designation signal ZBLEQ is driven into three states as shown in FIG. 36 with respect to bit line precharge/equalize circuit BEQ shown in FIG. 38. Therefore, bit lines BLL and ZBLL can be precharged and equalized to the level of array power supply voltage VCCS without the threshold voltage loss of MOS transistors LP1–LP3 even when array power supply voltage VCCS is at a low level. MOS transistors LP1–LP3 are low threshold voltage MOS transistors, and are turned on at high speed in response to activation of bit line equalize designation signal ZBLEQ, whereby bit lines BLL and ZBLL can be precharged to the level of array power supply voltage VCCS at high speed.

As the circuit for generating bit line equalize designation signal ZBLEQ shown in FIG. 38, the structure shown in FIG. 35 can be used. As apparent from the signal waveform diagram of FIG. 36, following the high speed precharging of bit lines BLL and ZBLL to the level of array power supply voltage VOCS with MOS transistors LP1–LP3 at an ON state in the transition to the standby state, MOS transistors LP1–LP3 are rendered conductive but high resistive by bit line equalize designation signal ZBLEQ of the intermediate voltage level, whereby the current drivability is reduced to restrict the current.

Modification

Figure 39:
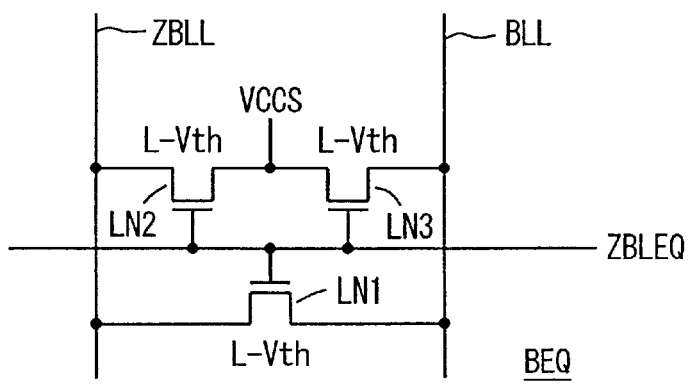
FIG. 39 shows a modification of the seventh embodiment.

FIG. 39 shows a structure of a modification of the seventh embodiment. Referring to FIG. 39, bit line precharge/equalize circuit BEQ includes low threshold voltage N channel MOS transistors LN1–LN3 rendered conductive in response to bit line equalize designation signal BLEQ. MOS transistor LN1 equalizes bit lines BLL and ZBLL when conductive, and MOS transistors LN2 and LN3 transmit array power supply voltage VCCS to bit lines ZBLL and BLL when conductive.

MOS transistors LN1–LN3 are formed of logic transistors having a low threshold voltage. Therefore, bit lines BLL and ZBLL can be precharged to the level of array power supply voltage VCCS reliably when MOS transistors LN1–LN3 are conductive as long as the voltage difference between array power supply voltage VCCS and periphery power supply voltage VCCP is at least the threshold voltage of MOS transistors LN1 and LN3. In this case, bit line equalize designation signal BLEQ needs not to be boosted. Bit lines BLL and ZBLL can be precharged/equalized utilizing array power supply voltage VCCS and periphery power supply voltage VCCP.

When the structure of FIG. 39 is employed, bit line precharge voltage VBL may be intermediate voltage VCCS/2.

According to the seventh embodiment of the present invention, the bit line precharge/equalize circuit is formed of transistors identical in structure to the logic transistor forming the logic integrated on the same substrate with the semiconductor memory device. Bit lines BLL and ZBLL can be precharged and equalized at high speed to a level of a predetermined voltage such as array power supply voltage VCCS without the threshold voltage loss.

Eighth Embodiment

Figure 40:
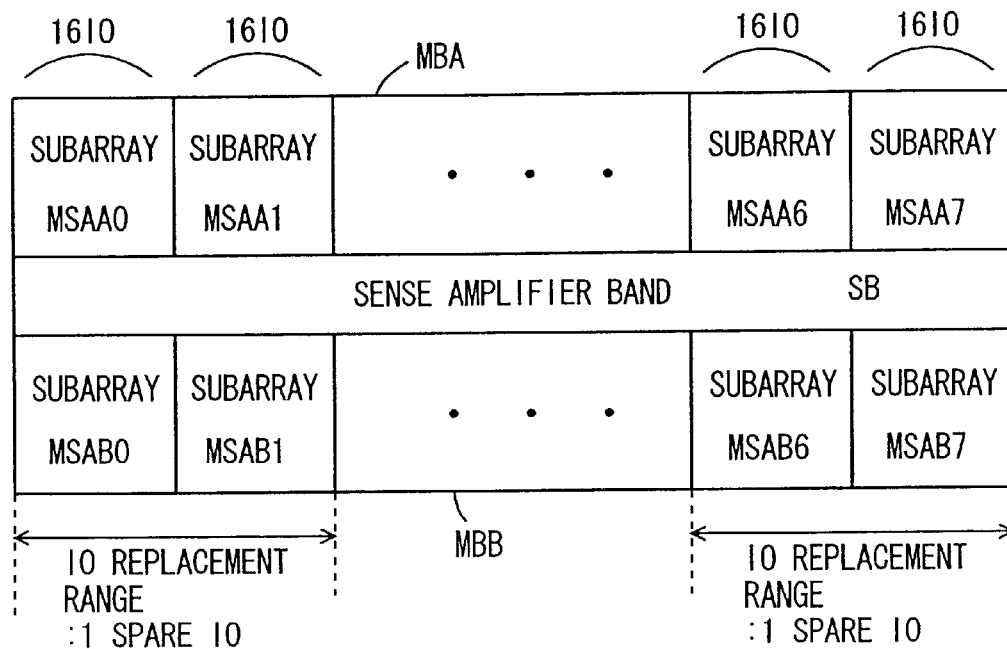
FIG. 40 schematically shows a structure of an array unit of a semiconductor memory device according to an eighth embodiment of the present invention.

FIG. 40 schematically shows a structure of a memory array portion according to an eighth embodiment of the present invention. In FIG. 40, memory blocks MBA and MBB share sense amplifier band SB. Memory block MBA is divided into eight subarrays MSAA0–MSAA7 whereas memory block MBB is divided into subarrays MSAB0–MSAB7. Subword lines are arranged in these subarrays.

According to the structure shown in FIG. 40, defective column repair is carried out by replacing of an internal data line pair (global data line pair). A defective column is repaired with two subarrays adjacent in the row direction being a replaceable range of one spare IO line pair (the range of defective column (defective IO line pair) repaired by one spare IO line pair). More specifically, one spare IO line pair is arranged with respect to subarrays MSAA0, MSAA1, MSAB0 and MSAB1. Similarly, one spare IO line pair is arranged with respect to subarrays MSAA6, MSAA7, MSAB6 and MSAB7. In a memory block, a defective column is repaired with two column blocks arranged in the column direction being the unit of repairing one defective column.

Figure 41:
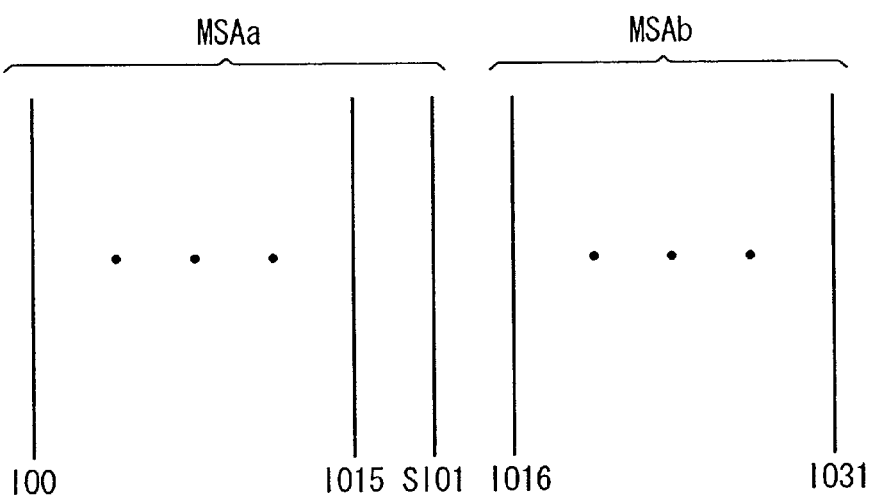
FIG. 41 schematically shows the relationship between a spare IO line pair and an IO line pair in the eighth embodiment.

FIG. 41 schematically shows the correspondence between an internal data line pair (IO line pair) and a spare data line pair. In FIG. 41, sixteen pairs of internal data lines are provided with respect to one memory subarray. Referring to FIG. 41, internal data line pairs (IO line pair) IO0–IO15 is arranged with respect to memory subarray MSAa. Internal data line pairs IO16–IO31 are arranged with respect to memory subarray MSAb. Also, a spare data line pair (spare IO line pair) SIO1 is arranged with respect to memory subarray MSAa. More specifically, one spare data line pair SIO1 is arranged with respect to thirty-two internal data line pairs IO0–IO31.

Figure 42:
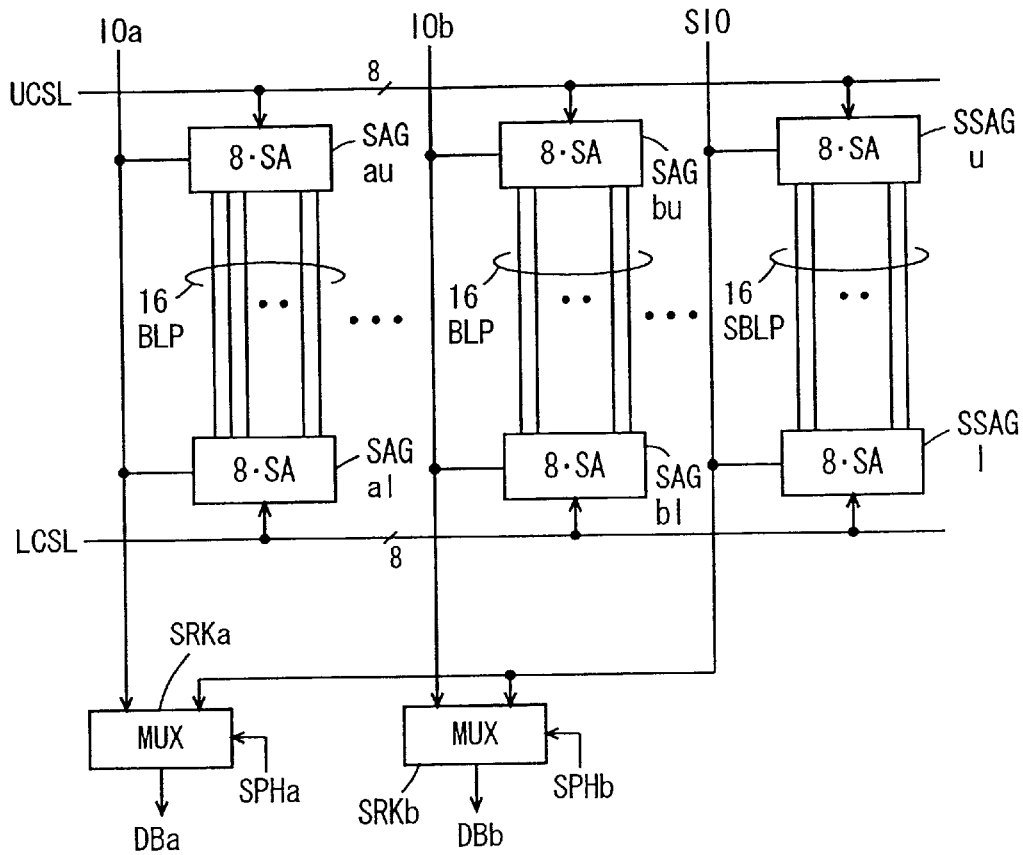
FIG. 42 schematically shows the structure of a defective column repairing unit of the eighth embodiment.

FIG. 42 schematically shows the correspondence between a spare column (spare bit line pair) and a normal column (normal bit line pair). In FIG. 42, internal data line pairs IOa and IOb and a spare data line pair SIO are depicted. Sense amplifiers SA are arranged alternately as shown in FIG. 1 in one memory subarray. Therefore, upper side sense amplifier group SAGau and lower side sense amplifier group SAGal are arranged at one memory subarray with respect to internal data line pair IOa. Upper side sense amplifier group SAGbu and lower side sense amplifier group SAGbl are arranged with respect to internal data line pair IOb.

These sense amplifier groups SAGau, SAGbu, SAGal and SAGbl each include eight sense amplifiers SA. Therefore, sixteen bit line pairs (BLP) are arranged with respect to one internal data line pair. An upper side spare sense amplifier group SSAGu and a lower side spare sense amplifier group SSAGl are arranged with respect to spare data line pair SIO.

Spare sense amplifier groups SSAGu and SSAGl each includes eight spare sense amplifiers. Therefore, sixteen spare bit line pairs (SBLP) are provided with respect to spare data line pair SIO.

An upper side column select signal UCSL of 8 bits is applied commonly to upper side sense amplifier groups SAGau, SAGbu and SSAGu. Also, a lower side column select signal LCSL of 8 bits is transmitted commonly to sense amplifier groups SAGal, SAGbl and SSAGl. Since column select signals UCSL and LCSL are transmitted along a direction identical to that of the word line, the spare sense amplifier and the normal sense amplifier are selected at the same time. Therefore, memory cell data is transmitted to spare data line pair SIO and normal internal data line pairs IOa and IOb.

To repair a defective column, a multiplexer (MUX) SRKa is provided with respect to an internal data line pair (simply referred to as "IO line pair" hereinafter) IOa, and a multiplexer SRKb is provided with respect to internal data line pair IOb. Multiplexer SRKa couples IO line pair IOa or spare IO line pair SIO with internal data line pair DBa according to a spare hit signal SPHa. Multiplexer SRKb couples either IO line pair IOb or spare IO line pair SIOb with internal data line pair DBb according to a spare hit signal SPHb. As to the generation of spare hit signals SPHa and SPHb, a defective column address is stored for each 32 IO line pairs in the unit of each memory block (memory array) to determine occurrence of access to a defective column in the unit of the 32 IO line pairs in column access.

In the case where there are many micro short-circuits in the subarray so that the bit line cannot be precharged/equalized properly to impede correct writing/reading of memory cell data, the defective column can be repaired by IO replacement. However, micro short-circuit is present within the semiconductor memory device, so that the standby current increases by the leakage current therethrough. In the present eighth embodiment, a clamp transistor for restricting the current of the bit line precharging voltage is provided for each eight bit line pairs that correspond to the defective repair unit.

Figure 43:
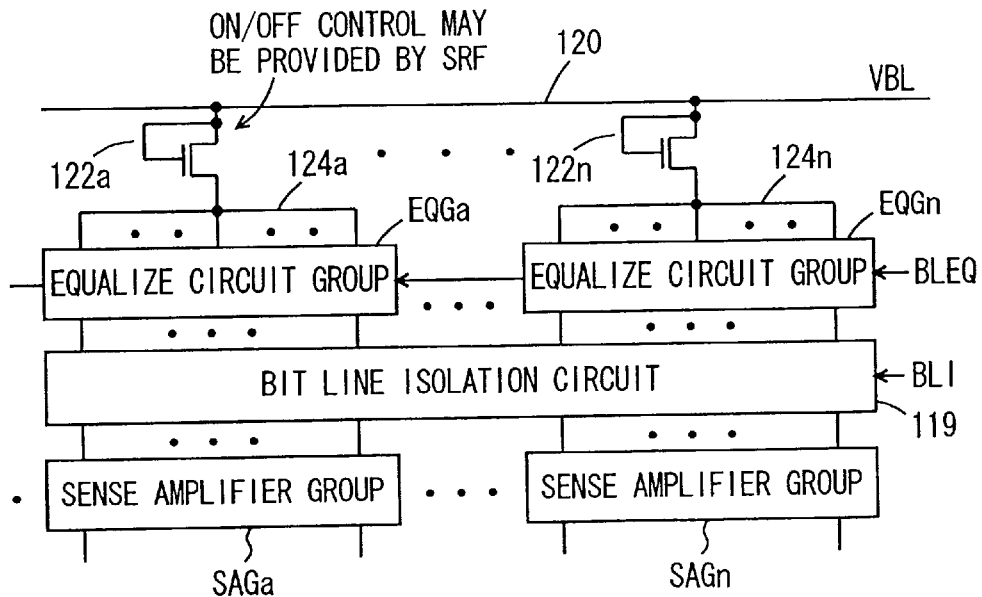
FIG. 43 schematically shows a structure of a main part of a semiconductor memory device of the eighth embodiment.

FIG. 43 schematically shows a structure of a sense amplifier band according to the eighth embodiment of the present invention. Referring to FIG. 43, sense amplifier groups SAGa–SAGn are arranged in the sense amplifier band. Sense amplifier groups SAGa–SAGn are coupled to equalize circuit groups EQGa–EQGn via a bit line isolation circuit 119. Each of sense amplifier groups SAGa–SAGn corresponds to the defective replacement unit, and includes eight sense amplifiers SA, for example. Equalize circuit groups EQGa–EQGn include equalize circuits arranged in a one-to-one correspondence with the sense amplifiers of sense amplifier groups SAGa–SAGn, and each includes eight equalize circuits, for example.

Subprecharge voltage lines 124a–124n are arranged corresponding to equalize circuit groups EQGa–EQGn, respectively. Each of subprecharge voltage lines 124a–124n are coupled to a main precharge voltage line 120 via clamp transistors 122a–122n. Each of clamp transistors 122a–122n is formed of resistance-connected N channel MOS transistor. Each of clamp transistors 122a–122n has its current drivability set low enough (ratio of channel width to channel length reduced, or channel resistance set high).

According to such a structure, clamp transistors 122a–122n are arranged corresponding to the defective column repair units. Even if a bit line failure occurs by micro short-circuit, the current through micro short-circuit can be restricted by a corresponding clamp transistor 122 (any of clamp transistors 122a–122n). Thus, increase in standby current caused by micro short-circuit can be suppressed even after a defective column is repaired.

Each of clamp transistors 122a–122n may be controlled to be turned on/off by a self refresh designation signal SRF in the structure of a FIG. 43.

Figure 44:
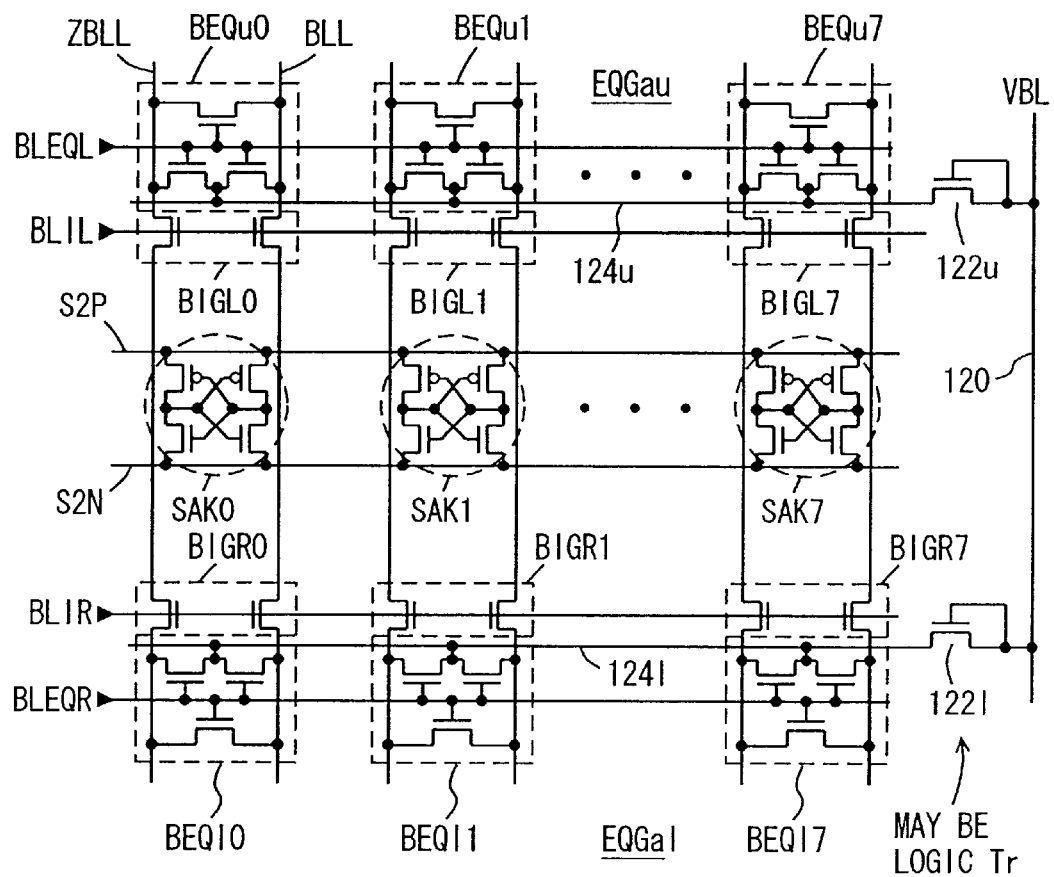
FIG. 44 shows, in more detail, the structure of the equalize circuit group of FIG. 43.

FIG. 44 shows an example of a structure of equalize circuit groups EQGa–EQGn. FIG. 44 shows a structure of an equalize circuit group corresponding to eight sense amplifiers SAK0–SAK7 which is the defective column repairing unit in one sense amplifier band. An equalize circuit group EQGau is arranged at one memory block whereas an equalize circuit group EQGal is arranged at the other memory block. Equalize circuit group EQGau includes equalize circuits BEQu0–BEQu7 coupled to sense amplifiers SAK0–SAK7, respectively, via bit line isolation gates BIGL0–BIGL7, respectively. A subprecharge voltage line 124u is arranged commonly to equalize circuits BEQu0–BEQu7. Subprecharge voltage line 124u is coupled to main precharge voltage line 120 via clamp transistor 122u. Subprecharge voltage line 124u is coupled to precharge MOS transistors of bit line precharge/equalize circuits BEQu0–BEQu7.

Equalize circuit group EQGal includes bit line precharge/equalize circuits BEQ10–BEQ17 coupled to sense amplifiers SAK0–SAK7 via bit line isolation gates BIGR0–BIGR7, respectively. A subprecharge voltage line 124l is arranged in common to bit line precharge/equalize circuits BEQ10–BEQ17. Subprecharge voltage line 124l is coupled common to the precharge transistors of bit line precharge/equalize circuits BEQ10–BEQ17. Subprecharge voltage line 124l is coupled to main precharge voltage line 120 via clamp transistor 122l.

Sense amplifiers SAK0–SAK7 are commonly coupled to sense common power supply line (node) S2P and a sense common ground line (node) S2N.

Clamp transistors 122u and 122l have their gates coupled to main precharge voltage line 120. Clamp transistors 122u and 122l have the ratio of the channel width to channel length reduced or the channel resistance increased to have their current drivability set low enough. By adjusting the supply current of the bit line precharge voltage in the defective column repairing unit, the current in the standby state can be restricted even if there are many micro short-circuits in the defective memory subarray with many defective bit lines. Therefore, the consumed standby current can be reduced.

Even if the current drivability of clamp transistors 122u and 122l is reduced, the charge of the bit line of an H level is transmitted to the bit line of an L level by the bit line equalize operation, so that clamp transistors 122u and 122l are required only to suppress reduction of the bit line precharge voltage by the leakage current. Thus, there is particularly no adverse effect on the precharge/equalize operation.

In the structure shown in FIGS. 43 and 44, such an alternative may be employed. That is, clamp transistors 122a–122n and 122u and 122l have their gates held at the level of the ground voltage, to compensate for a small current flowing through the micro short-circuit by the subthreshold leakage current. In this case, the clamp transistor may be formed of the logic transistor as in the previous seventh embodiment.

An N channel MOS transistor is used as the clamp transistor. However, a P channel MOS transistor can be also used. The gate of the P channel MOS transistor is fixed at the level of the array power supply voltage or periphery power supply voltage, so that the current flowing through the micro short-circuit is compensated for by the subthreshold leakage current.

In the foregoing, the clamp transistor is described as to be arranged corresponding to the defective column replacing unit. However, the clamp transistor may be provided corresponding to a predetermined number of bit line precharge/ equalize circuits. For example, the clamp transistor may be arranged for each memory block or for each memory subarray.

In the case utilizing the off leak current (subthreshold current), the clamp transistor for restricting the current may be formed of the logic transistor (for the case where any of NMOS and PMOS transistors is used).

As in the previous sixth or seventh embodiment, bit line equalize designation signals BLEQL and BLEQR may be driven into three states. Also, the leakage current in micro short-circuit can be reduced. Furthermore, bit line equalize designation signals BLEQL and BLEQR may be driven into two states.

The defective column replace unit is not limited to 16 1sense amplifiers.

According to the eighth embodiment, a clamp transistor is provided for each predetermined number of bit line precharge/equalize circuits, and precharge voltage VBL is transmitted through this clamp transistor. Even in the case where there are many micro short-circuits, the leakage current can be suppressed by the current restricting function of the clamp transistor, whereby increase of the standby current can be suppressed.

Ninth Embodiment

Figure 45:
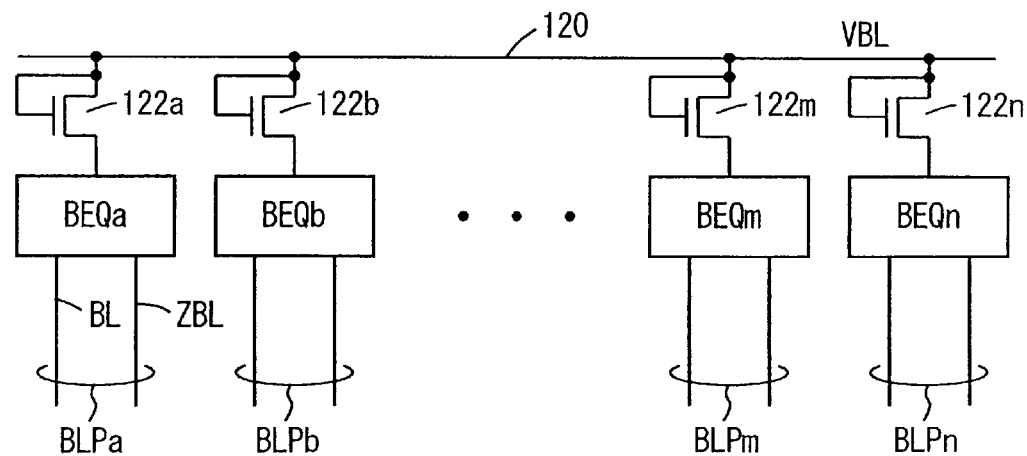
FIG. 45 schematically shows a structure of an equalize control unit according to a ninth embodiment of the present invention.

FIG. 45 schematically shows a structure of the bit line equalize unit of a semiconductor memory device according to a ninth embodiment of the present invention. In FIG. 45, bit line precharge/equalize circuits BEQa–BEQn are arranged corresponding to bit line pairs BLPa–BLPn, respectively. Each of bit line pairs BLPa–BLPn includes bit lines BLL and ZBLL.

Clamp transistors 122a–122n are arranged corresponding to bit line precharge/equalize circuits BEQa–BEQn, respectively. Clamp transistors 122a–122n transmit a precharge voltage VBL on main precharge voltage line 120 to corresponding bit line precharge/equalize circuits BEQa–BEQn. Clamp transistors 122a–122n have their gates coupled to main precharge voltage line 120 to operate in the resistance mode. Clamp transistors 122a–122n have their size (ratio of channel width to channel length) reduced or the on resistance (channel resistance) set high enough so that the current drivability thereof is rendered low enough.

By arranging clamp transistors 122a–122n corresponding to bit line precharge/equalize circuits BEQa–BEQn, respectively, as shown in FIG. 45, leakage current from main precharge voltage line 120 to a non-selected subword line can be suppressed even if there is a micro short-circuit between the corresponding bit line pair and the subword line. Therefore, the standby current can be reduced.

Figure 46:
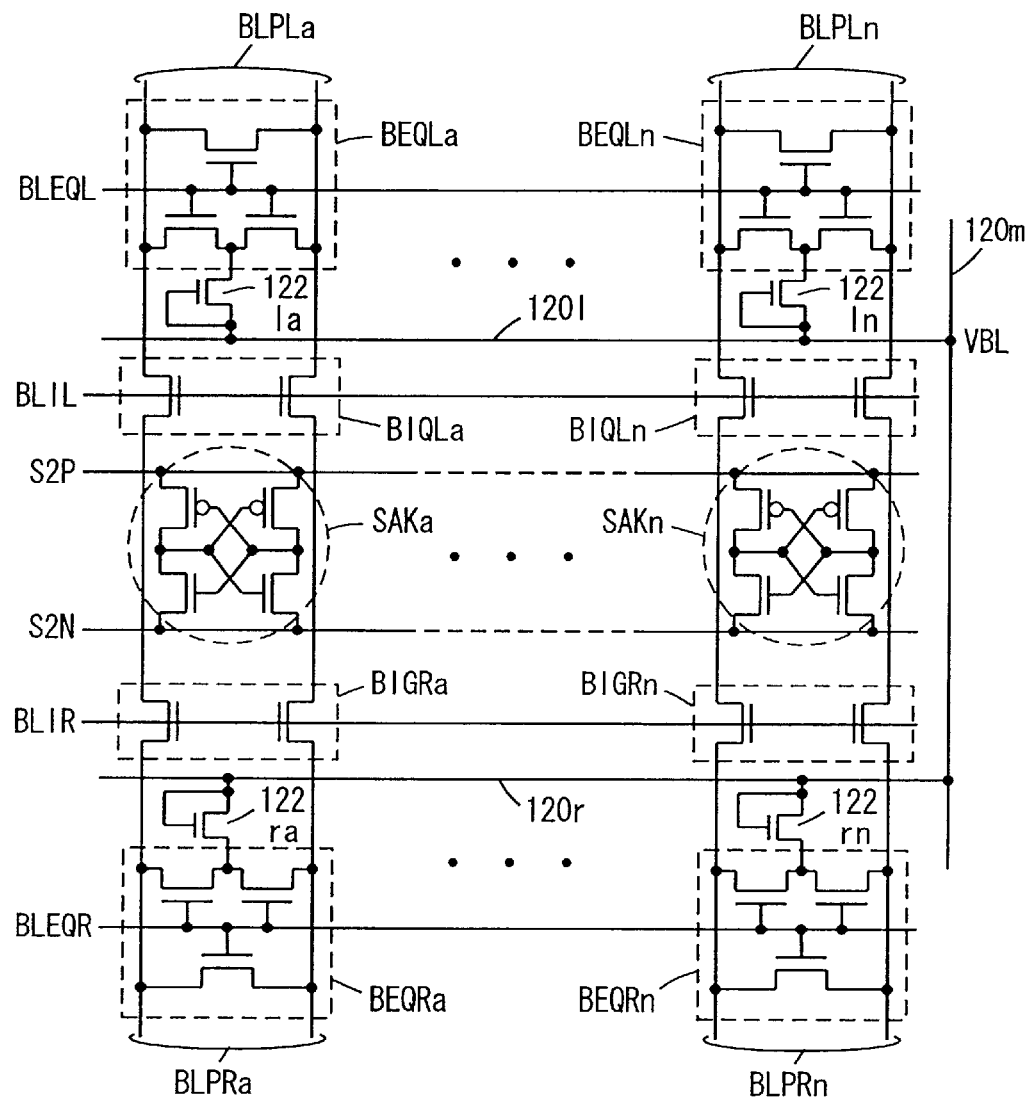
FIG. 46 shows, in further detail, the structure of the equalize circuit of the ninth embodiment.

FIG. 46 specifically shows a structure of the equalize circuit unit of the ninth embodiment. Referring to FIG. 46, sense amplifiers SAKa–SAKn are arranged in a sense amplifier band. Sense common power supply node (line) S2P and sense common ground node (line) S2N are arranged commonly to sense amplifiers SAKa–SAKn. Sense common power supply node (line) S2P and sense common ground node (line) S2N are provided for each predetermined number of sense amplifiers. Sense common power supply line (node) S2P and sense common ground line (node) S2N are connected to the sense power supply line and sense ground line via a sense amplifier drive transistor. These sense drive transistors are provided for each predetermined number of sense amplifiers.

Bit line precharge/equalize circuits BEQLa–BEQLn are arranged corresponding to sense amplifiers SAKa–SAKn, respectively. Bit line precharge/equalize circuits BEQLa––BEQLn precharge corresponding bit line pairs BLPLa–BLPLn to the level of precharge voltage VBL in response to bit line equalize designation signal BLEQL. Clamp transistors 122la–122ln are arranged corresponding to bit line precharge/equalize circuits BEQLa–BEQRn, respectively.

Clamp transistors 122la–122ln are coupled parallel to local precharge voltage line 120l, and have respective gates connected to local precharge line 120l to supply precharge voltage VBL to bit line precharge/equalize circuits BEQLa–BEQRn, respectively. Local precharge voltage line 120l is coupled to main precharge voltage line 120m. Bit line precharge/equalize circuits BEQLa–BEQLn are coupled to sense amplifiers SAKa–SAKn via bit line isolation gates BIGLa–BIGLn, respectively, in response to bit line isolation instructing signal BLIL.

As to other memory blocks, bit line precharge/equalize circuits BEQRa–BEQRn are arranged corresponding to bit line pairs BLPRa–BLPRn, respectively, in these other memory blocks. Clamp transistors 122ra–122rn are arranged corresponding to bit line precharge/equalize circuits BEQRa–BEQRn, respectively. Clamp transistors 122ra–122rn are coupled to local precharge voltage line 120r and have respective gates connected to the local precharge voltage line to operate in the resistance mode to supply precharge voltage VBL from local precharge voltage line 120r to corresponding bit line precharge/equalize circuits BEQRa–BEQRn. Local precharge voltage line 120r is also coupled to main precharge voltage line 120m. Main precharge voltage line 120m is provided commonly to a plurality of memory blocks. Each of local precharge voltage lines 120l and 120r are arranged extending in the row direction for each memory block to supply precharge voltage VBL to a corresponding bit line precharge/equalize circuit.

Clamp transistors 122la–122ln have their gates coupled to local precharge voltage line 120l to supply precharge voltage VBL to the precharge transistors of bit line precharge/ equalize circuits BEQLa–BEQLn. Similarly, clamp transistors 122ra–122rn have their gates coupled to local precharge voltage line 120r to supply bit line precharge voltage VBL to the precharge transistors in corresponding bit line precharge/equalize circuits BEQRa–BEQRn.

Therefore, the leakage current caused by micro short-circuit between a bit line and a subword line can be suppressed reliably by the provision of a clamp transistor for every bit line pair.

Modification

Figure 47A:
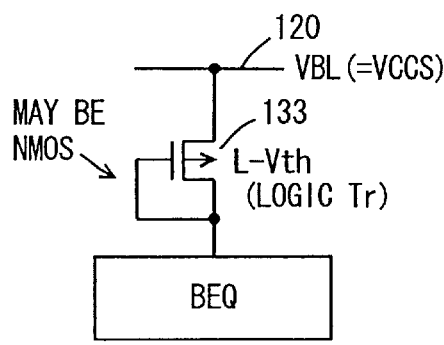
FIGS. 47A and 47B show modifications of the ninth embodiment, respectively.

FIG. 47A schematically shows a structure of a modification of the ninth embodiment. In FIG. 47A, a clamp transistor 133 between the bit line precharge/equalize circuit BEQ and main precharge voltage line 120 is formed of an MOS transistor of a low threshold voltage (L–Vth). Clamp transistor 133 is formed, for example, of the logic transistor.

When precharge voltage VBL is supplied to bit line precharge/equalize circuit BEQ, bit line precharge/equalized voltage VBL is transmitted to a corresponding bit line precharge/equalize circuit BEQ with the voltage drop caused by threshold voltage loss minimized.

Clamp transistor 133 of FIG. 47A is formed of a P channel MOS transistor, and operates in a resistance mode with the current supply ability thereof set small enough. Clamp transistor 133 may be formed of an NMOS transistor of a structure identical to that of transistor of the logic circuit.

Modification 2

Figure 47B:
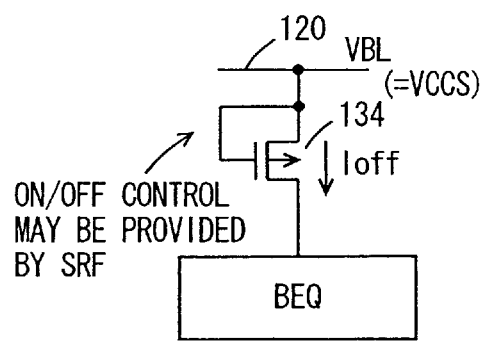

FIG. 47B schematically shows the structure of a second modification of the ninth embodiment. Referring to FIG. 47B, a P channel MOS transistor 134 is employed as a clamp transistor for supplying the precharge voltage VBL to a corresponding bit line precharge/equalize circuit BEQ from main precharge voltage line 120. In FIG. 47B, P channel MOS transistor 134 having its gate connected to main (local) precharge line voltage line 120 is used as the clamp transistor. Therefore, the clamp transistor 134 is always in an off state, to transmit precharge voltage VBL to bit line precharge/equalize circuit BEQ by off leak current (subthreshold current) Ioff.

Clamp transistor 134 formed of a P channel MOS transistor shown in FIG. 47B may be formed of the logic transistor.

In the eighth and ninth embodiments, bit line precharge voltage VBL may is at the voltage level of intermediate voltage VCCS/2 or sense power supply voltage (array power supply voltage) VCCS.

According to the structure shown in FIG. 47A, a PMOS transistor is used as clamp transistor 133. However, an N channel MOS transistor can be used instead as the clamp transistor. In this case, the NMOS transistor has its gate connected to main precharge voltage line 120. Alternatively, the gate of such NMOS clamp transistor may be connected to the precharge transistor of bit line precharge/equalize circuit BEQ to supply bit line precharge voltage VBL by the off leak current of the NMOS clamp transistor.

Self refresh designation signal SRF may be applied to the gate of these clamp transistors to reduce the current drivability of these clamp transistors in the twin cell mode.

Since a clamp transistor for restricting the current is provided in each bit line precharge/equalize circuit, leakage current flowing through micro short-circuit, if any, between the bit line and subword line, can be suppressed to prevent increase of the standby current.

In the ninth embodiment, bit line equalize designation signal BLEQ (BEQL, BEQR) may be driven in three values or in two values. In the case where a clamp transistor for restricting the current is provided for each bit line pair, a sense operation can be carried out adequately even if the bit line precharge voltage is deviated from the intermediate voltage level, although the precharge voltage supply is slightly slowed down. Even in this case, refresh can be carried out correctly in the data retaining mode.

Tenth Embodiment

Figure 48:
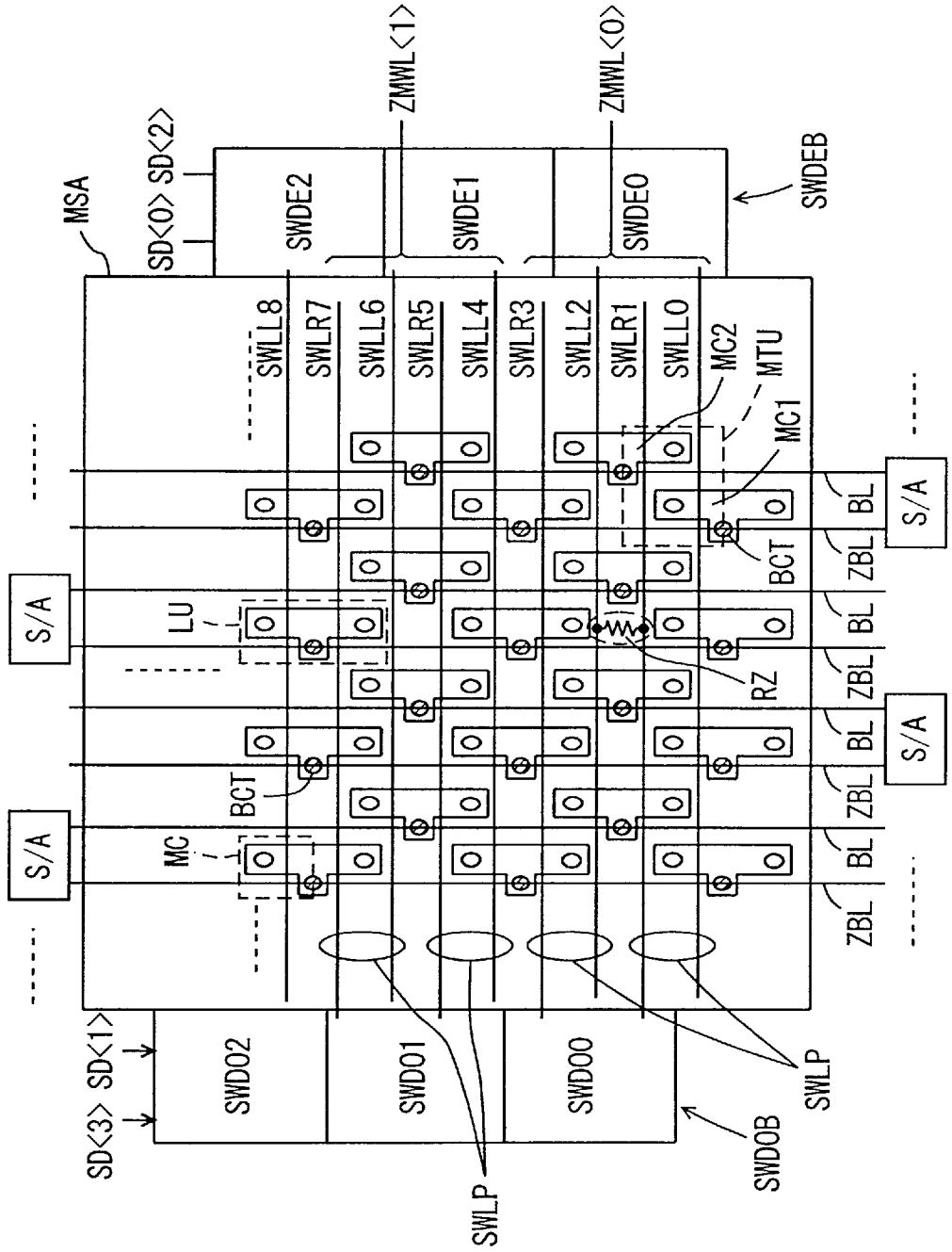
FIG. 48 shows the arrangement of a memory subarray and short-circuit according to a tenth embodiment of the present invention.

FIG. 48 shows a structure of a memory subarray MSA. In FIG. 48, memory cell MC is arranged according to the "half pitch cell" arrangement. The structure of memory subarray MSA of FIG. 48 is identical to that shown in FIG. 1. Corresponding components have the same reference characters allotted, and detailed description thereof will not be repeated. Corresponding to subword lines SWLL0, SWLR1, SWLL2 and SWLR3, a main word line ZMWL<0> is arranged. Corresponding to subword lines SWLL4, SWLR5, SWLL6 and SWLR7, main word line ZMWL<1> is arranged.

Consider the case where there is a subword line short-circuit RZ between subword lines SWLR1 and SWLL2. In a twin cell mode, subword line SWLR1 is driven to a selected state simultaneously with subword line SWLL0. Subword line SWLL2 is driven to a selected state simultaneously with subword line SWLR3. In the previous structure of the redundancy replacement described with reference to FIG. 25, redundancy replacement for defect repairing is carried out in a unit of subword line pair SWLP driven to a selected state at the same time. In this case, all the four subword lines SWLL0, SWLR1, SWLL2 and SWLR3 arranged corresponding to main word line ZMWL<0> are replaced with spare subword lines by subword line short-circuit RZ. The structure of repairing such a defect between subword lines more efficiently is described hereinbelow.

Figure 49:
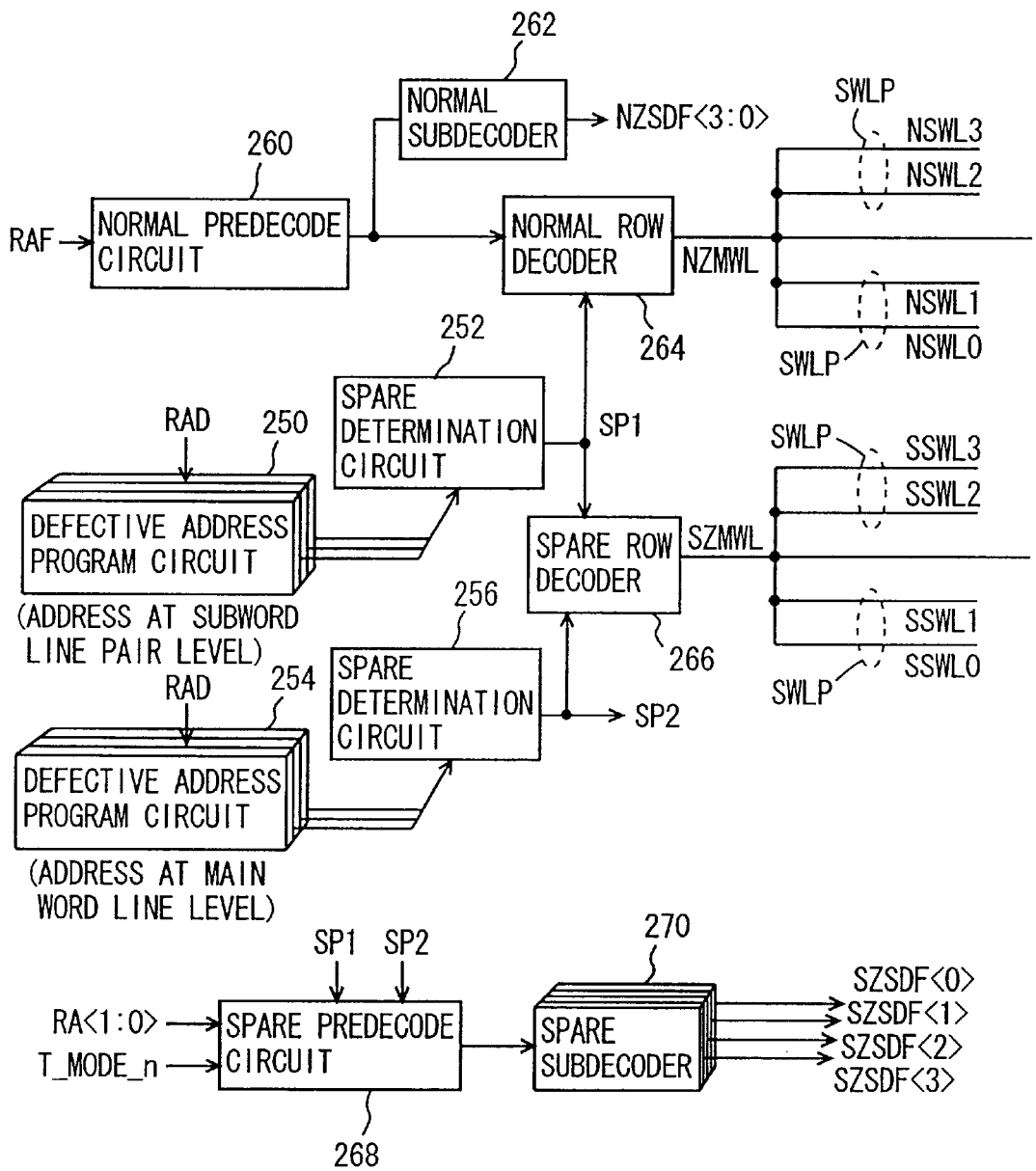
FIG. 49 schematically shows a structure of a row select related circuitry according to the tenth embodiment of the present invention.

FIG. 49 schematically shows a structure of circuitry related to row selection according to the tenth embodiment. In FIG. 49, the structure of row select related circuitry arranged corresponding to one row block is shown similarly to that shown in FIG. 25. Corresponding to normal main word line NZMWL, four normal subword lines NSWL0–NSWL3 are arranged. Corresponding to one spare main word line SZMWL, four spare subword lines SSWL0–SSWL3 are arranged.

Normal subword lines NSWL0 and NSWL1 form a subword line pair SWLP. Normal subword lines NSWL2 and NSWL3 form a subword line pair SWLP. In redundancy replacement shown in FIG. 25, spare subword lines SSWL0 and SSWL1 form a subword line pair SWLP, and spare subword lines SSWL2 and SSWL3 form a subword line pair SWLP. Subword line pair SWLP is formed of subword lines physically adjacent to each other. Therefore, subword line pair SWLP is driven by respective subword line drivers arranged being opposed in even numbered subword driver band SWDEB and odd numbered subword driver band.

Row select related circuitry includes a normal predecode circuit 260 predecoding a row address signal RAF, a normal subdecoder 262 decoding a predecode signal from normal predecode circuit 260 to generate subdecode signals NZSDF<3:0> specifying one of normal subword lines NSWL0–NSWL3, a normal row decoder 264 decoding predecode signals from normal predecode circuit 260 to drive an addressed normal main word line NZMWL, a defective address program circuit 250 storing a defective row address at a level of a pair of normal subword lines NSWL0–NSWL3, and a spare determination circuit 252 determining whether a normal word line (main word line/subword line) is to be driven to a selected state or not to generate a spare determination result signal SPI according to a detection result of a defective address being specified from defective address program circuit 250.

Defective address program circuit 250 programs a defective address for each normal subword line pair SPWLP. More specifically, in this case, the least significant row address bit RA0 of row address bit RA<m:0> is set into a degenerated state and programmed in defective address program circuit 250. Defective address program circuit 250 includes a plurality of program circuits and determines whether a defective row address is specified or not according to applied address RA (internal buffered address signal RAD from normal predecode circuit 260) to apply a signal indicating the determination result to spare determination circuit 252.

Spare determination circuit 252 generates a spare determination result signal SP1 according to a plurality of detection signals from defective address program circuit 250. Normal row decoder 264 is rendered inactive when spare determination result signal SP1 is activated. Also, normal subdecoder 262 is rendered inactive, and the normal main word line/normal subword line is placed in a non-selected state.

Row select related circuitry further includes a defective address program circuit 254 stores a defective address at a main word line level, a spare determination circuit 256 determining whether to carry out redundancy replacement or not according to a defect detect result designation from defective address program circuit 254, a spare row decoder 266 selecting and driving to a selected state a corresponding spare main word line SZMWL according to spare determination result signals SP1 and SP2 from spare determination circuits 252 and 256, a spare predecode circuit 268 receiving a twin cell mode designation signal T_MODE_n and row address bits RA<1:0> to selectively carry out predecoding according to spare determination result signals SP1 and SP2, and a spare subdecoder 270 for decoding the predecode signal received from spare predecode circuit 268 to generate spare subdecode signals SZSDF<0>–SZSDF<3> corresponding to spare subword lines SSWL0–SSWL3.

In order to recognize short failure between normal subword line pair SWLP provided corresponding to one normal main word line as shown in FIG. 48, defective address program circuit 254 stores an address RA<m:2> of the main word line that has such a defect between normal subword line pair.

Defective address program circuit 254 includes a plurality of program circuits and determines whether the defect main word line address stored in each program circuit matches the externally applied address RA (internal buffered address RAD from the normal predecode circuit), and produces respective determination results. Spare determination circuit 256 renders spare determination result signal SP2 active when one of the plurality of determination results indicate a match. When spare determination result signal SP2 is active, normal row decoder 264 and spare row decoder 266 are both rendered active to carry out a decode operation to drive corresponding normal main word line NZMWL and spare main word line SZMWL to a selected state.

Spare predecode circuit 268 responds to twin cell mode designation signal T_MODE_n for selectively setting the least significant row address bit RA<0> to a degenerated state. Spare predecode circuit 268 selectively effects a predecode operation according to spare determination result signals SP1 and SP2. When spare determination result signal SP1 is active, row address bits RA<1:0> are predecoded. When spare determination result signal SP2 is active, spare predecode circuit 268 executes a predecode operation so as to set one of spare subword lines SSWL1 and SSWL2 adjacent in adjacent subword line pairs SWLP to a selected state. In the case where a defect such as short-circuit is present in the normal subword line pair in a twin cell mode, one normal subword line NSWL3 or NSWL0 is driven to a selected state arranged corresponding to normal main word line NZMWL selected by normal row decoder 264, and one of spare subword line SSWL1 and SSWL2 is driven to a selected state. As a result, repair in the unit of a subword line can be effected even for a defect between normal subword line pairs to improve the replacement efficiency.

Figure 50:
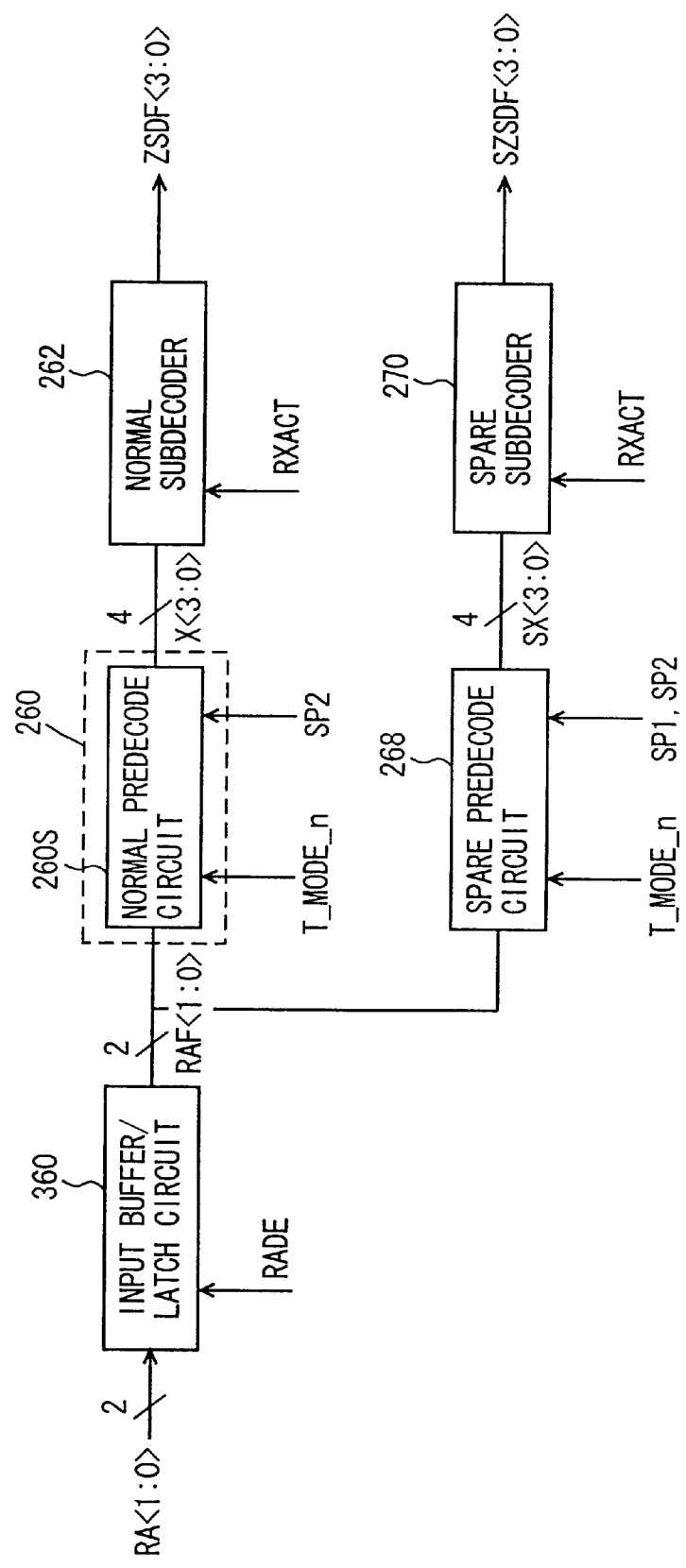
FIG. 50 schematically shows a transmission path of a subdecode signal according to the tenth embodiment of the present invention.

FIG. 50 schematically shows the signal path for generating subdecode signals ZSDF<3:0> and SZSDF<3:0> from row address bits RA<1:0>. In FIG. 50, an input buffer/latch circuit 360 is provided at a central control unit and latches external row address bits RA<1:0> according to row address enable signal RADE and generates internal row address bits RAF<1:0>. Input buffer/latch circuit 360 is provided common to a plurality of memory blocks (row blocks) to transmit an internal row address bits RAF<1:0> to a local row select circuit (predecoder/decoder) provided corresponding to each memory block.

Row address bits RAF<1:0> from input buffer/latch circuit 360 are applied to normal predecode circuit 260 and spare predecode circuit 268. Normal predecode circuit 260 predecodes row address bits RAF<1:0> according to twin cell mode designation signal T_MODE_n and spare determination result signal SP2 to generate predecode signals X<3:0>. Normal predecode circuit 260 also predecodes the remaining upper row address bits RRA<m:2> to apply the predecoded signal to normal row decoder 264.

Spare predecode circuit 268 predecodes two bits RAF<1:0> of row address from input buffer/latch circuit 360 in a manner determined according to twin cell mode designation signal T_MODE_n and spare determination result signals SP1 and SP2, to generate spare predecode signals SX<3:0>.

Normal predecode circuit 260 and spare predecode circuit 268 may be provided common to the plurality of memory blocks, or may be provided in each memory block.

In each memory block, a normal subdecoder 262 is provided which receives predecode signals X<3:0> from normal predecode circuit 260 to generate subdecode signals ZSDF<3:0>. Spare predecode signals SX<3:0> from spare predecode circuit 268 are applied to spare subdecoder 270. Spare subdecoder 270 responds to activation of word line drive timing signal RXACT for decoding spare predecode signals SX<3:0> to generate spare subdecode signals SZSDF<3:0>. Spare subdecoder 270 is arranged corresponding to each memory block since a spare word line is arranged for each memory block. As will be described afterwards, defect repairing is carried out in a unit of each memory block to select one normal subword line and one spare subword line, and read out complementary data to a bit line pair in order to repair defect between subword lines in a twin cell mode.

These subdecode signals ZSDF<3:0> and SZSDF<3:0> are applied to a normal subword line driver and a spare subword line driver via respective buffer circuits. Normal subdecoder 262 converts the level of normal predecode signals X<3:0> to generate normal subdecode signals ZSDF<3:0> when made active. Spare subdecoder 270 converts the level of spare predecode signals SX<3:0> to generate spare subdecode signals SZSDF<3:0> when made active. The structures of normal subdecoder 262 and spare subdecoder 270 are similar to those shown in FIG. 10.

Figure 51:
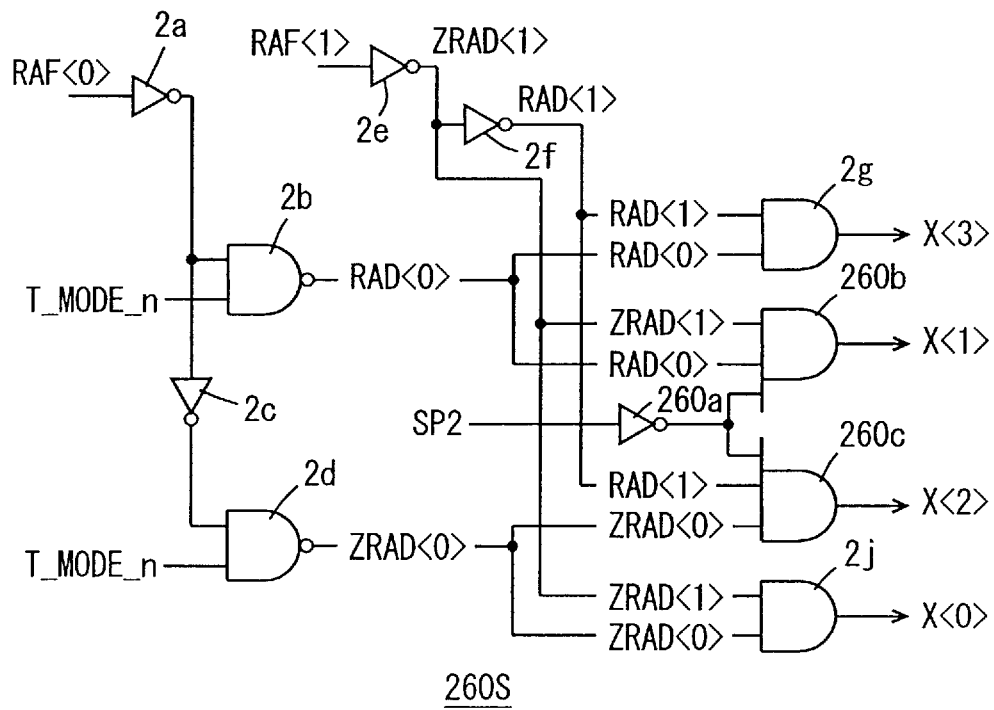
FIG. 51 shows a structure of a normal predecode circuit of FIG. 50.

FIG. 51 shows a structure of normal predecode circuit 260S included in the normal predecode circuit 260 shown in FIG. 50. The structure of normal predecode circuit 260S shown in FIG. 51 differs from the structure of predecode circuit 2 of FIG. 8 in the following points. An inverter circuit 260a inverting spare determination result signal SP2 from spare determination circuit 252 shown in FIG. 49 is provided in normal predecode circuit 260S. In stead of AND type decode circuits 2h and 2i shown in FIG. 8, there are provided an AND circuit 260b receiving address bits ZRAD<1> and RAD<0> and the output signal of inverter circuit 260a to generate a predecode signal X<1>, and an AND circuit 260c receiving row address bits RAD<1> and ZRAD<0> and the output signal of inverter circuit 260a to generate a predecode signal X<2>. The remaining structure is identical to that of the predecode circuit shown in FIG. 8. Corresponding components have the same reference characters allotted, and detailed description thereof will not be repeated.

According to the structure of FIG. 51, predecode signals X<0>–X<3> specify normal subword lines SWL0–SWL3, respectively.

When twin cell mode designation signal T_MODE_n is at an H level and 1 bit/1 cell mode is specified in the structure of FIG. 51, one of the four bits of predecode signals X<3>–X<0> is rendered active (when spare determination result signal SP2 is at an L level) according to address bits RAF<0> and RAF<1>. When spare determination result signal SP2 is driven to an H level in this 1 bit/1 cell mode, the output signal of inverter circuit 260a is pulled down to an L level. Predecode signals X<1> and X<2> from AND circuits 260b and 260c are set at an L level independent of the logic values of address bits RAF<0> and RAF<1>. More specifically, normal subword lines NSWL1 and NSWL2 corresponding to predecode signals X<1> and X<2> are forced into a non-selected state.

In this case, a corresponding spare predecode signal is driven to a selected state when normal predecode signals X<1> or X<2> is driven to a selected state.

In a twin cell mode, twin cell mode designation signal T_MODE_n is at an L level, and address bits RAD<0> and ZRAD<0> both attain an H level. The pair of predecode signals X<0> and X<2> or predecode signals X<1> and X<3> is specified. When there is short failure RZ as shown in FIG. 48, spare determination result signal SP2 attains an H level, the output signal of inverter circuit 260a attains an L level, and predecode signals X<1> and X<2> both attain an L level. One of predecode signals X<0> and X<3> is driven to a selected state according to address bit RAF<1>. Therefore, one normal subword line is driven to a selected state. The other subword lines maintain the non-selected state.

At this time, one spare subword line is driven to a selected state as will be described afterwards. Responsively, the complementary data from the memory cells connected to the normal and spare subword lines are read out to the bit line pair, to achieve reading out of data in the twin cell mode. In this case, therefore both the normal memory block and spare memory block are arranged in each memory block.

Figure 52:
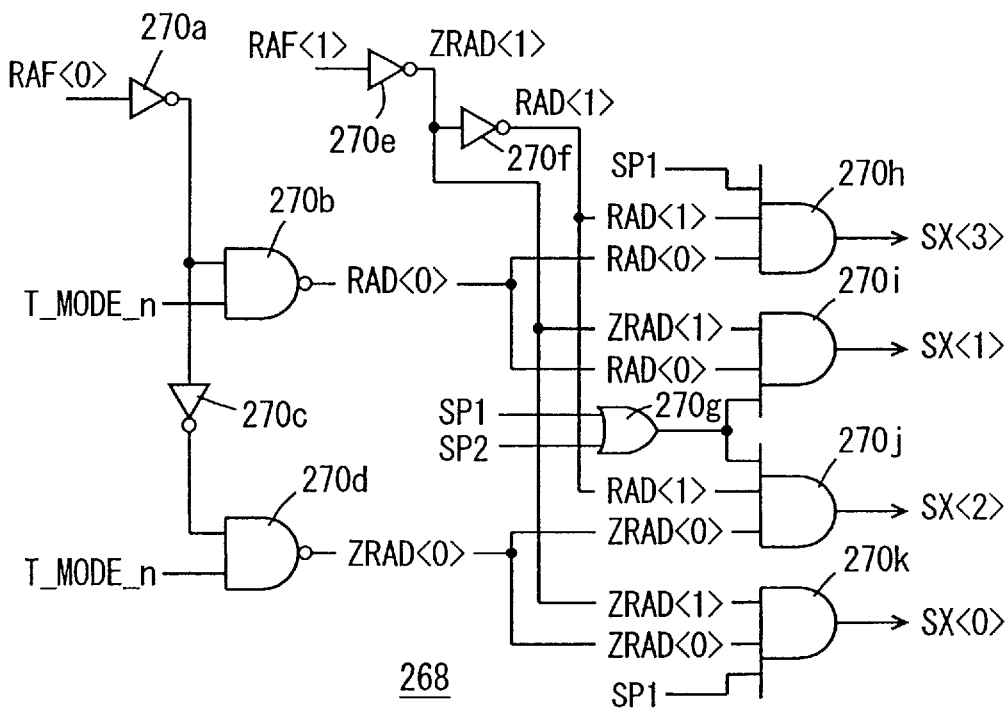
FIG. 52 shows a structure of a spare predecode circuit of FIG. 50.

FIG. 52 shows a structure of spare subdecoder 270 of FIG. 50. Referring to FIG. 52, spare subdecoder 270 includes an inverter circuit 270a inverting address bit RAF<0>, a NAND circuit 270b receiving the output signal of inverter circuit 270a and twin cell mode designation signal T_MODE_n to generate a row address bit RAD<0>, an inverter circuit 270c inverting the output signal of inverter circuit 270a, a NAND circuit 270d receiving the output signal of inverter circuit 270c and twin cell mode designation signal T_MODE_n to generate a complementary address bit ZRAD<0>, an inverter circuit 270e inverting address bit RAF<1> to generate a complementary address bit ZRAD<1>, an inverter circuit 270f inverting complementary address bit ZRAD<1> to generate address bit RAD<1>, an OR circuit 270g receiving spare determination result signals SP1 and SP2, an AND circuit 270h receiving address bits RAD<1> and RAD<0> and spare determination result signal SP1 to generate spare predecode signal SX<3>, an AND circuit 270i receiving address bits ZRAD<1> and RAD<0> and the output signal of OR circuit 270e to generate a spare predecode signal SX<1>, an AND circuit 270j receiving the output signal of OR circuit 270e and address bits RAD<1> and ZRAD<0> to generate a spare predecode signal SX<2>, and an AND circuit 270K receiving address bits ZRAD<1> and ZRAD<0> and spare determination result signal SP1 to generate spare predecode signal SX<0>.

According to the structure of spare predecode circuit 268 shown in FIG. 52, one of spare predecode signals SX<3>–SX<0> is rendered active according to a spare subdecode signal when spare determination result signal SP1 is in an active state. When spare determination result signal SP2 is at an active state of an H level, one of spare predecode signals SX<1> and SX<2> is driven to a selected state. When both spare determination result signals SP1 and SP2 are at an L level, spare predecode signals SX<3> SX<0> from AND circuits 270h–270k maintain the inactive state of an L level. Since there is no defect in this state, a normal subword line is specified by normal predecode circuit 260 and normal subdecoder 262, whereby a non-defective normal subword line is driven to a selected state according to the normal subdecode signals and the signal on the normal main word line. The operation of predecode circuits 260 and 268 shown in FIGS. 51 and 52 will be described briefly here.

(1) In the case of spare determination result signal SP1:

When normal subword lines forming a pair (driven to a selected state simultaneously) are short-circuited or one subword line is defective, an address with the least significant row address bit RA<0> degenerated is programmed in defective address program circuit 250 shown in FIG. 49. More specifically, upper row address bits RA<m:1> or corresponding predecode signals are programmed in defective address program circuit 250 of FIG. 49.

Figure 53:
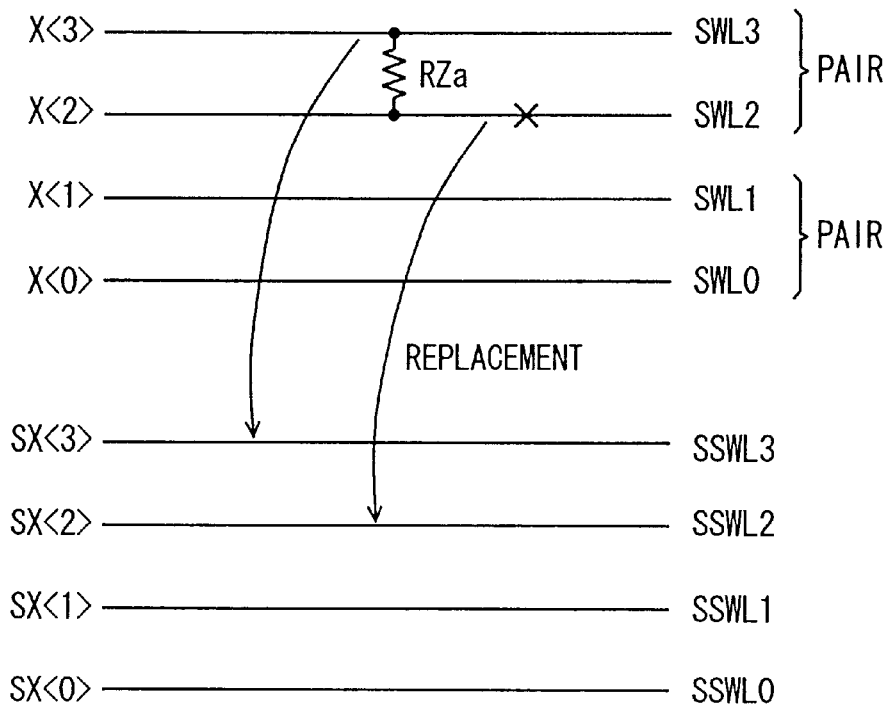
FIG. 53 schematically shows correspondence of redundancy replacement in a defective address program of the subword line pair level of FIG. 49.

In the programmed state, short-circuit RZa is present between subword lines SWL0 and SWL2 or subword line SWL2 is defective as shown in FIG. 53.

When normal subword line SWL2 is addressed in the 1 bit/1 cell mode or twin cell mode, spare determination result signal SP1 from defective address program circuit 250 is rendered active, and normal row decoder 264 does not effect a decode operation. The corresponding normal main word line maintains an inactive state. Spare predecode circuit 268, spare row decoder 266 and spare subdecoder 270 operate.

Since twin cell mode designation signal T_MODE_n is at an H level in the 1 bit/1 cell mode, one of spare predecode signals SX<0>–SX<3> is driven to a selected state. Therefore, spare subword line SSWL2 is driven to a selected state when normal subword line SWL2 is addressed.

In a twin cell mode, the twin cell mode designation signal T_MODE_n is at an L level and address bits RAD<0> and ZRAD<0> are both driven to a selected state. In this case, the set of spare predecode signals SX<0> and SX<1> or spare predecode signals SX<2> and SX<3> is driven to a selected state. Therefore, when spare subword line SWL2 is addressed, row address bit RAD<1> is at an H level, and corresponding spare subword lines SSWL2 and SSWL3 are both driven to a selected state, whereby defect repair is effected.

Figure 54:
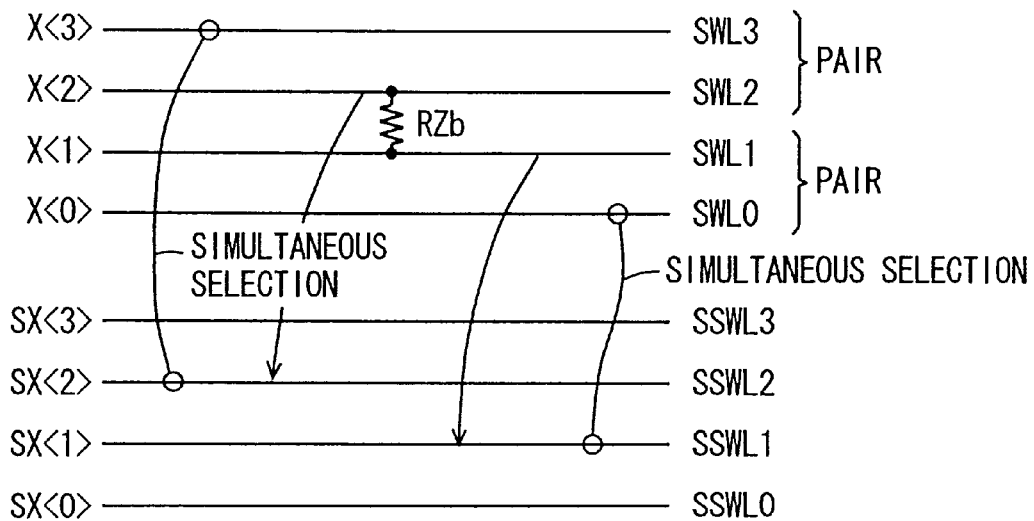
FIG. 54 schematically shows correspondence of redundancy replacement in a defective address program at an arbitrary word line level.

(2) Consider the case where there is a defect of short-circuit between adjacent subword line pairs. More specifically, consider the case where there is short-circuit RZb between adjacent subword lines SWL1 and SWL2 as shown in FIG. 54. In this case, address RA<m:2> at the main word line level is programmed in defective address program circuit 254. When a corresponding main word line (defective normal main word line) is addressed, spare determination result signal SP2 is rendered active. Since the mode of short-circuit differs, detection signal SP1 from defective address program circuit 250 is at an inactive state.

Here, address RA<m:2> is programmed at the main word line level in defective address program circuit 254. Defective address program circuit 250 is programmed with address RA<m:1> at the subword line pair level. Since it is assumed that there is one word line defect between an-intersubword-line-pair failure and an inter-subword line short-circuit failure for one normal main word line, and different row addresses of main word line level are stored in defective address program circuits 250 and 254, defect determination result signals SP1 and SP2 will not be rendered active at the same time.

Even if these defect determination result signals SP1 and SP2 are rendered active simultaneously, normal row decoder 264 is at an inactive state, and defective repair is only executed by the spare subword line (s).

This would cause no problem.

When there is short-circuit RZb between spare word lines SWL1 and SWL2, spare determination result signal SP2 is rendered active. In normal predecode circuit 260 shown in FIG. 51, normal predecode signals X<1> and X<2> are both rendered inactive at an L level.

When one of normal subword lines SWL1 and SWL2 is specified in the 1 bit/1 cell mode, one of spare predecode signals SX<1> and SX<2> is driven to a selected state to effect defect repairing in spare predecode circuit 268. When one of normal predecode signals X<3> and X<0> is driven to a selected state, spare predecode signals SX<3> and SX<0> maintain the unselected state since spare determination result signal SP 1 is at an L level. Therefore, there is no possibility of data conflict even if the normal main word line and spare subword line are both driven to a selected state.

When spare determination result signal SP2 from defective address program circuit 254 is rendered active in the 1 bit/1 cell mode, defect repair is carried out in a unit of a subword line even if the normal and spare main word lines are driven to a selected state. In a twin cell mode, it is required to drive two subword lines to a selected state simultaneously. When normal subword line SWL2 is specified, normal subword line SWL3 is also specified at the same time. At this time, spare determination result signal SP1 is at an L level, and AND circuits 270h and 270k are disabled. Therefore, spare predecode signal SX<2> is driven to a selected state, and normal subword line SWL0 and spare subword line SSWL2 are driven to a selected state. According to selection of these subword lines SWL0 and SSWL2, memory cell data are read onto a bit line pair. The memory cells of a memory cell unit in the twin cell mode, or the memory cells of the twin cell unit are formed by a normal memory cell and a spare memory cell.

When spare determination result signal SP1 is rendered active simultaneously to activation of spare determination result signal SP2, there is a short-circuit failure between three normal subword lines. In this case, since spare determination result signal SP1 is rendered active, normal row decoder 264 is at an inactive state, and only the spare main word line is selected. Defect repair is executed by the spare subword line pair (AND circuits 270h–270k all are at an active state when spare determination result signal SP1 is active). A subword line can be selected according to the twin cell mode even in this case.

Even in the case where there is leak short-circuit failure between adjacent subword lines, replacement in a unit of a main word line is not required (in the case of a 4-way hierarchical word line structure). Redundancy replacement for defect repairing can be effected in a unit of a subword line. A spare subword line can be used for a different defective row address. Thus, the redundancy replacement repair efficiency is improved.

The above description corresponds to a 4-way hierarchical structure. However, application to an 8-way hierarchical word line structure where eight subword lines are arranged for one main word line is also allowed. hierarchical word line structure.

Modification 1

Figure 55:
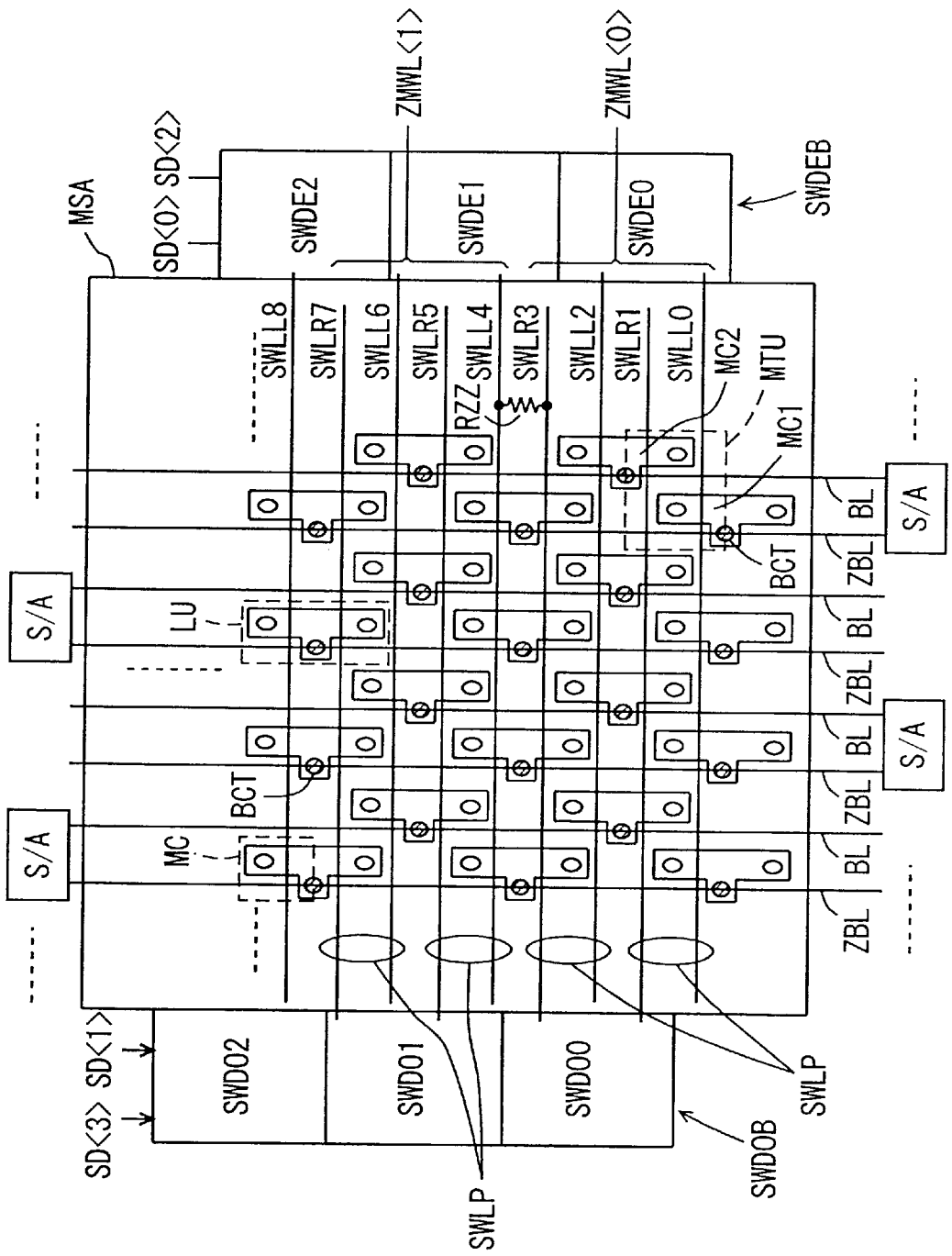
FIG. 55 shows an example of short-circuit in a modification of the tenth embodiment.

FIG. 55 shows the mode of short-circuit failure between subword lines repaired according to the modification of the tenth embodiment of the present invention. In FIG. 55, there is short-circuit RZZ between normal subword lines SWLR3 and SWLL4. Normal subword line SWLR3 is arranged corresponding to normal main word line ZMWL<0>. Normal subword line SWLL4 is arranged corresponding to normal main word line ZMWL<1>. More specifically, short-circuit RZZ between subword lines is present between the subword lines provided corresponding to different main word lines. In the case of carrying out redundancy replacement in a unit of a subword line pair, two subword line pairs must be subjected to the redundancy replacement in such a case, resulting in reduced redundancy usage efficiency. Thus, a structure of repairing short-circuit failure between subword lines arranged corresponding to different main word lines is described now.

Figure 56:
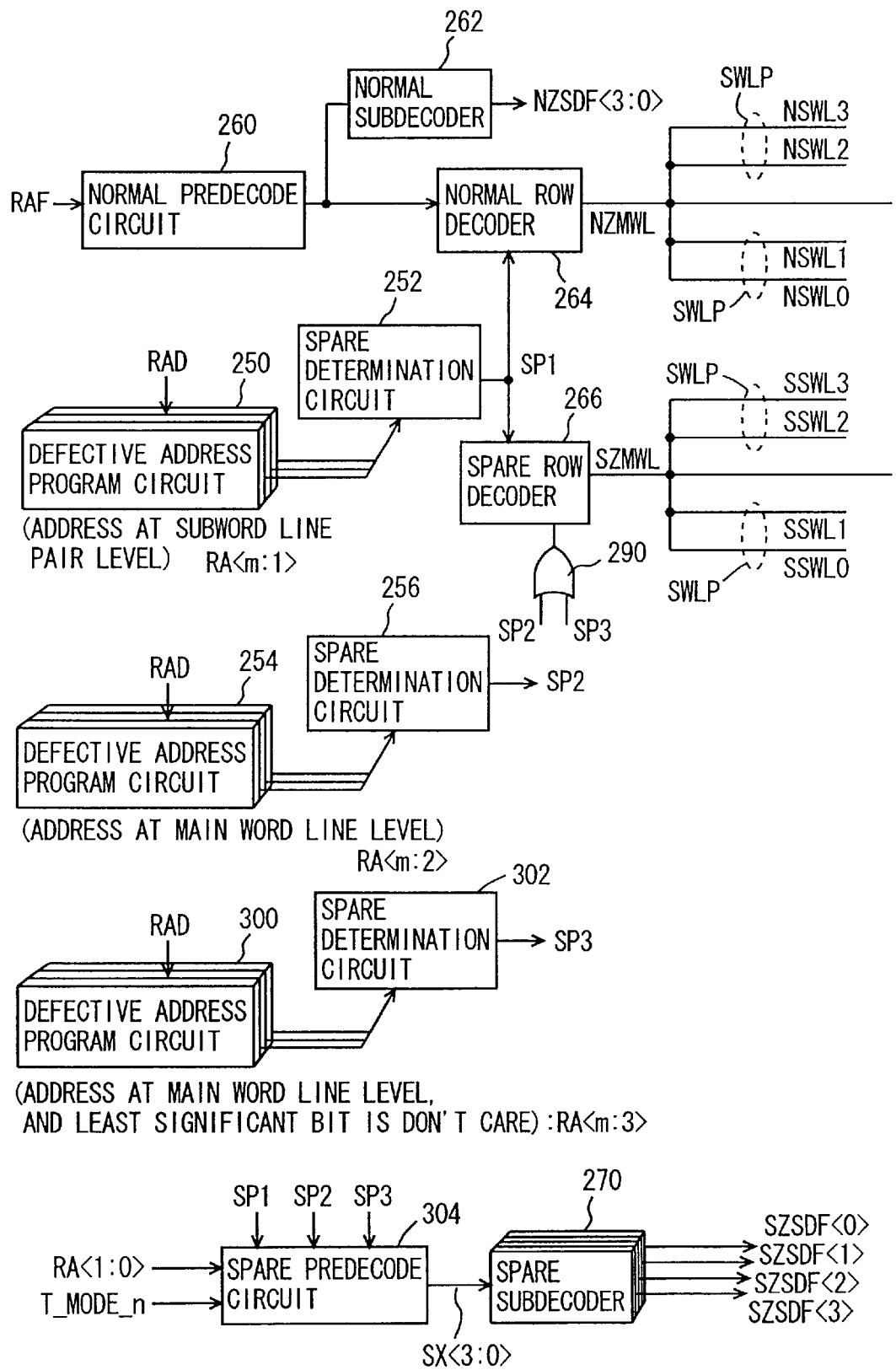
FIG. 56 schematically shows a structure of a row select related circuitry in a modification 1 of the tenth embodiment.

FIG. 56 schematically shows a structure of row select related circuitry according to a modification 1 of the tenth embodiment. The circuitry shown in FIG. 56 includes, in addition to the structure of FIG. 49, a defective address program circuit 300 to store a defective address at a main word line pair level, and a spare determination circuit 302 for carrying out spare determination according to a match detect operation of defective address program circuit 300, to render active a spare determination result signal SP3.

In defective address program circuit 300, the least significant bit of the address of the main word line level is set to a "don't care" state. More specifically, row address bits RA<m:3> are programmed, and defect determination is carried out at the main word line pair level. Similar to the structure shown in FIG. 49, defective address program circuits 250 and 254 are programmed with defective addresses using address bits RA<m:1> and RA<m:2>, respectively.

When one of spare determination result signal SP2 and SP3 is rendered active, spare row decoder 266 is rendered active, so that corresponding spare main word line SZMWL is driven to a selected state by OR circuit 290.

Spare determination result signals SP1, SP2 and SP3 are applied to spare predecode circuit 304 generating spare predecode signals SX<3:0>, whereby the predecoding manner is altered according to spare determination result signals SP1–SP3.

The signal path for generating normal subdecode signals NZSDF<3:0> and spare subdecode signals SZSDF<3:0> from the input buffer/latch circuit provided at the center of the control circuit unit is identical to the structure shown in FIG. 50. More specifically, internal row address signal RAF is generated from the address input buffer/latch circuit provided at the central control circuit unit to be applied to normal predecode circuit 260 for generating normal subdecode signals X<0>–X<3> , and also applied to spare predecode circuit 304 for generating spare predecode signals SX<3:0> selectively.

Figure 57:
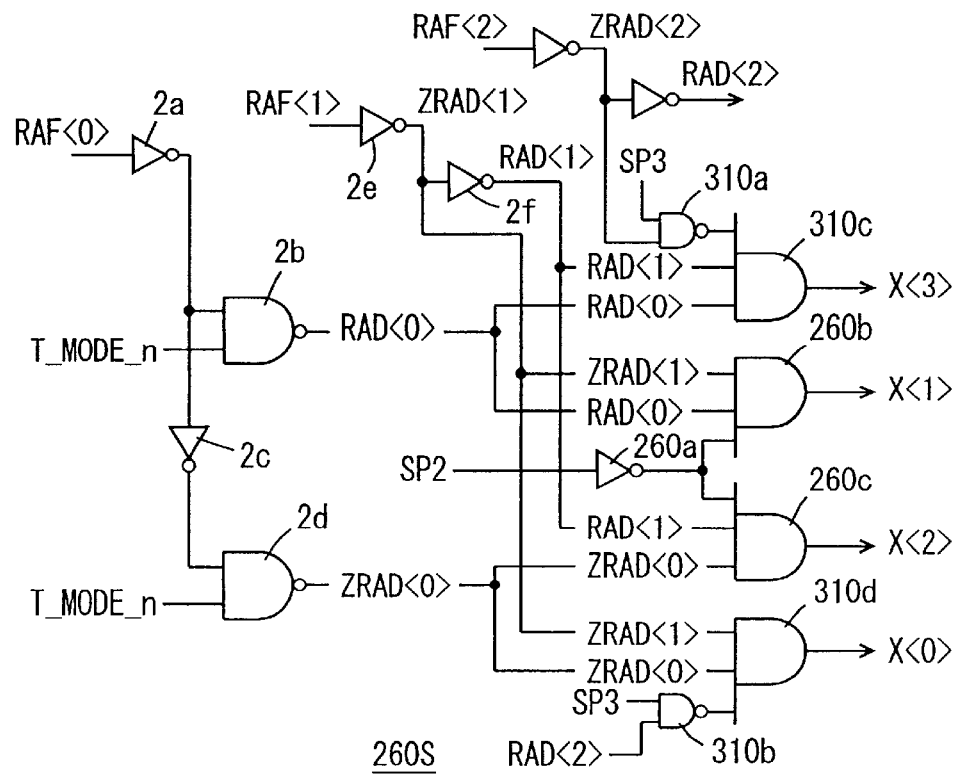
FIG. 57 shows a structure of the normal predecode circuit of FIG. 56.

FIG. 57 shows an example of a structure of normal predecode circuit 260S in the normal predecode circuit of FIG. 56. In normal predecode circuit 260S of FIG. 57, a structure for maintaining normal predecode signals X<0> and X<3> at an inactive state when spare determination result signal SP3 is rendered activate is additionally provided to the structure of normal predecode circuit 260S of FIG. 51. Address bit RAD<2> is the least significant bit of the main word line address signal RAD<m:2> or the row address of the main word line level, and indicates whether a selected main word line is an even numbered main word line or an odd numbered main word line. The spare determination result signal SP3 is indicates that the subword line of number 3 out of the four subword lines is selected when an even numbered main word line is selected, and that the subword line of number 0 out of the four subword lines is selected when an odd numbered main word line is selected.

The spare determination result signal SP3 indicates that the subword line NSWL3 of number 3 out of the four subword lines is short-circuited with the normal subword line NSWL0 of number 0 in the adjacent main word line when an even numbered main word line is selected, and that the normal subword line NSWL0 of the four normal subword lines is short-circuited with the normal subword line NSVVL3 of the adjacent main word line when an odd numbered main word line is selected. Predecode signals X<0> and X<3> are selectively forced into a deactivated state according to the even/odd of a selected normal main word line.

For normal predecode signal X<0>, there is provided an NAND circuit 310b receiving spare determination result signal SP3 and address signal bit RAD<2>, and an AND circuit 310d receiving address signal bits ZRAD<1> and ZRAD<0> and an output signal of NAND circuit 310b.

For normal predecode signal X<3>, there is provided an NAND circuit 310a receiving complementary address signal bit ZRAD<2> and spare determination result signal SP3, and an AND circuit 310c receiving address signal bit RAD<0> and RAD<1> and an output signal of NAND circuit 310a. The remaining structure is similar to that of normal predecode circuit 260S shown in FIG. 51. Corresponding components have the same reference characters allotted, and detailed description thereof will not be repeated.

In the structure shown in FIG. 57, the address signal bit RAD<2> is employed, which is used for controlling activation/deactivation of the predecode signals in the predecoder shown in FIG. 57 and is also used or predecoded for selecting a normal main word line in the other predecoder.

In the arrangement of normal predecode circuit 260S shown in FIG. 57, when spare determination result signal SP3 attains an H level, NAND circuits 310a and 310b are enabled, and the logic levels of the output signals of NAND circuits 310a and 310b are determined by address signal bit RAD<2>.

When address signal bit RAD<2> is at an H level, an odd numbered normal main word line is designated, and the output signal from NAND circuit 310b attains an L level to maintain predecode signal X<0> from AND circuit 310d in an inactive state. In this state, normal subword line SWL0 of number 0 causing a short-circuit failure is maintained in an inactive state among the corresponding normal subword lines.

When address signal bit RAD<2> is at L level, complementary address signal bit ZRAD<2> attains an H level, and responsively the output signal of NAND circuit 310a is fixed to an L level. That is, an even numbered normal main word line is selected and a normal subword line SWL3 of number 3 causes a short-circuit failure. Thus, the corresponding predecode signal X<3> is maintained in an inactive state.

When spare determination result signal SP3 is an L level, short-circuit with a normal subword line on an adjacent main word line is not present. In this state, NAND circuit 310a and 310b each output an H-level signal, and an operation similar to that of normal predecode circuit 26OS of FIG. 51 is carried out.

Figure 58:
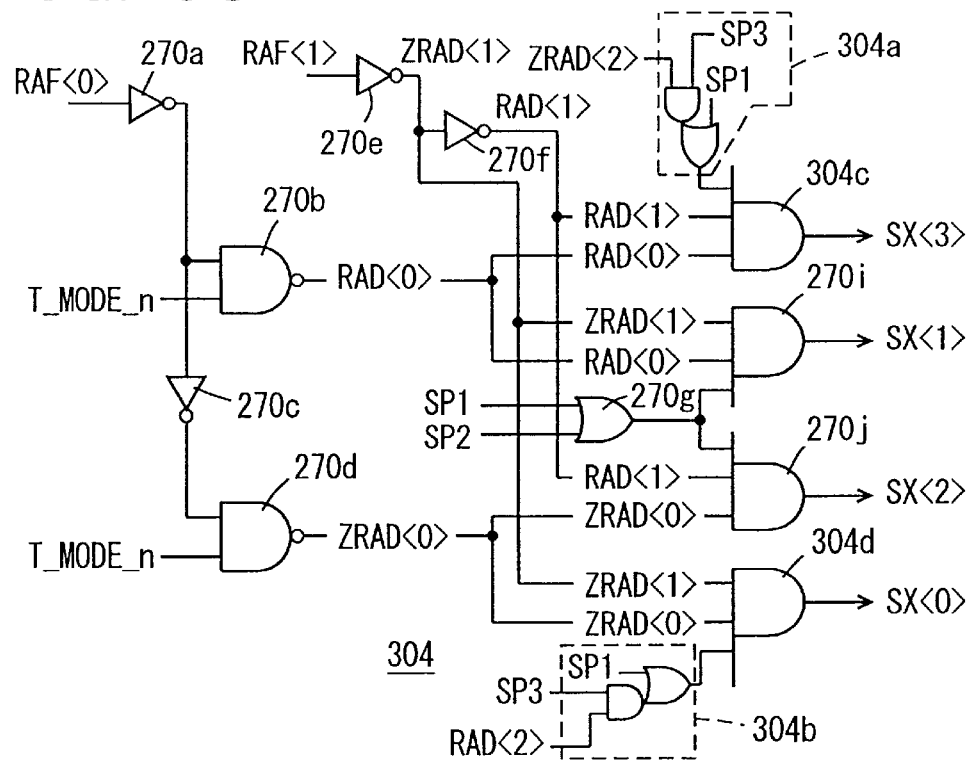
FIG. 58 shows a structure of a spare predecode circuit of FIG. 56.

FIG. 58 shows a structure of spare predecode circuit 304 of FIG. 56. Referring to FIG. 58, in spare predecode circuit 304, composite gate circuits 304a and 304b receiving spare determination result signals SP1 and SP3 are provided for effecting replacement repair of short-circuit failure between subword lines in adjacent main word lines. Composite gate circuit 304a equivalently includes an AND circuit receiving address signal bit ZRAD<2> and spare determination signal SP3, and an OR circuit receiving spare determination signal SP1 and an output signal of the AND circuit. Composite gate circuit 304b equivalently includes an AND circuit receiving an address signal bit RAD<2> and spare determination result signal SP3, and an OR circuit receiving an output signal of the AND circuit and spare determination signal SP1.

In spare predecode circuit 304, AND circuit 304c receiving address signal bits RAD<2> and ZRAD<2> and the output signal of composite gate circuit 304a is provided for spare predecode signal SX<3>. For spare predecode signal SX<0>, there is provided an AND circuit 304d receiving address signal bits ZRAD<1> and ZRAD<0> and the output signal of composite gate circuit 304b. The other structure is the same as that of the spare predecode circuit shown in FIG. 52, and the corresponding components are denoted by the same or corresponding reference characters with detailed description thereof omitted.

Figure 59:
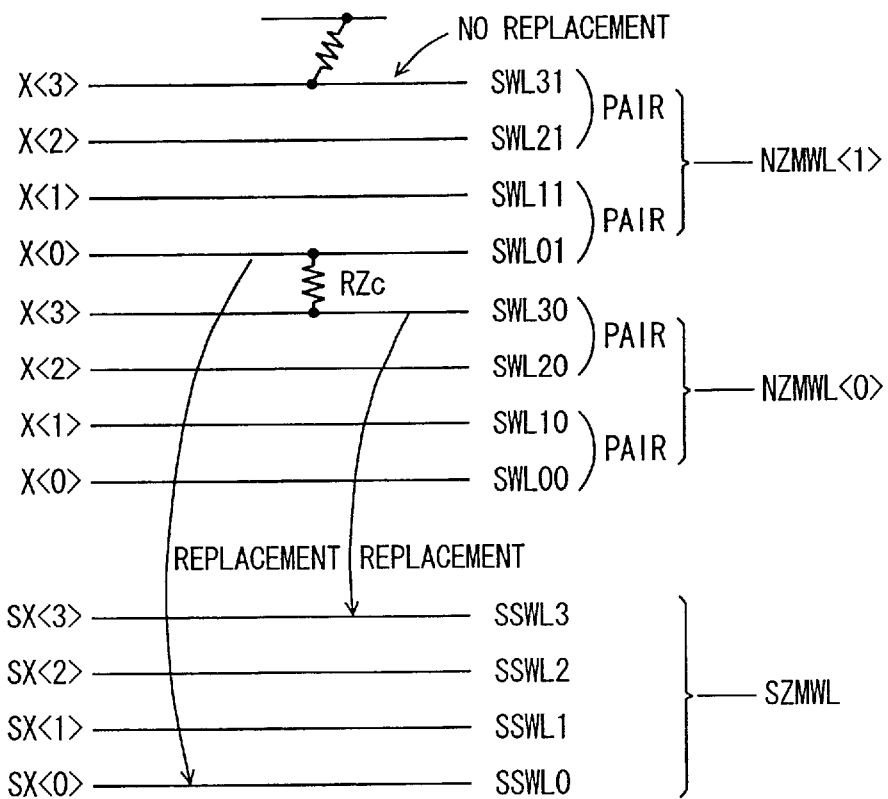
FIG. 59 shows an example of correspondence of redundancy replacement in a defective address program at a main word line pair level.

Consider the case where a short-circuit RZc is present between normal subword line SWL01 provided corresponding to odd normal main word line NZMWL<1> and subword line SWL30 provided corresponding to even normal main word line NZMWL<0>, as shown in FIG. 59. In the case of such a short-circuit failure, a row address RAD<m:3> is programmed so that both normal main word line NZMWL<0> and NZMWL<1> are specified in defective address program circuit 300 shown in FIG. 56. In other words, the least significant main word line address RAD<2> is set into a degenerated state.

(1) 1 bit/1 cell mode:

Consider the case where normal subword line SWL01 is addressed in a 1 bit/1 cell mode. The normal main word line NZMWL<1> is an odd numbered main word line and address signal bit RAD<2> is at an H level, while complementary address signal bit ZRAD<2> is at an L level. In this case, spare determination result signal SP3 is rendered active. In normal predecoder 260S of FIG. 57, the output signals of NAND circuit 310b is driven to an L level, and AND circuit 310d is disabled. Normal predecode signal X<0> is maintained at an inactive state of an L level. NAND circuit 310a outputs an H-level signal and AND circuit 310c is enabled to carry out a predecoding.

Since normal subword line SWL01 is addressed, normal predecode signals X<1> and X<2> and X<3> from AND circuits 260b and 260c and 310c are at an L level in normal predecoder 260S shown in FIG. 57.

In spare predecode circuit 304, the output signals of composite gate circuits 304a and 304b are driven to an L level and an H level, respectively, and AND circuits 304c and 304d are disabled and enabled, respectively, as shown in FIG. 58. The spare predecode signal SX<3> is forced to an L level. Since normal subword line SWL01 is addressed, spare predecode signal SX<0> corresponding to normal predecode signal X<0> is rendered active, and all the remaining spare predecode signals SX<1>–SX<3> are at an L level.

Therefore, spare row decoder 266 is rendered active, and a corresponding spare main word line is driven to a selected state. This normal subword line SW01 is replaced with spare subword line SSWL0 to be accessed. Normal row decoder 264 is rendered active, when spare determination result signal SP3 is activated, to drive a normal main word line to a selected state according to an applied row address signal. In this case, all normal predecode signals X<0>–X<3> are all in an inactive state of an L level. There is particularly no problem even if normal main word line NZMWL<1> and spare main word line SZMWL are both driven to a selected state. In this case, the normal row decoder may be configured to be deactivated when the spare determination result signal SP3 is activated in 1 bit/1 cell mode.

Consider the case where subword line SWL11 is addressed in the 1 bit/1 cell mode. In this state, spare determination result signal SP3 attains an H level similarly. In normal predecode circuit 260S shown in FIG. 57, even when the output signal of composite gate circuits 310a attains an L level and the output signal of composite gate circuit 310b attains an H level, predecode signals X<0> and X<3> from AND circuits 310c and 310d are maintained at an L level according to address signal bits RAD<1:0>. However, since spare determination result signal SP2 is at an L level and inverter circuit 260a provides an output signal of an H level, normal predecode signal X<1> is driven to an H level by AND circuit 260b. Responsively, normal subword line SWL1 is driven to a selected state. A corresponding normal word line is driven to a selected state by the normal row decoder.

In spare row predecode circuit 304, even when AND circuit 304c or 304d is enabled, address signal bits RAD<1:0> specify the subword line SWL11, and AND circuits 270i and 270j are disabled to maintain spare predecode signals SX<1> and SX<2> at an L level. Thus, spare predecode signals SX<0>–SX<3> all maintain the non-selected state at an L level. Therefore, in this case, no replacement is carried out at all, and the normal subword line SWL11 is driven to the selected state.

When subword line SWL30 is addressed, normal main word line NZMWL<0> is designated, and address signal bit RAD<2.> is at an L level while complementary address signal bit ZRAD<2> is at an H level. In the normal predecode circuit 260S, spare determination result signal SP3 attains an H level, and the other normal predecode signals X<2:0> are maintained at an L level according to address signal bits RAD<1:0>.

In spare predecode circuit 304, the output signal of composite gate circuit 304a attains an H level, and spare predecode signal SX<3> attains an H level according to address signal bits RAD<1:0>. Therefore, normal predecode signal X<3> attains an inactive state and spare predecode signal SX<3> is driven to an H level, and responsively, the spare subword line SSWL3 is driven to the selected state.

It is noted that when normal subword line SWL 31 is short-circuited with normal subword line SWL02 of an adjacent normal main word line NZMWL<2>, spare determination result signal SP3 maintains an L level and the replacement for repairing a failure is not effected. This is because a defective address is programmed with the least significant address bit of the main word line address degenerated and the addresses of the normal main word lines NZMWL<1> and NZMWL<2> are different in program address from each other. According to the arrangement as discussed above, the short-circuit failure between subword lines of adjacent normal main word lines with the same address of the row address bits RAD<m:3> can be repaired by the redundancy replacement.

(2) Twin cell mode:

In a twin cell mode, address bit RF<0> is set to a degenerated state. Consider the case where subword lines SWL11 and SWL01 are addressed now. Normal predecode signal X<1> is driven to an H level. Normal predecode signal X<0> is maintained at an L level since spare determination result signal SP3 is at an H level and address signal bit RAD<2> is at an H level. Therefore, when normal main word line NZMWL<1> is driven to a selected state by normal row decoder, normal subword line SWL11 is driven to a selected state. In spare predecode circuit 304, spare predecode signal SX<0> is driven to an H level and spare subword line SSWL0 is driven to a selected state by AND circuit 304d. In this case, normal subword line SWL11 and spare subword line SSWL0 are driven to a selected state in parallel.

Similarly, when normal subword lines SWL20 and SWL30 are addressed at the same time, normal subword line SWL20 and spare subword line SSWL3 are driven to a selected state. Therefore, in a twin cell mode, normal subword line SWL11 and spare subword line SSWL0 form a pair, or normal subword line SWL20 and spare subword line SSWL3 form a pair, and the formed subword line pair is driven to a selected state simultaneously.

It is to be noted that redundancy replacement is effected in a unit of a main word line when spare determination result signals SP2 and SP3 are driven to a selected state at the same time. The structure according to this modification is easily extendable to an 8-way hierarchical word line structure other than the 4-way hierarchical word line structure.

Modification 2

Figure 60:
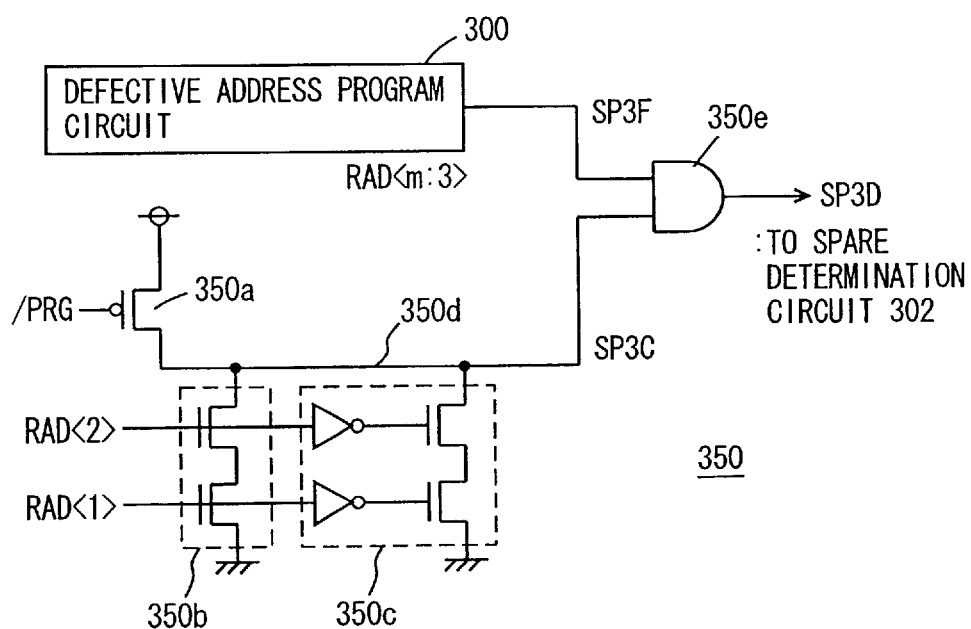
FIG. 60 schematically shows a structure of a defective address program unit in a modification 2 of the tenth embodiment.

FIG. 60 schematically shows a structure of a spare determination unit according to a modification 2 of the tenth embodiment. In FIG. 60, a configuration is provided to detect short-circuit failure between adjacent normal subword lines in a main word line pair, in addition to the configuration of defective address program circuit 300 of FIG. 56. More specifically, a main word line pair defect detection section includes a P channel MOS transistor 350a connected between a power supply node and a node 350d to receive a precharge instruction signal/PRG at a gate thereof, a first match detection circuit 350b driving node 350d to the level of the ground voltage when row address signal bits RAD<2> and RAD<1> both attain an H level ("1"), and a second match detection circuit 350c driving node 350d to the level of the ground voltage when row address signal bits RAD<2> and RAD<1> are both at an L level ("0").

First match detection circuit 300b includes an N channel MOS transistors connected in series between node 350b and the ground node. Second match detection circuit 350c includes inverter circuits inverting respective row address signal bits RAD<2> and RAD<1>, and N channel MOS transistors connected between node 350d and the ground node and receiving the output signals of the respective inverter circuit at their gates.

Main word line pair defect detection section 350 further includes an AND circuit 350e receiving a match detection signal SP3F from defective address program circuit 300 and a match detection signal SP3C from main word line pair defect detection unit 350 to generate a final match detection signal SP3D. Final match detection signal SP3D from AND circuit 350e is applied to spare determination circuit 302 of FIG. 56.

Row address signal bits RAD<m:2> of the main word line level with the least significant bit degenerated are stored in defective address program circuit 300. Therefore, row address bits RAD<m:3> are programmed in defective address program circuit 300. The main word line with the defect between subword lines between a main word line pair is detected by defective address program circuit 300. When address bits RAD<2> and RAD<1> both have a matching logic level, match detection signal SP3C is driven to an L level in main word line pair defect detection section 350. Thus, final match detection signal SP3D is driven to an active state when the subword line including the subword line with short-circuit is specified in the twin cell mode.

Figure 61:
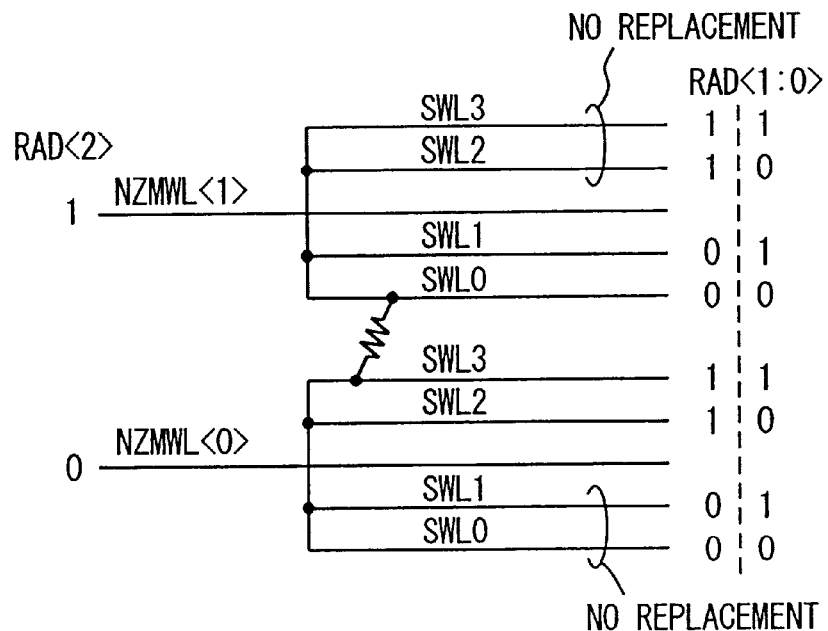
FIG. 61 shows correspondence between the row address bit and the normal main word line and normal subword line of modification 2 of the tenth embodiment.

FIG. 61 shows row address signal bits of each of main word lines NZMWL<0> and NZMWL<1> and subword lines SWL0–SWL3.

Normal main word lines NZMWL<0> and NZMWL<1> are specified when row address bit RAD<2> is 0 and 1, respectively.

Normal/spare subword lines SWL0–SWL3 are specified by row address bits RAD<1:0>. These normal/spare subword lines SWL0–SWL3 are specified by RAD<1:0>=(0, 0), (0, 1), (1, 0) and (1, 1), respectively.

When one of normal main word line NZMWL<0> and NZMWL<1> is addressed, defective address program circuit 300 drives match detection signal SP3F to an active state (H level). Consider the case where normal subword line SWL3 is addressed on normal main word line NZMWL<1>. In this case, row address bit RAD<2> is "1" and row address bit RAD<1> is "1". Therefore, match detection signal SP3C from node 350d attains an L level, and final match detection signal SP3D maintains an L level. In this case, normal subword lines SWL2 and SWL3 are driven to a selected state in a twin cell mode, and no redundancy replacement is carried out.

When normal subword line SWL0 is specified at normal main word line NZMWL<1>, row address bit RAD<2> becomes "1" and row address bit RAD<1> becomes "0". Match detection signal SP3C from precharge node 350d of main word line pair defect detection unit 350 of FIG. 60 maintains an H level (precharged state). Therefore, final match detection signal SP3D attains an H level since match detection signal SP3F from defective address program circuit 300 is at an H level. In this case, spare determination result signal SP3 is rendered active, and normal subword line SWL0 is replaced with a spare subword line. In the twin cell mode, normal subword line SWL1 and spare subword line SSWL0 are selected at the same time.

Similarly, when normal main word line NZMWL<0> is specified and subword line SWL1 is specified, row address bits RAD<2> and RAD<1> are both at "0". Match detection signal SP3C from main word line pair defect detection section 350 attains an L level, so that redundancy replacement is not carried out. When subword line SWL3 is specified, row address bits RAD<2> and RAD<1> become "0" and "1", respectively, and match detection signal SP3C attains an H level. Thus, redundancy replacement is executed in a unit of a subword line.

In a 1 bit/1 cell mode, redundancy replacement is carried out in a unit of a subword line, in a similar manner.

By carrying out redundancy replacement selectively according to whether subword lines of the upper pair or the lower pair is specified in the normal main word line and whether the upper main word line or lower main word line is specified in the main word line pair, a pair of normal subword lines (in twin cell mode) can be driven to a selected state properly in the case where a subword line without defect between subword lines is addressed in a twin cell mode and a 1 bit/1 cell mode. Thus, the defect repair efficiency can be further improved.

With such a structure in which the main word line address is represented in a gray-code notation and the addresses of adjacent main word lines have a logic level differing by just one bit, short-circuit failure between subword lines in a pair of arbitrary main word lines can be repaired by programming a defective row address in defective address program circuit 300 with the address of one bit set to a degenerated state. By detecting the match/mismatch of the logic levels between the degenerated row address bit and row address bit RAD<1> of the subword line pair level, a pair of normal subword lines can be driven to a selected state in the twin cell mode without redundancy replacement when a pair of subword lines absent of short-circuit are selected in the twin cell mode. It is to be noted that the addresses represented in gray code notation must be increased sequentially. When a row address of the general gray code notation is used, determination is to be made on whether an upper side subword line is addressed or a lower side subword line is addressed based on the address represented in gray code notation of that defective main word line pair and the actual bit value.

In the above structure, a 4-way hierarchical word line structure is shown. However, the redundancy replacement structure can be easily expanded from the 4-way hierarchical word line structure to the 8-way hierarchical word line structure by utilizing a structure in which predecode signals X<0> and X<7> corresponding to adjacent subword lines SWL0 and SWL7 are driven to non-selected state according to spare determination result signal SP3 when there is short-circuit between the subword lines in the main word line pair.

Figure 62:
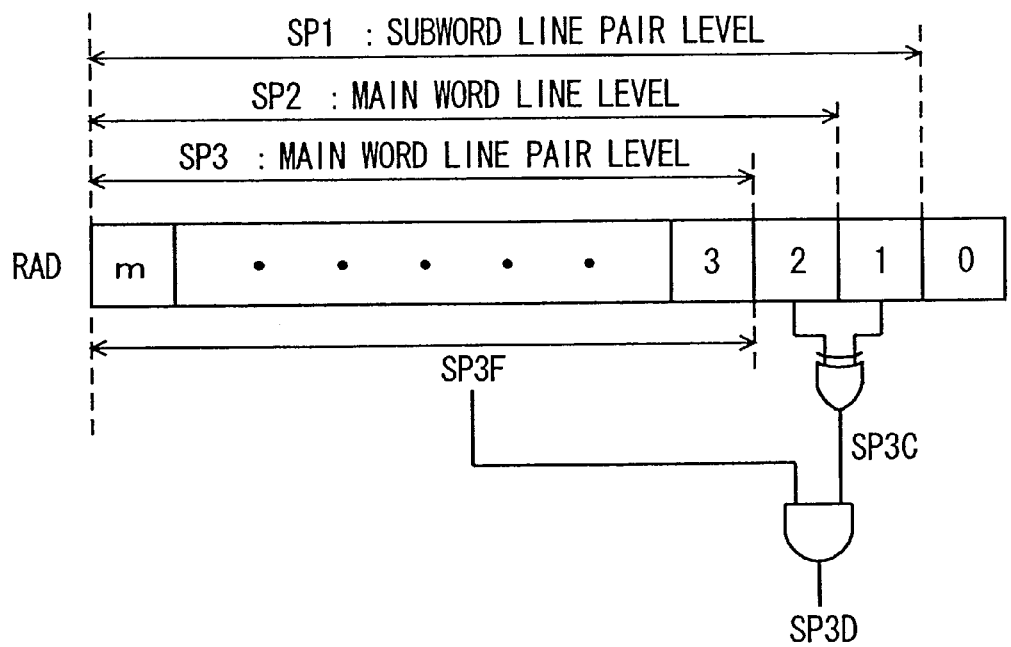
FIG. 62 schematically shows the corresponding relationship between a defective row address bit and a corresponding spare determination result signal according to the tenth embodiment of the present invention.

Correspondence Between Spare Determination Result Signal and Program Row Address Bit FIG. 62 schematically shows the correspondence relationship between row address bits RAD<m:0> and spare determination result signals SP1–SP3 or SP3D in the tenth embodiment. A subword line pair is specified by row address bits RAD<m:1>, and a defect in the subword line pair connected to the same main word line is repaired. In this case, spare determination result signal SP1 is rendered active, and the normal main word line maintains a non-selected state.

A main word line is specified by row address bits RAD<m:2>. In this case, short-circuit failure between adjacent subword line pairs is detected in one main word line, whereby spare determination result signal SP2 is rendered active. Here, both the spare main word line and normal main word line are driven to a selected state.

Short-circuit at the main word line pair level is detected by row address bits RAD<m:3> and spare determination result signal SP3 is made active according to row address bits RAD<m:3>.

Alternatively, by the AND operation of row address bits RAD<m:3> and mismatch detection signal SP3C of row address bits RAD<2:1>, short-circuit in the subword line pair in a pair of adjacent main word lines is detected, whereby match detection signal SP3D is rendered active. The normal main word line and spare main word line are driven to a selected state in these cases.

A defective address is programmed appropriately in a corresponding defective address program circuit according to the position where short-circuit is present.

In FIG. 60, final match detection signal SP3D is generated and applied to spare determination circuit 302 according to match detection signal SP3F from the defective address program circuit and match detection signal SP3C. Alternatively, such a structure may be implemented that match detection signal SP3C is applied to spare determination circuit 302 that renders spare determination result signal SP3 active/inactive according to match detection signals SP3C from a plurality of defective address program circuits.

According to the tenth embodiment, the manner of predecoding is altered according to the position of the subword line pair that includes short-circuit. Short-circuit between adjacent subword line pairs can be repaired efficiently to improve replacement efficiency.

Eleventh Embodiment

Figure 63:
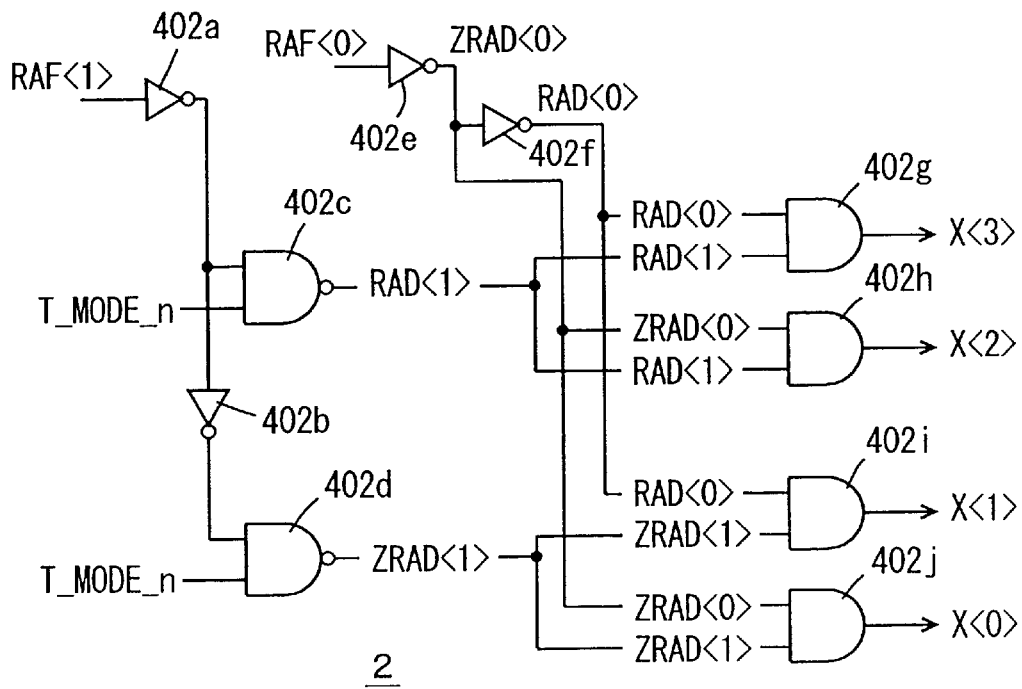
FIG. 63 schematically shows a structure of a predecoder according to an eleventh embodiment of the present invention.

FIG. 63 shows a structure of a predecode circuit according to an eleventh embodiment of the present invention. The predecode circuit of FIG. 63 corresponds to the structure of predecode circuit 2 of FIG. 7 and drives two predecode signals out of four predecode signals X<0>–X<3> in a 4-way hierarchical word line structure.

Referring to FIG. 63, a predecode circuit 2 includes an inverter 402a receiving an internal row address bit RAF<1>, an inverter 402b receiving the output signal of inverter 402a, a NAND gate 402c receiving the output signal of inverter 402a and twin cell mode designation signal T_MODE_n, and a NAND circuit 402d receiving the output signal of inverter 402b and twin cell mode designation signal T_MODE_n. Internal row address bit RAD<1> is generated from NAND circuit 402c, and complementary internal row address bit ZRAD<1> is output from NAND circuit 402d.

Predecode circuit 2 further includes an inverter 402e receiving row address bit RAF<0>, an inverter 402f receiving output bit ZRAD<0> of inverter 402e, an AND circuit 402g receiving row address bit RAD<0> from inverter 402f and row address bit RAD<1> from NAND circuit 402c to generate predecode signal X<3>, an AND circuit 402h receiving row address bit ZRAD<0> from inverter 402e and row address bit RAD<1>from NAND circuit 402c to generate predecode signal X<2>, an AND circuit 402i receiving row address bit RAD<0> from inverter 402f and row address bit ZRAD<1> from NAND circuit 402d to generate predecode signal X<1>, and an AND circuit 402j receiving row address bit ZRAD<0> from inverter 402e and row address bit ZRAD<1> from NAND circuit 402d to generate predecode signal X<0>.

Twin cell mode designation signal T_MODE_n is set to an L level when the twin cell operation mode of 1 bit/2 cell storage is specified. In this state, row address bits RAD<1> and ZRAD<1> output from NAND circuits 402c and 402d both attain a selected state of an H level, and row address bit RA<1> is set to a degenerated state. These predecode signals X<0>–X<3> correspond to subword lines SWL0–SWL3 adjacent to each other. Therefore, according to the logic value of row address bits ZRAD<0> and RAD<0> from inverters 402e and 402f, the set of predecode signals X<0> and X<2> or the set of predecode signals X<1> and X<3> are driven to a selected state of an H level. Therefore, a set of adjacent word lines with one word line (subword line) interposed therebetween, SWL0 and SWL2 or SWL1 and SWL3, are driven to a selected state at the same time.

When twin cell mode designation signal T_MODE_n is set at an H level, NAND circuits 402c and 402d operate as inverters. Therefore, row address bit RA<1:0> is predecoded, and one of four predecode signals X<0>X<3> is driven to a selected state. By this twin cell mode designation signal T_MODE_n, switching can be made between the 1 bit/1 cell mode and twin cell mode.

The predecoder of the eleventh embodiment differs in structure from the predecoder 2 of FIG. 8 in that row address bit RA<1> is set to a degenerated state in a twin cell mode.

Figure 64:
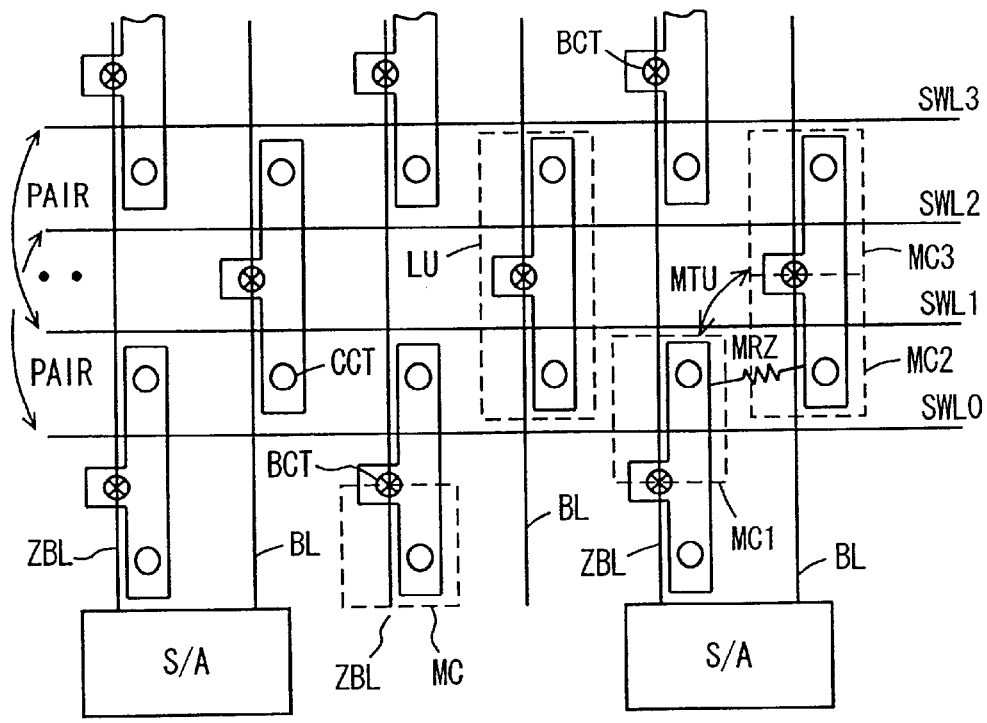
FIG. 64 schematically shows a structure of the twin cell unit according to the eleventh embodiment of the present invention.

FIG. 64 schematically shows a structure of a memory subarray portion. As shown in FIG. 64, memory cells MC are arranged in the "half pitch cell arrangement", similar to the arrangement of FIG. 1. A bit line contact BCT is arranged every four rows in the column direction and every other column in the row direction.

Layout unit LT is arranged along the column direction every two rows, and layout unit LT is connected alternately to bit lines BL and ZBL at each column. Here, bit lines BL and ZBL are arranged corresponding to one column of memory cells.

In the arrangement of FIG. 1, the cell unit in a twin cell mode, i.e. twin cell unit MTU is formed of memory cells MC1 and MC2 adjacent in the row direction. In the present eleventh embodiment, adjacent subword lines are not selected at the same time. A pair of subword lines with one subword line interposed therebetween is selected. Therefore, twin cell unit MTU is formed of memory cells MC1 and MC3. More specifically, the pitch of subword lines selected simultaneously is equal to the pitch of the bit line contacts of memory cells MC1 and MC3 in the column direction of twin cell unit LT.

Consider the case where there is micro short-circuit MRZ connected to capacitor contacts CCT of memory cells MC1 and MC2, as shown in FIG. 64. In the case where memory cells MC1 and MC2 form twin cell unit MTU, complementary data are always stored in these memory cells MC1 and MC2. Therefore, the presence of micro short-circuit MRZ causes a flow of leakage current from the storage node storing H level data to the storage node storing L level data. Accordingly, there is a possibility of the data retaining characteristics being degraded in the twin cell mode, to degrade long refresh characteristics.

However, by forming twin cell unit MTU by memory cells MC1 and MC3 spaced apart by the arrangement pitch of bit line contacts BCT, the possibility of complementary data being stored in adjacent memory cells MC1 and MC2 can be reduced even if micro short-circuit MRZ occurs between the storage nodes of adjacent memory cells. Therefore, the data retaining characteristics can be improved.

Figure 65:
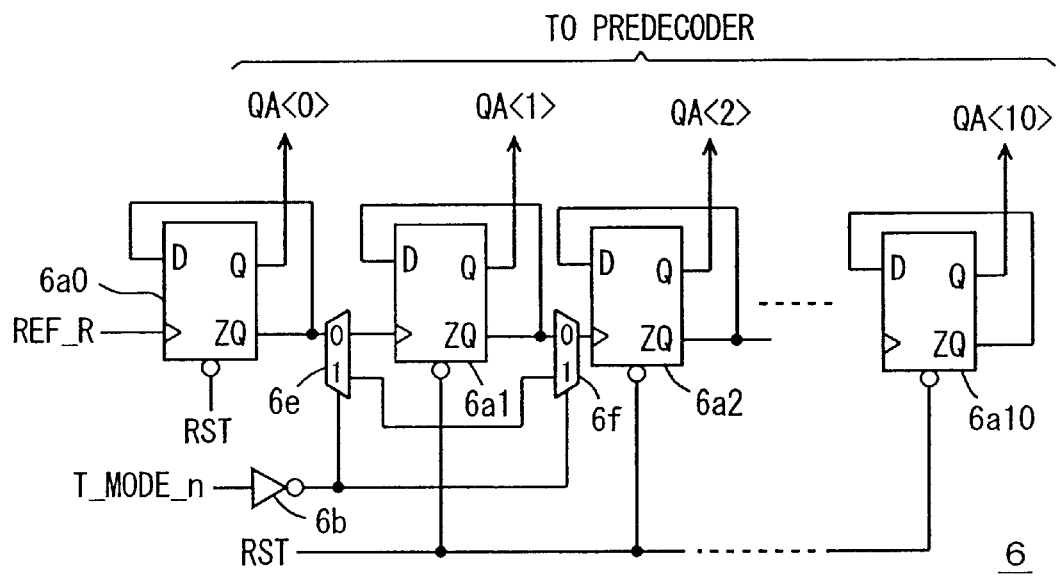
FIG. 65 schematically shows a structure of a refresh counter that generates a refresh address according to the eleventh embodiment of the present invention.

FIG. 65 shows an example of a structure of a refresh counter 6 generating a refresh address according to the eleventh embodiment of the present invention. Refresh counter 6 of FIG. 65 corresponds to refresh counter 6 of FIG. 11 in structure.

Referring to FIG. 65, refresh counter 6 includes D type flip-flops 6a0–6a10 responsive to a rise of the signal applied to the clock input to take in and output the signal applied to an input D, an inverter 6b receiving twin cell mode designation signal T_MODE_n, and a demultiplexer 6e responsive to the output signal of inverter 6b to apply the signal from an output ZQ of D type flip-flop 6a0 to D type flip-flop 6a1 of a subsequent stage and to D type flip-flop 6a2 of further succeeding stage.

D type flip-flop 6a0 of the first stage receives a refresh operation complete designation signal REF_R at the clock input to alter refresh address bit QA<0> upon each completion of a refresh operation.

Demultiplexer 6e supplies the signal from output ZQ of D type flip-flop 6a0 to the clock input of the next D type flip-flop 6a1 when twin cell mode designation signal T_MODE_n is at an H level. When twin cell mode designation signal is at an L level indicating a twin cell mode, demultiplexer 6e transfers the output signal from output ZQ of D type flip-flop 6a0 to D type flip-flop 6a2 of further next stage. In this state, D type flip-flop 6a1 has the signal level of its clock input fixed. Therefore, refresh address bit QA<1> is maintained at a reset state in the twin cell mode.

Refresh counter 6 further includes a multiplexer 6f to select either the signal from output ZQ of D type flip-flop 6a1 or the signal from demultiplexer 6e for application to the clock input of D type flip-flop 6a2, according to the output signal of inverter 6b. Multiplexer 6f selects the output signal from D type flip-flop 6a1 when twin cell mode designation signal T_MODE_n is at an H level and specifies the 1 bit/1 cell mode, and selects the signal from demultiplexer 6e when twin cell mode designation signal T_MODE_n is at an L level.

Each of D type flip-flops 6a0–6a10 receives the output signal from its own output ZQ at a D input thereof. Each of D type flip-flops 6a2 6a10 applies the signal from its own output ZQ to the clock input of D type flip-flop of the succeeding stage. These D type flip-flops 6a0–6a10 have the signal from its output Q reset to "0".in response to reset signal RST.

Similar to refresh counter 6 of FIG. 11, refresh counter 6 of FIG. 65 is a counter based on a ripple counter. Refresh address bits QA<0>–QA<10> are output from output Q of D type flip-flops 6a0–6a10 to be applied to the predecoder of the succeeding stage.

Demultiplexer 6e applies the output signal of D type flip-flop 6a0 to the clock input of the subsequent D type flip-flop 6a1 when twin cell mode designation signal T_MODE_n is at an H level indicating a 1 bit/1 cell mode. Here, multiplexer 6f selects the output signal of D type flip-flop 6a1 for application to the clock input of subsequent D type flip-flop 6a2. Therefore, the operation in this 1 bit/1 cell mode is identical to that described with reference to FIG. 12A. Predecode signals X<0>–X<3> are sequentially driven to a selected state one by one according to the refresh address bits.

The operation in a twin cell mode will be described now with reference to FIG. 66. In a twin cell mode, demultiplexer 6e supplies the output signal of D type flip-flop 6a0 to the clock input of D type flip-flop 6a2 via multiplexer 6f. Refresh operation complete designation signal REF_R is applied to D type flip-flop 6a0 of the first stage. Bit QA<0> repeats 0 and 1 alternately every time flip-flop operation complete designation signal REF_R is generated. Refresh address bit QA<1> is at the reset state of "0". Address bits QA<10:2> are incremented every time bit QA<0> is pulled down to an L level. The count value of bits QA<10:2> is incremented by one as 0,1, 2, . . . at each two generations of refresh operation complete designation signal REF_R.

In a twin cell mode, address bit QA<1> is degenerated by predecoder 6 of FIG. 63. Therefore, the refresh address is increased as (0, 2), (1, 3), (4, 6), . . . at each activation of refresh operation complete designation signal REF_R. In each refresh operation, two odd numbered or even numbered row address rows (subword lines) are selected simultaneously. Since the address bits are 11 bits and address bit QA<1> of one bit is degenerated, all rows will be refreshed once by carrying out refresh 1K times. Accordingly, refresh can be effected correctly in both the twin cell mode and the 1 bit/1 cell mode.

Figure 66:
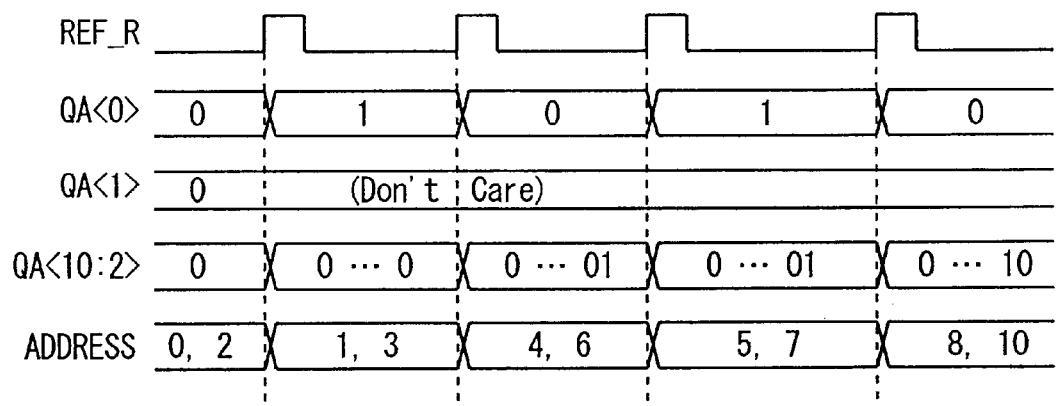
FIG. 66 shows an example of the generating sequence of the refresh address according to the eleventh embodiment.
Figure 67:
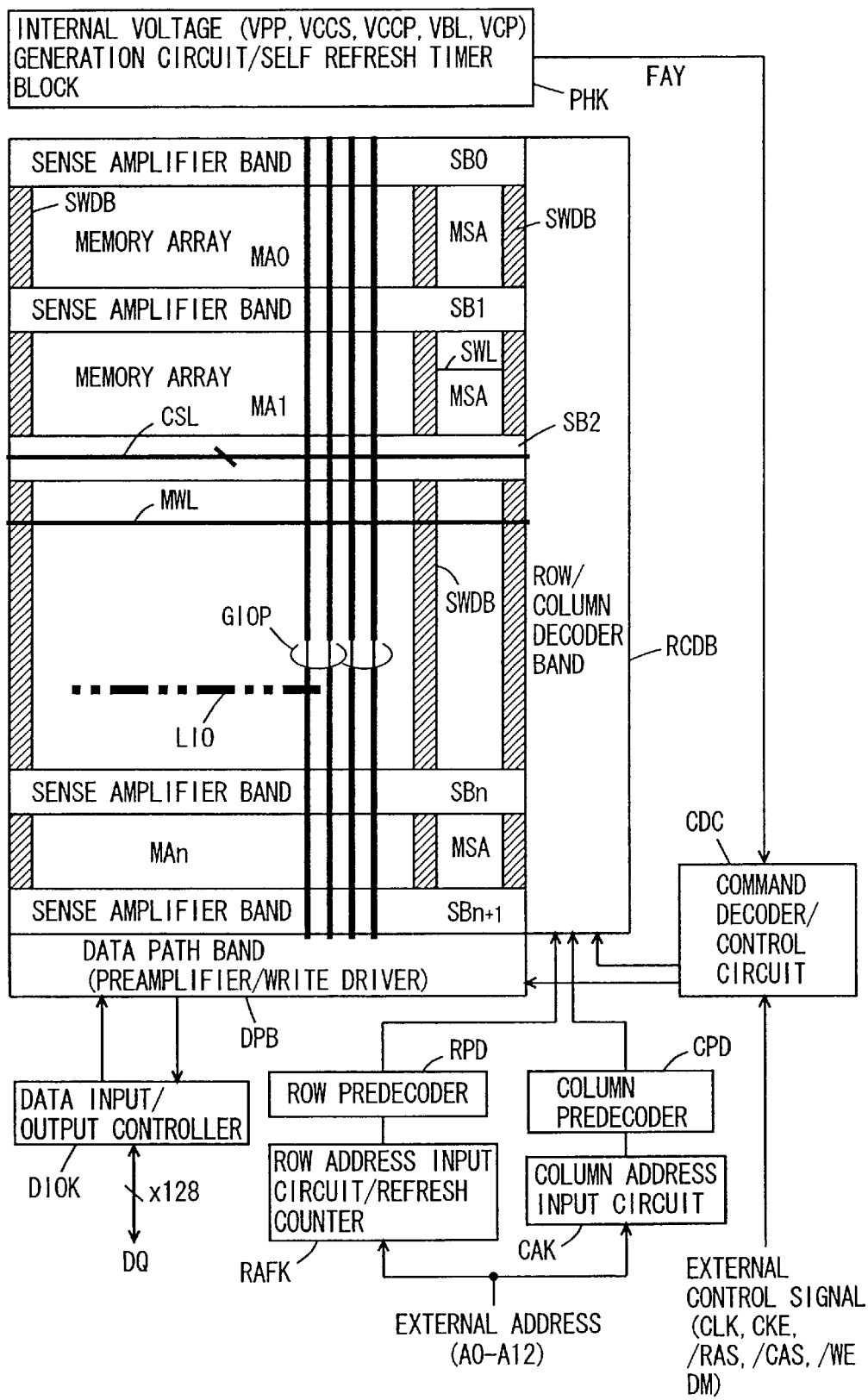
FIG. 67 schematically shows an entire structure of a conventional semiconductor memory device.
Figure 68:
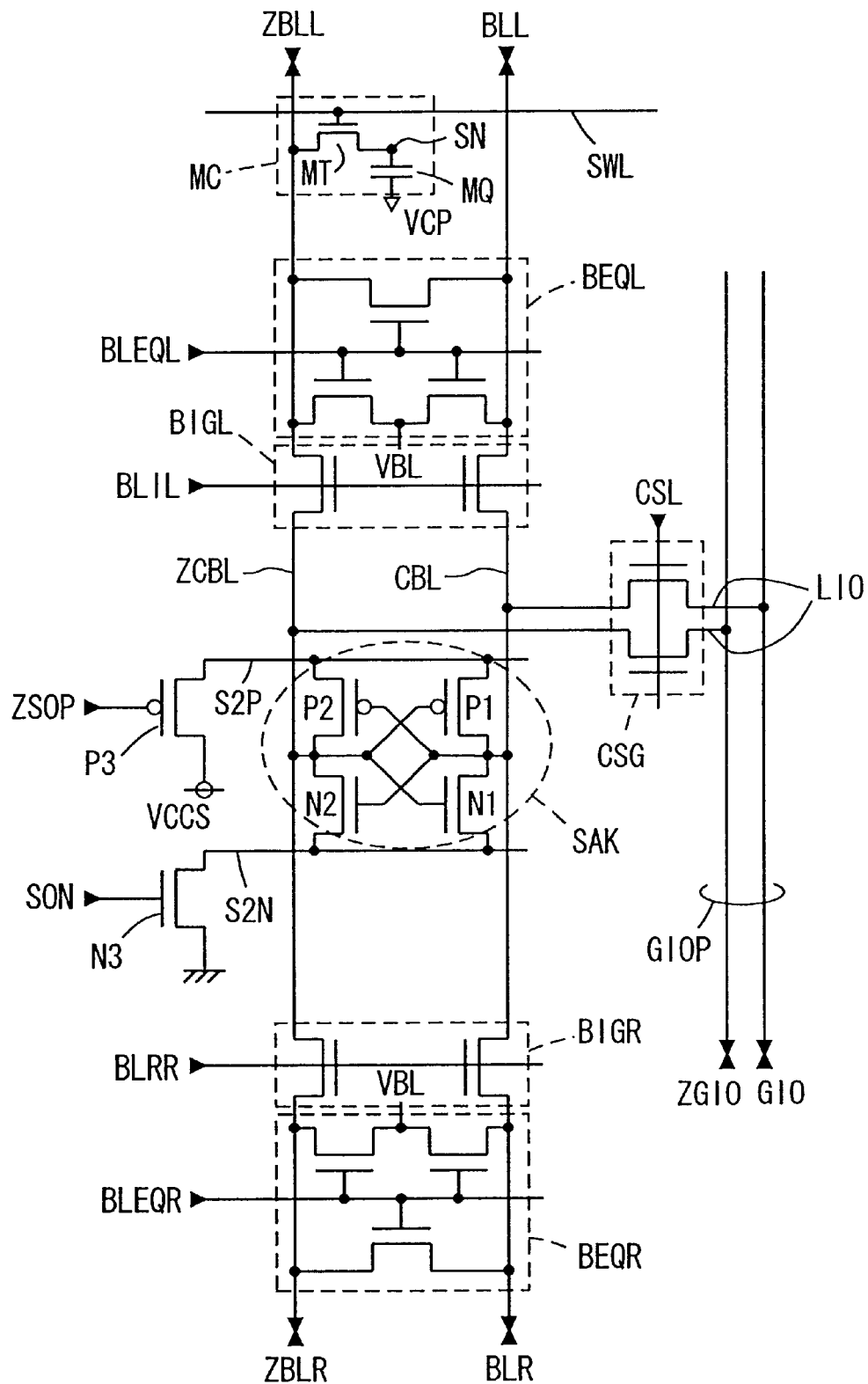
FIG. 68 schematically shows a structure of an array of a conventional semiconductor memory device.
Figure 69:
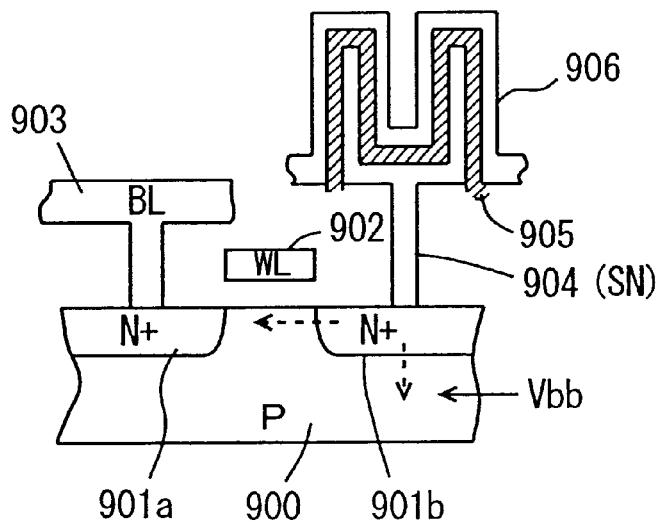
FIG. 69 schematically shows a cross sectional structure of a memory cell in a conventional semiconductor memory device.
Figure 70:
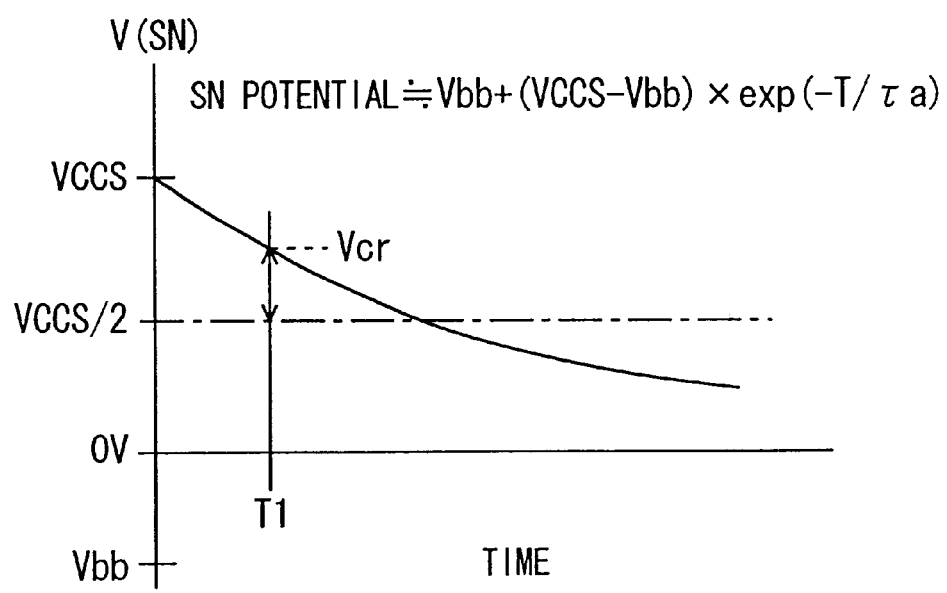
FIG. 70 shows the amount of charge stored in a memory cell of a conventional semiconductor memory device over time.

As apparent from the change of the refresh address shown in FIG. 66, by degenerating address bit RAD<1> in a twin cell mode in an 8-way hierarchical word line structure, a pair of subword lines arranged apart by a pitch identical to the bit line contact pitch can be selected in a similar manner. In a structure in which predecode signals X<0>–X<7> are generated according to address bits RAD<0>–RAD<2>, only the degeneration of address bit RAD<1> is required. As the structure of the predecoder, the structure shown in FIG. 19 can be employed. By exchanging NAND circuits 2c and 2d with inverters 2e and 2f in FIG. 19, a structure for an 8-way hierarchical word line can be easily realized.

As to the structure of the portion related to row selection in the eleventh embodiment, the structure employed in the first embodiment can be used. Therefore, the entire structure is similar to that shown in FIG. 11.

Other structures

In the above sixth to ninth embodiments, a structure may be employed in which the 3-value drive of a bit line equalize designation signal and a current limiting facility of a clamp transistor are made effective only in a self refresh mode for retaining data. More specifically, a structure may be employed in which bit line equalize designation signal BLEQ is driven to three values in response to activation of self refresh designation signal SRF and driven into two values in a normal access. This can be realized by simply rendering the transistor for pull up/pull down operative only in a self refresh mode (set the pull up/pull down transistor on when self refresh mode designation signal SRF is active and off otherwise).

In the case where the clamp transistor is rendered operative only in a self refresh mode, self refresh designation signal SRF is supplied to the gate of the clamp transistor. Self refresh designation signal SRF is set at the level of bit line precharge voltage VBL in the self refresh mode, and to the level of the boosted voltage that sets these clamp transistors to a low resistive, conductive state otherwise (when N channel MOS transistor is used as clamp transistor). In the case where a P channel MOS transistor is used as the clamp transistor, self refresh mode designation signal SRF is set to the level of the ground voltage when inactive, and applied to the gate of the clamp transistor. Thus, when data is retained in a twin cell mode in the self refresh mode, the standby current can be suppressed reliably to maintain data correctly. In the 1 bit/1 cell mode in a normal access operation, the bit line can be precharged/ equalized at high speed.

The aforementioned sixth to ninth embodiments are directed to a semiconductor memory device that operates in a twin cell mode. However, the sixth to ninth embodiments are applicable also to a semiconductor memory device that stores data in the normal 1 bit/1 cell mode. The standby current when there is micro short-circuit that cannot be detected as a defect can be reduced.

Other Application

The previous description is directed to an embedded DRAM. However, the present invention is also applicable to a general DRAM device.

According to the present invention, as described above, two word lines are selected simultaneously to couple memory cells to respective complementary bit lines in a pair. Consequently, data can be retained over a long period of time and the number of times of refresh operations can be reduced significantly. Thus, power consumption in the data retaining mode can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns;

a plurality of word lines arranged corresponding to the rows, each word line having memory cells of a corresponding row connected;

a plurality of bit lines arranged corresponding to the columns, each bit line having memory cells of a corresponding column connected, said plurality of bit lines being arranged in pairs, and each memory cell being arranged at a crossing between one of bit lines forming the pair and a corresponding word line;

row select circuitry for simultaneously selecting word lines on an addressed row and a related row according to an address signal, said related row being selected such that a memory cell is arranged corresponding to each respective crossing between the word lines on said addressed row and said related row and the bit lines forming the pair, said row select circuitry including a drive circuit for driving the word lines on said addressed row and said related row to a selected state individually; and a plurality of sense amplifier circuits arranged corresponding to the bit line pairs, each for amplifying differentially potential of a corresponding bit line pair when rendered active.

2. The semiconductor memory device according to claim 1, wherein said address signal is a signal of a plurality of bits, and said row select circuitry further comprises a address conversion circuit for degenerating a predetermined bit of said address signal to specify simultaneously an addressed row and said related row.

3. The semiconductor memory device according to claim 1, wherein said plurality of memory cells are arranged such that bit line contacts for connecting the memory cells to corresponding bit lines are arranged in alignment in a row direction, the memory cells are arranged in the row direction for every other columns, the bit line contact is shared by the memory cells adjacent in a column direction, and the bit line contacts aligned in the row direction are arranged for every other columns in an aligned row, the bit lines forming a pair are bit lines adjacent in the row direction, and said addressed word line and said related word line are word lines adjacent in the column direction.

4. The semiconductor memory device according to claim 1, wherein said plurality of memory cells are arranged such that bit line contacts for connecting the memory cells to corresponding bit lines are arranged in alignment in a row direction, the bit line contacts are arranged for every four columns in an aligned row of bit line contacts, and the bit line contact is shared by memory cells adjacent in a column direction, the bit lines forming a pair are bit lines adjacent with one column skipped, and said addressed word line and said related word line are word lines spaced apart by two rows.

5. The semiconductor memory device according to claim 1, wherein said address signal includes a plurality of bits, and said row select circuitry further comprises a mode switch circuit for setting a predetermined bit of said address signal in a degenerated state to specify simultaneously said addressed row and said related row when an operation mode designation signal specifies a first operation mode, and for setting a state of selecting the addressed row with the related row non-selected in accordance with said address signal when said operation mode designation signal specifies a second operation mode.

6. The semiconductor memory device according to claim 1, wherein each of the memory cells includes a capacitor having a storage node for storing information and a cell plate node receiving a cell plate voltage, and said semiconductor memory device further comprises a cell plate voltage control circuit for stopping supply of said cell plate voltage to said cell plate node in a standby state where said plurality of rows are in a non-selected state.

7. The semiconductor memory device according to claim 5, wherein said operation mode designation signal is a refresh test mode designation signal designating a refresh failure test mode to test charge retain characteristic of said memory cell.

8. The semiconductor memory device according to claim 1, further comprising redundant rows for repairing a defective row of said plurality of memory cells, wherein said redundant rows are provided by a number equal to an integer multiple of a total number of said addressed row and said related row.

9. The semiconductor memory device according to claim 8, further comprising a redundancy circuit for replacing at least said addressed row and said related row simultaneously with redundant rows of said redundant rows when at least one of said addressed row and said related row is a defective row.

10. The semiconductor memory device according to claim 1, wherein said drive circuit is arranged corresponding to each of said plurality of word lines and arranged alternately at both sides of said plurality of word lines, and word lines, related to each other, selected simultaneously in said plurality of word lines are electrically connected at both sides by conductive lines.

11. A semiconductor memory device comprising:

a plurality of memory subarrays, each memory subarray including a plurality of memory cells arranged in rows and columns;

a plurality of subword lines arranged corresponding to the rows of memory cells in each of the memory subarrays, each subword line having memory cells on a corresponding row connected;

a plurality of main word lines extending in a row direction common to said plurality of memory subarrays, each main word line arranged corresponding to a predetermined number of subword lines in each memory subarray;

a plurality of subword line drivers arranged corresponding to said plurality of subword lines, each subword line driver driving a corresponding subword line to a selected state according to a signal on a corresponding main word line and a subdecode signal, said subdecode signal specifying simultaneously two subword lines in said predetermined number of subword lines, and the two subword lines specified by said subdecode signal being connected by conductive lines at both ends thereof;

a plurality of bit line pairs arranged corresponding to the columns of memory cells in each memory subarray, each bit line pair having memory cells of a corresponding columns connected, in each bit line pair, a memory cell connected to each bit line corresponding to each respective crossing with the two subword lines specified simultaneously by the subdecode signal; and a plurality of sense amplifier circuits provided corresponding to said plurality of bit line pairs, each for amplifying differentially a voltage of a corresponding bit line pair.

12. The semiconductor memory device according to claim 11, wherein said subdecode signal specifies simultaneously a pair of subword lines adjacent in a column direction in said predetermined number of subword lines.

13. A semiconductor memory device comprising:

a plurality of memory cells arranged in rows and columns;

a plurality of word lines arranged corresponding to the rows of said plurality of memory cells, each word line having memory cells on a corresponding row connected;

a plurality of column lines arranged corresponding to the columns of said plurality of memory cells, each column line having memory cells on a corresponding column connected;

a plurality of column voltage hold circuit provided corresponding to said plurality of column lines, for holding corresponding column lines at a predetermined voltage level in a standby state, each of said plurality of column voltage hold circuits transmitting a current-restricted voltage to a corresponding column line as said predetermined voltage.

14. The semiconductor memory device according to claim 13, further comprising a voltage control circuit for rendering the voltage hold circuits active in said standby state, said voltage control circuit setting said voltage hold circuits at a conductive state of high resistance in said standby state and at a non-conductive state of high resistance in a memory cell select operation.

15. The semiconductor memory device according to claim 14, wherein each of said voltage hold circuits includes a transistor for transmitting said predetermined voltage to a corresponding column line when conductive, and said voltage control circuit sets the transistor of said voltage hold circuit at a conductive state of low resistance and then sets said transistor to a conductive state of high resistance, in said standby state.

16. The semiconductor memory device according to claim 14, wherein said plurality of memory cells are divided into a plurality of row blocks, said voltage control circuits includes;

a circuit for generating a control signal in response to a block select signal specifying a row block in said plurality of row blocks and a delayed signal of a row active command designating memory cell selection, a drive circuit for generating a voltage hold designation signal to the voltage hold circuits of a corresponding row block in response to said control signal and said block select signal, and a clamping element of low current drivability for clamping an output node of said drive circuit at a constant voltage, the voltage hold circuits attaining a conductive state of high resistance by the voltage hold designation signal of said constant voltage level.

17. The semiconductor memory device according to claim 16, wherein said drive circuit receives a first reference voltage and a second reference voltage as operating power supply voltages, and said clamping element is a transistor coupled between the output node of said drive circuit and a node supplying said constant voltage between the first and second reference voltages, and having a gate receiving a third reference voltage.

18. The semiconductor memory device according to claim 13, wherein said predetermined voltage is at a voltage level corresponding to a high level data stored in the memory cell, and each voltage hold circuit includes a P channel insulated gate type field effect transistor as a component.

19. The semiconductor memory device according to claim 13, further comprising a plurality of subpower supply circuits, one subpower supply circuit being provided corresponding to each set of a predetermined number of the voltage hold circuits of said plurality of voltage hold circuits, said predetermined number being at least one, each subpower supply circuit transmitting said predetermined voltage to a corresponding set of the voltage hold circuit, each of said plurality of subpower supply circuits including a transistor element having a current restricting function on the predetermined voltage.

20. The semiconductor memory device according to claim 19, further comprising a redundant column for repairing a defective column in said columns, said redundant column being provided corresponding to a set of columns corresponding to said set of the voltage hold circuits.

21. The semiconductor memory device according to claim 19, further comprising a plurality of internal data lines for transmitting internal data, each internal data line being provided corresponding to said set of the voltage hold circuits.

22. The semiconductor memory device according to claim 19, wherein the subpower supply circuits are provided corresponding to the respective voltage hold circuits, and said transistor element transmits said predetermined voltage to a corresponding voltage hold circuit.

23. The semiconductor memory device according to claim 22, wherein said transistor element is a resistor-connected P channel field effect transistor, and said predetermined voltage is at a voltage level corresponding to high level data stored in the memory cells.

24. The semiconductor memory device according to claim 22, wherein said semiconductor memory device is integrated with a logic circuit on a common semiconductor substrate, and said transistor element is a field effect transistor identical in at least one of a gate insulation film thickness and a gate insulation film material to a field effect transistor of a component of said logic circuit.

25. The semiconductor memory device according to claim 13, further comprising a row select circuit for selecting, according to an address signal, two word lines simultaneously from said plurality of word lines in a specific operation mode, wherein each column line includes a pair of bit lines transmitting complementary data, and memory cells on a column are arranged corresponding to crossings between two word lines selected simultaneously and the bit lines of a corresponding column line such that two memory cells are connected to the respective bit lines.

26. The semiconductor memory device according to claim 13, wherein said semiconductor memory device is formed to be integrated with a logic circuit on a common semiconductor substrate, and the voltage hold circuit is formed of a field effect transistor identical in at least one of thickness and material of a gate insulation film thickness to a field effect transistor of a component of said logic circuit.

27. A semiconductor memory device comprising:

a plurality of normal memory cells arranged in rows and columns;

a plurality of normal subword lines arranged corresponding to the normal memory cell rows, each normal subword line having normal memory cells on a corresponding row connected;

a plurality of normal main word lines each arranged corresponding to a predetermined number of normal subword lines;

a plurality of spare memory cells arranged in rows of at least the predetermined number;

a plurality of spare subword lines arranged corresponding to the spare memory cell rows, each spare subword line having spare memory rows of a corresponding row connected;

at least one spare main word line arranged corresponding to said plurality of spare subword lines, the spare main word line being arranged corresponding to said predetermined number of the spare subword lines;

first spare determination circuitry for determining whether a defective normal subword line is specified according to an address signal;

second spare determination circuitry for determining whether a defective normal main word line is specified according to said address signal;

normal row select circuitry for selectively driving a normal main word line and a normal subword line to a selected state according to said address signal and output signals of the first and second determination circuitry, said normal row select circuitry rendering said normal main word line and a corresponding normal subword line non-selected when a defect is detected by the first spare determination circuitry, and driving an addressed main word line to a selected state and selectively driving an addressed normal subword line to a selected state while maintaining predetermined normal subword lines of the predetermined number of corresponding normal subword lines to a non-selected state independent of said address signal when a defect is detected by said second spare determination circuitry; and spare row select circuitry for driving a spare main word line and a corresponding spare subword line to a selected state according to said address signal and output signals of the first and second determination circuitry, said spare row select circuitry driving the spare main word line and the corresponding spare subword line to a selected state according to said address signal when a defect is detected by said first spare determination circuitry, and driving said spare main word line to a selected state and selectively driving a spare subword line corresponding to said address signal to a selected state while maintaining a spare subword line excluding spare subword lines corresponding to said predetermined normal subword lines at a non-selected state when a defect is detected by said second determination circuitry.

28. The semiconductor memory device according to claim 27, further comprising third determination circuitry for determining whether a defective normal main word line is specified according to said address signal, said third determination circuitry determining whether said normal main word line includes a defect different in mode from the defect detected by said second determination circuitry, wherein said normal row select circuitry is responsive to a detection signal of said third determination circuitry for selectively driving a normal main word line and normal subword line to a selected state according to said address signal while maintaining a normal subword line other than said predetermined normal subword lines out of the predetermined number of the normal subword lines at a non-selected state, and said spare row select circuitry is responsive to the detection signal of said third determination circuitry for selectively driving a spare subword line to a selected state according to said address signal while maintaining the spare subword lines corresponding to said predetermined normal subword lines out of the spare subword lines at a non-selected state.

29. The semiconductor memory device according to claim 27, wherein said predetermined normal subword lines are physically adjacent normal subword lines.

30. The semiconductor memory device according to claim 29, wherein said predetermined normal subword lines are arranged corresponding to a common normal main word line.

31. The semiconductor memory device according to claim 29, wherein said predetermined normal subword lines are arranged corresponding to adjacent normal main word lines, respectively.

32. The semiconductor memory device according to claim 27, wherein said normal row select circuitry drives two normal subword lines to a selected state simultaneously so that complimentary memory cell data is read out on each column when no defect is detected according to said address signal in a first operation mode, and selectively drives one normal subword line to a selected state when no defect is detected according to said address signal in a second operation mode.

33. A semiconductor memory device comprising:

a plurality of memory cells arranged in rows and columns;

a plurality of word lines arranged corresponding to the rows of the memory cells, each word line having memory cells of a corresponding row connected; and row select circuitry for driving a pair of word lines with one word line interposed therebetween among said plurality of word lines to a selected state simultaneously in a particular operation mode.

34. The semiconductor memory device according to claim 33, further comprising a plurality of bit line pairs arranged corresponding to said columns of the memory cells, the memory cells being arranged such that complementary data is read out on each bit line pair in said particular operation mode and data of a memory cell of one bit is read out on each bit line pair when one word line is selected in a normal mode.

35. The semiconductor memory device according to claim 33, wherein said memory cells are arranged in a half pitch cell arrangement.

* * * * *